US008994008B2

(12) United States Patent
Imai et al.

(10) Patent No.: US 8,994,008 B2
(45) Date of Patent: Mar. 31, 2015

(54) REVERSE PRINTING INK COMPOSITION, PRINTING METHOD USING THE SAME, METHOD OF MANUFACTURING DISPLAY UNIT USING THE SAME

(75) Inventors: Toshiaki Imai, Kanagawa (JP); Makoto Ando, Tokyo (JP); Tadahiko Yoshinaga, Kanagawa (JP)

(73) Assignee: Sony Corporation, Tokyo (JP)

( * ) Notice: Subject to any disclaimer, the term of this patent is extended or adjusted under 35 U.S.C. 154(b) by 365 days.

(21) Appl. No.: 13/426,883

(22) Filed: Mar. 22, 2012

(65) Prior Publication Data

US 2012/0252300 A1    Oct. 4, 2012

(30) Foreign Application Priority Data

Mar. 30, 2011    (JP) ................................. 2011-076515

(51) Int. Cl.
  *C09K 11/00*    (2006.01)
  *H01L 51/00*    (2006.01)
(52) U.S. Cl.
  CPC ........ *H01L 51/0007* (2013.01); *H01L 51/0004* (2013.01)
  USPC ........................................... 257/40; 252/364
(58) Field of Classification Search
  USPC ................ 428/690; 252/301.16, 364; 257/40
  See application file for complete search history.

(56) References Cited

U.S. PATENT DOCUMENTS

| 5,121,029 A * | 6/1992 | Hosokawa et al. ........... 313/504 |
| 7,666,925 B2 * | 2/2010 | Matsuyoshi et al. .......... 523/160 |
| 2005/0027089 A1 * | 2/2005 | Shimizu et al. ................. 528/38 |
| 2011/0121278 A1 * | 5/2011 | Suzuki et al. ................... 257/40 |

FOREIGN PATENT DOCUMENTS

| JP | 2005-126608 A | 5/2005 |
| JP | 2005-310465 A | 11/2005 |
| JP | 3899566 B2 | 1/2007 |
| JP | 4062352 B2 | 1/2008 |

OTHER PUBLICATIONS

Acree et al. (Phys. Chem. Lid., 1989, vol. 20, p. 31.*

* cited by examiner

*Primary Examiner* — Vu A Nguyen
(74) *Attorney, Agent, or Firm* — Wolf, Greenfield & Sacks, P.C.

(57) ABSTRACT

A reverse printing ink composition capable of realizing printing with a uniform film thickness and high-definition patterning, a printing method using the same, and a method of manufacturing a display unit using the same are provided. The reverse printing ink composition includes a solvent containing an aromatic carbon hydride and a straight-chain carbon hydride and a low-molecular material.

8 Claims, 8 Drawing Sheets

| SOLVENT | BOILING POINT (DEG C) |
|---|---|
| OCTANE | 125 |
| XYLENE | 138~144 |
| MESITYLENE | 165 |
| TETRALIN | 206~208 |
| CHB | 236 |
| IPB | 291 |

L-T

REVERSE PRINTING INK COMPOSITION, PRINTING METHOD USING THE SAME, METHOD OF MANUFACTURING DISPLAY UNIT USING THE SAME

BACKGROUND

The present technology relates to a reverse printing ink composition used for forming, for example, an organic layer of an organic EL (Electroluminescence) display unit, a printing method using the same, and a method of manufacturing a display unit using the same.

As development of information and communications industry has been accelerated, display devices having high performance have been demanded. For example, an organic EL (Electroluminescence) display device is a self light emitting type display device, and is superior in its wide view angle, contrast, and response speed.

Materials of a light emitting layer and the like forming the organic EL device are broadly classified into a low-molecular material and a polymer material. The low-molecular material is formed mainly by a dry method (evaporation method) such as a vacuum evaporation method. The polymer material is formed mainly by a wet method such as spin coating, an ink jet method, nozzle coating, relief printing, and reverse offset printing. In view of practical utility and cost of materials, the following method has been proposed (for example, see Japanese Patent Nos. 4062352 and 3899566). In such a method, a red light emitting layer and a green light emitting layer are formed by patterning with the use of a wet method, and a blue light emitting layer as a common layer is formed over the red light emitting layer and the green light emitting layer by an evaporation method. As a method of forming the red light emitting layer and the green light emitting layer by patterning, a reverse offset printing method is often used due to its low cost (for example, see Japanese Unexamined Patent Application Publication Nos. 2005-310465 and 2005-126608).

Reverse offset printing is performed by the following steps. First, the entire surface of a blanket is coated with ink (obtained by dissolving component materials of a red light emitting layer or a green light emitting layer in a solvent) to form a transfer layer. Next, the transfer layer is brought into contact with a reverse printing plate in which concave sections of a pattern corresponding to the light emitting layer to form a pattern layer on the blanket. In the pattern layer, patterning is made according to the concave sections of the printing plate. Finally, the blanket in which the pattern layer is formed is brought into contact with a substrate to be printed, and thereby printing of the red light emitting layer or the green light emitting layer is performed.

SUMMARY

However, since the surface of the blanket is made of a soft material such as silicone rubber. Therefore, in coating the surface of the blanket with ink, film thickness unevenness is easily generated, and thus it is difficult to perform printing with a uniform film thickness. Further, since the ink containing a polymer material that is a material of the red light emitting layer or the green light emitting layer easily turns into a film on the blanket, it is difficult to perform high-definition patterning.

It is desirable to provide a reverse printing ink composition capable of realizing printing with a uniform film thickness and high-definition patterning, a printing method using the same, and a method of manufacturing a display unit using the same.

According to an embodiment of the present technology, there is provided a reverse printing ink composition including a solvent containing an aromatic carbon hydride and a straight-chain carbon hydride and a low-molecular material.

The low-molecular material is, for example, a monomer or an oligomer having weight-average molecular weight equal to or smaller than 50000. The oligomer is defined as a polymer in which 2 to 10 monomers are bound to each other. It is to be noted that the definition herein shows a preferable range of the molecular weight, and low-molecular materials having a molecular weight exceeding the foregoing range are not necessarily excluded in this technology.

According to an embodiment of the present technology, there is provided a printing method including forming a transfer layer by coating a blanket with a reverse printing ink composition in which a low-molecular material is contained in a solvent containing a straight-chain carbon hydride and an aromatic carbon hydride, forming a pattern layer on the blanket by pressing a reverse printing plate having a concave section with a given pattern against the transfer layer, and transferring the pattern layer to a substrate to be printed.

According to an embodiment of the present technology, there is provided a method of manufacturing a display unit, the method including forming a display device on a substrate. The forming of the display device includes forming a transfer layer by coating a blanket with a reverse printing ink composition in which a low-molecular material is contained in a solvent containing a straight-chain carbon hydride and an aromatic carbon hydride, forming a pattern layer on the blanket by pressing a reverse printing plate having a concave section with a given pattern against the transfer layer, and transferring the pattern layer to a substrate to be printed.

In the reverse printing ink composition, the printing method, or the method of manufacturing a display unit of the embodiments of the present technology, the straight-chain carbon hydride is contained in the reverse printing ink composition, and therefore coating unevenness is less likely to be generated in the transfer layer on the blanket. Further, since the low-molecular material is contained in the reverse printing ink composition, it is suppressed that the transfer layer and the pattern layer turn into a film on the blanket.

According to the reverse printing ink composition, the printing method, or the method of manufacturing a display unit of the embodiments of the present technology, since the reverse printing ink composition contains the straight-chain carbon hydride and the low-molecular material, printing with a uniform film thickness and high-definition patterning is able to be performed on the substrate to be printed.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF THE PREFERRED EMBODIMENT

Figure 1:
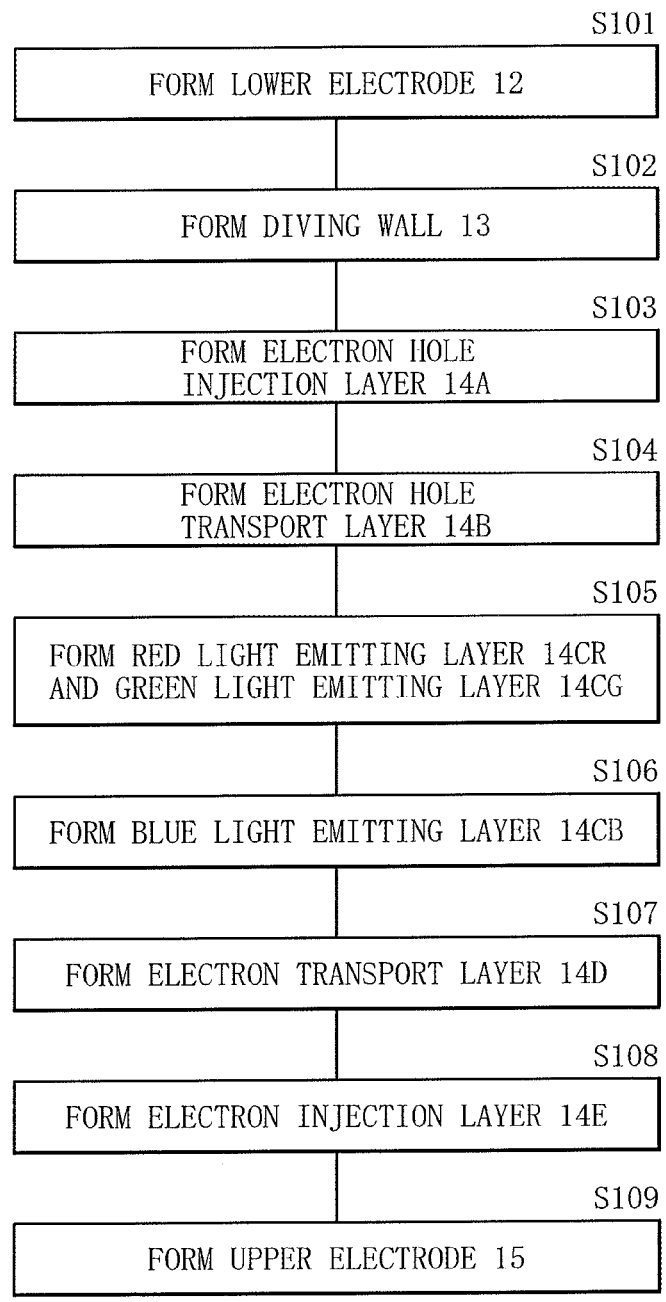
FIG. 1 is a chart illustrating a flow of a method of manufacturing an organic EL display unit according to an embodiment of the present disclosure.
Figure 2:
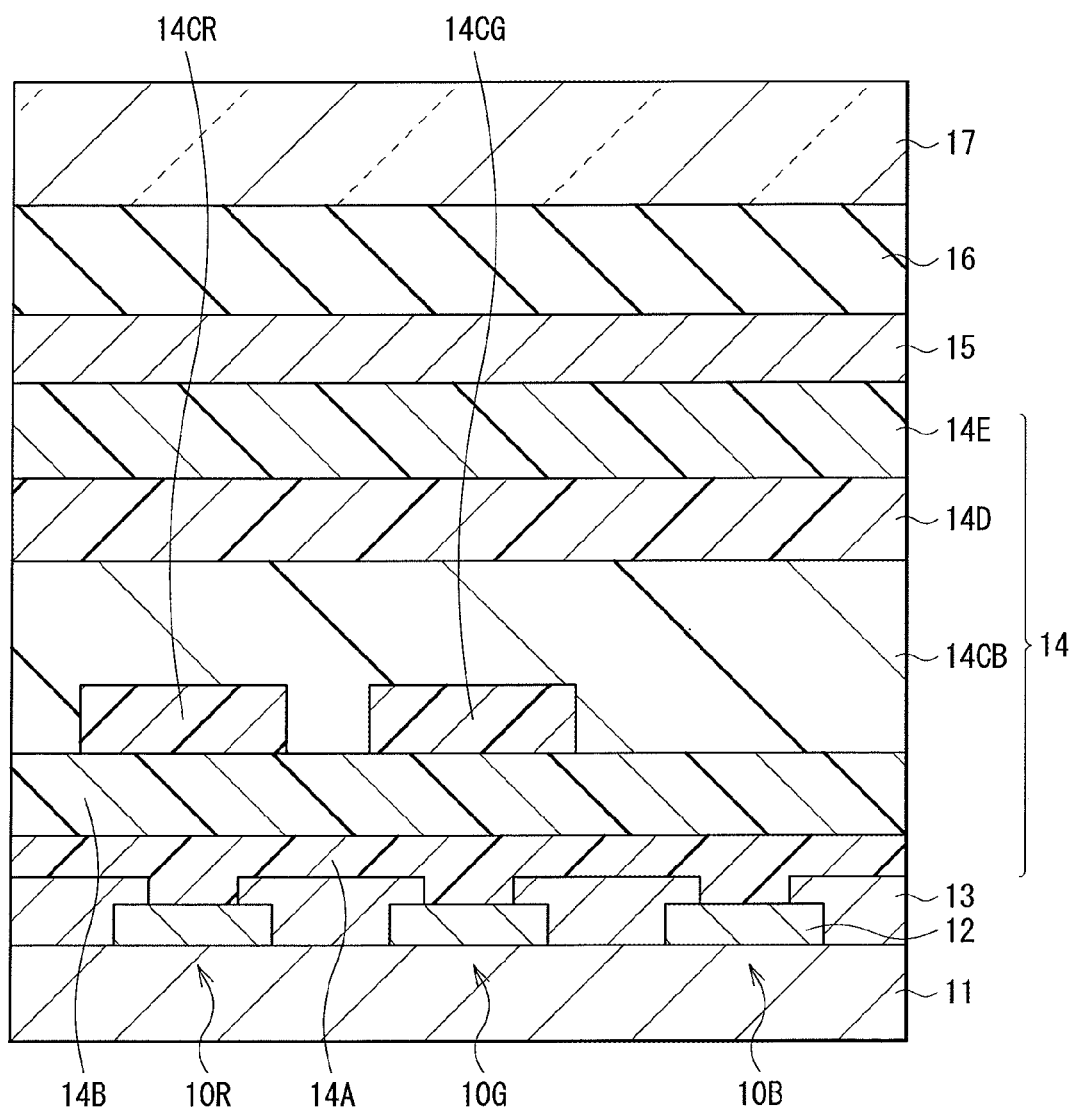
FIG. 2 is a cross-sectional view illustrating a configuration of the organic EL display unit manufactured by the method illustrated in FIG. 1.

An embodiment of the present technology will be described in detail with reference to the drawings. The description will be given in the following order.
1. Embodiment (example in which a straight-chain carbon hydride and a low-molecular material are contained in a reverse printing ink composition)
2. Examples Embodiment FIG. 1 is a flow chart illustrating a method of manufacturing a display unit (display unit 1) according to an embodiment of the present disclosure. FIG. 2 illustrates a cross-sectional configuration of the display unit 1 obtained by the manufacturing method. In the display unit 1, a red organic EL device 10R, a green organic EL device 10G, and a blue organic EL device 10B that respectively have a lower electrode 12, an organic layer 14, and an upper electrode 15 in this order are arranged in a matrix state on a substrate 11. This embodiment is characterized by a step (step S105) of forming a red light emitting layer 14CR of the red organic EL device 10R and a green light emitting layer 14CG of the green organic EL device 10G by a reverse offset printing method out of the steps illustrated in FIG. 1. Description will be given according to the order illustrated in FIG. 1.

[Step of Forming Lower Electrode 12]

First, a transparent conductive film made of, for example, ITO (an oxide of indium and tin) is formed on the whole surface of the substrate 11 in which a pixel drive circuit (not illustrated) is formed. The transparent conductive film is patterned, and thereby the lower electrode 12 is formed respectively for the red organic EL device 10R, the green organic EL device 10G, and the blue organic EL device 10B (step S101). At this time, the lower electrode 12 is connected to a drive transistor of the pixel drive circuit. For the substrate 11, a known material such as quartz, glass, a metal foil, a resin film, and a resin sheet can be used. However, quartz or glass is preferably used for the substrate 11. For the lower electrode 12, a transparent conductive film made of, for example, a simple substance or an alloy of a metal element such as chromium (Cr), gold (Au), platinum (Pt), nickel (Ni), copper (Cu), tungsten (W), and silver (Ag), InZnO (indium zinc oxide), or an alloy of zinc oxide (ZnO) and aluminum (Al) may be used.

[Step of Forming Dividing Wall 13]

Next, an inorganic insulating film made of $SiO_2$ or the like is deposited on the lower electrode 12 and the substrate 11 by, for example, a CVD (Chemical Vapor Deposition) method. The resultant is patterned by using photolithography technology and etching technology, and thereby a dividing wall 13 is formed (step S102). The dividing wall 13 is intended to secure insulation properties between the lower electrode 12 and the upper electrode 15 and to form a desired shape of a light emitting region. Therefore, in the dividing wall 13, an aperture is provided corresponding to the light emitting region. After the dividing wall 13 is formed, a surface of the substrate 11 (surface on which the dividing wall 13 and the lower electrode 12 are formed) is subjected to oxygen plasma treatment, and the surface of the lower electrode 12 is cleaned.

[Step of Forming Electron Hole Injection Layer 14A and Electron Hole Transport Layer 14B]

After the oxygen plasma treatment is performed, out of the organic layer 14, an electron hole injection layer 14A and an electron hole transport layer 14B common to the red organic EL device 10R, the green organic EL device 10G, and the blue organic EL device 10B are layered in this order on the lower electrode 12 and the dividing wall 13 (steps S103 and S104).

For the electron hole injection layer 14A, for example, polyaniline, polythiophene, polypyrrole, polyphenylene vinylene, polythienylene vinylene, polyquinoline, polyquinoxaline, a derivative thereof, a conductive polymer such as a polymer containing an aromatic amine structure in a main chain or a side chain, a metal phthalocyanine (copper phthalocyanine or the like), carbon, or the like can be used. Examples of a typical polymer material used for the electron hole injection layer 14A include polyaniline, oligoaniline, and polydioxythiophene such as poly(3,4-ethylenedioxythiophene) (PEDOT). In addition, Nafion (product name and trademark) and Liquion (product name and trademark) available from H. C. Starck, El source (product name and trademark) available from Nissan Chemical Industries Ltd., conductive polymer Verazol available from Soken Chemical & Engineering Co., Ltd. and the like can be used.

For the electron hole transport layer 14B, for example, a polymer material such as polyvinylcarbazole, polyfluorene, polyaniline, polysilane, a polysiloxane derivative having an aromatic amine in a side chain or a main chain, polythiophene and a derivative thereof, and polypyrrole can be used.

[Step of Forming Red Light Emitting Layer 14CR and Green Light Emitting Layer 14CG]

After the electron hole transport layer 14B is formed, the red light emitting layer 14CR of the red organic EL device 10R and the green light emitting layer 14CG of the green organic EL device 10G are formed by a reverse offset printing method (step S105). A description will be hereinafter given of details of the step.

Figure 3:
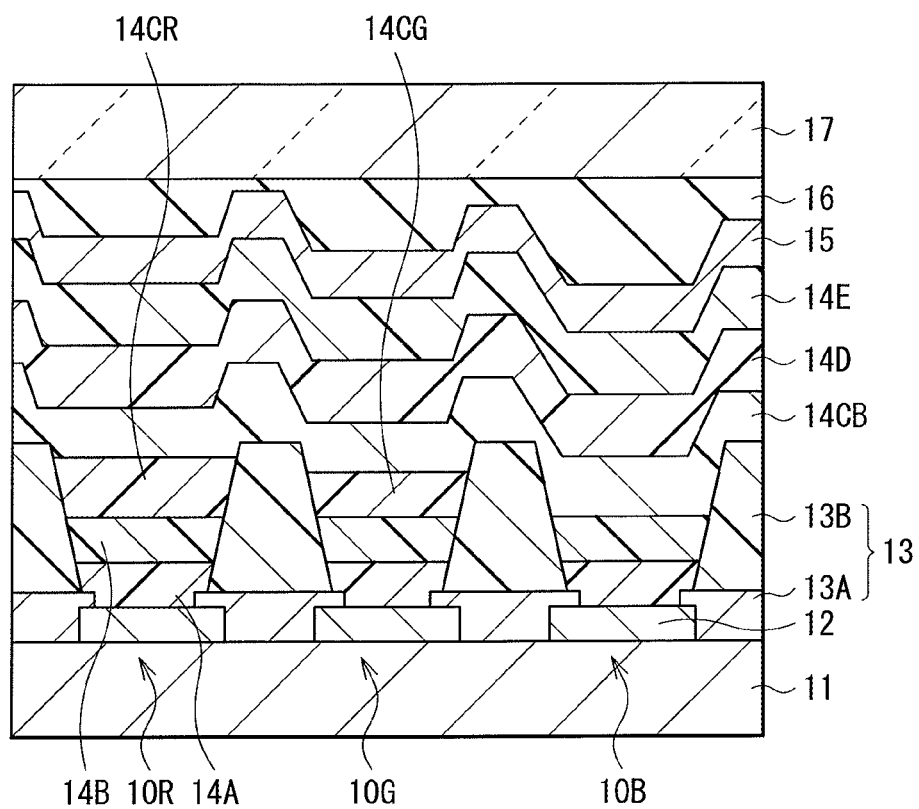
FIG. 3 is a cross-sectional view illustrating a configuration of an organic EL display unit having an upper dividing wall.

Other examples of the formation method of the red light emitting layer 14CR and the green light emitting layer 14CG include an inkjet method and a nozzle coating method. However, in the inkjet method and the nozzle coating method, liquid ink should be previously pooled in a planned formation region. Therefore, as illustrated in FIG. 3, an upper dividing wall 13B is necessitated in addition to a lower dividing wall 13A corresponding to the dividing wall 13 of this embodiment. Meanwhile, in the case where the red light emitting layer 14CR and the green light emitting layer 14CG are formed by a reverse offset printing method, the upper dividing wall 13B for pooling ink is not necessitated (FIG. 2), and the structure of the display unit 1 is allowed to be simplified. Further, the red light emitting layer 14CR and the green light emitting layer 14CG are not contaminated by the upper dividing wall 13B.

Figure 4A:
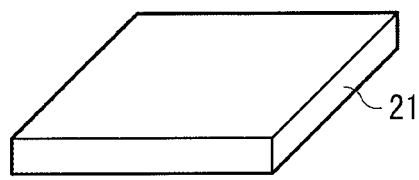
FIGS. 4A to 4D are perspective views for explaining a flow of a reverse offset printing method.
Figure 4B:
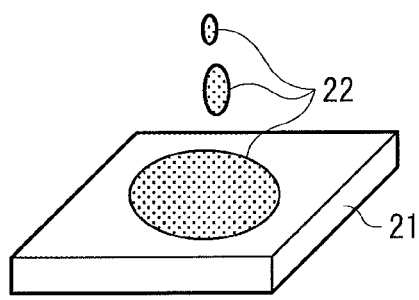
Figure 4C:
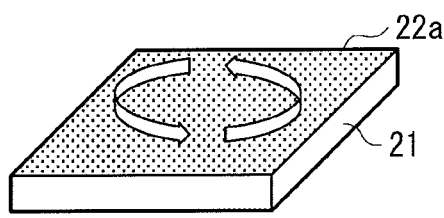

FIG. 4A to FIG. 5D are perspective views sequentially illustrating formation steps of the red light emitting layer 14CR (the green light emitting layer 14CG) by a reverse offset printing method. First, as illustrated in FIG. 4A, a blanket 21 is prepared. The blanket 21 is prepared by, for example, layering a soft material layer made of silicone rubber on a base substance made of PET (polyethylene terephthalate) or a metal. The soft material layer of the blanket 21 is coated with a reverse printing ink composition 22 as illustrated in FIG. 4B, and a transfer layer 22a made of the reverse printing ink composition 22 is formed as illustrated in FIG. 4C by, for example, a spin coating method. If the red light emitting layer 14CR and the green light emitting layer 14CG are formed in the air, light emitting life of the organic EL devices 10R, 10G, and 10B may be shortened. Therefore, printing is preferably performed in nitrogen atmosphere.

The reverse printing ink composition 22 is obtained by mixing a polymer (light emitting) material and a low-molecular material composing the red light emitting layer 14CR or the green light emitting layer 14CG in a solvent containing an aromatic carbon hydride and a straight-chain carbon hydride.

The aromatic carbon hydride of the reverse printing ink composition 22 mainly plays a role to dissolve the polymer material and the low-molecular material of the reverse printing ink composition 22. As the aromatic carbon hydride, for example, xylene, CHB (cyclohexylbenzene), mesitylene (1,3,5-trimethylbenzene), tetralin (1,2,3,4-tetrahydronaphthalene), or IPB (4-isopropylbiphenyl) can be used, and two or more aromatic carbon hydrides may be used. If the boiling point of an aromatic carbon hydride to be used is low, there is a possibility that the reverse printing ink composition 22 turns into a film on the blanket 21 in a short time and, accordingly, high-definition patterning is not realized. Therefore, the boiling point of the aromatic carbon hydride is preferably higher than the boiling point of the straight-chain carbon hydride contained in the reverse printing ink composition 22, and is more preferably higher than the boiling point of xylene (from 138 to 144 deg C. both inclusive).

Figures 6, 7:
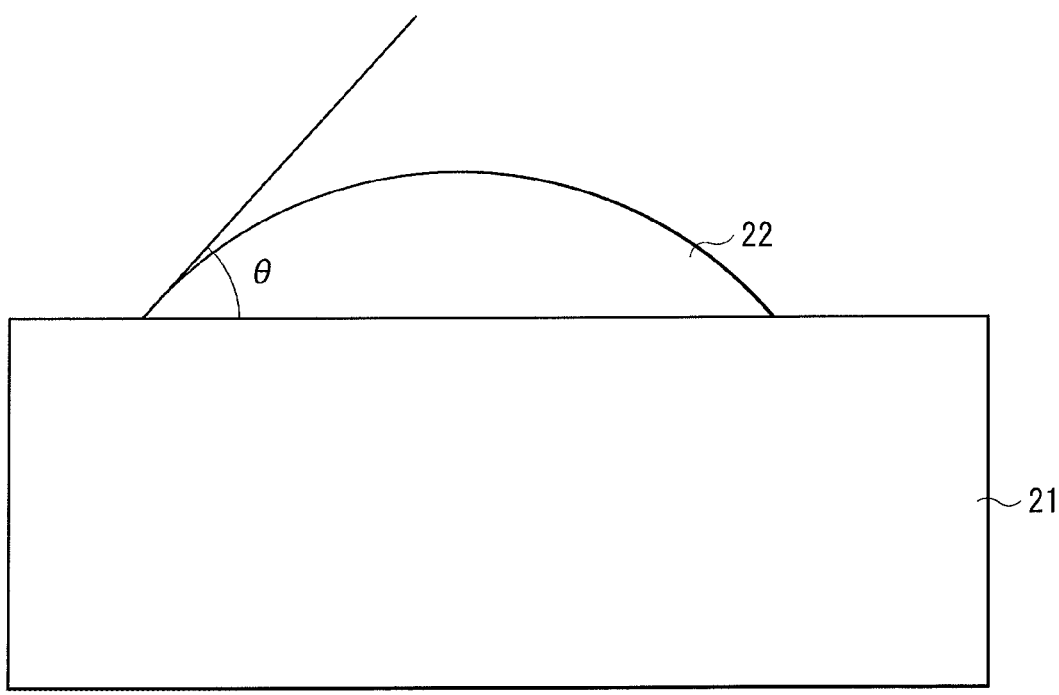
FIG. 6 is a diagram for explaining boiling points of solvents used for a reverse printing ink composition.
FIG. 7 is a diagram for explaining a contact angle.

FIG. 6 illustrates boiling points of aromatic carbon hydrides together with the boiling point of a straight-chain carbon hydride (octane). The reverse printing ink composition 22 of this embodiment is not limited to the aromatic carbon hydrides illustrated in FIG. 6. However, for example, in the case where octane is used as a straight-chain carbon hydride, xylene having a boiling point higher than the boiling point of octane is preferably used as an aromatic carbon hydride, and mesitylene, tetralin, CHB, or IPB having a boiling point higher than the boiling point of xylene is more preferably used. Further, it is preferable to combine an aromatic carbon hydride having a high boiling point with an aromatic carbon hydride having high solubility in a solute (a polymer material and a low-molecular material). For example, a combination of xylene having high solubility and CHB having a high boiling point may be used.

The straight-chain carbon hydride of the reverse printing ink composition 22 plays a role to dissolve the polymer material and the low-molecular material together with the foregoing aromatic carbon hydride. In addition, the straight-chain carbon hydride of the reverse printing ink composition 22 plays a role to form the transfer layer 22a having a uniform film thickness on the blanket 21. Specifically, due to the straight-chain carbon hydride, a contact angle of the reverse printing ink composition 22 to the blanket 21 is decreased, and coating unevenness of the reverse printing ink composition 22 is less likely to be generated on the blanket 21.

The contact angle is used as an index indicating wettability. As illustrated in FIG. 7, the contact angle represents angle θ between tangent line of a droplet rounded by surface tension of a liquid and a solid surface in dropping the liquid (reverse printing ink composition 22) on the solid surface (blanket 21). There is a tendency that the contact angle is smaller in the case where a substance in which conjugated system does not exist and intermolecular mutual interaction is small is used. Of the group of such substances, since the straight-chain carbon hydride has a simple structure and is able to keep cost low practically, the straight-chain carbon hydride is suitable as a substance to decrease the contact angle to the blanket 21.

Figure 8:
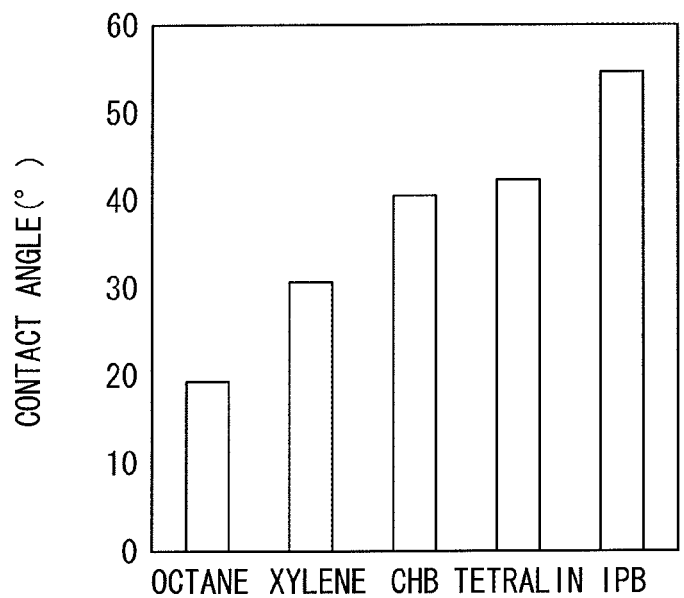
FIG. 8 is a diagram for explaining a difference in contact angles between the solvents.
Figure 9:
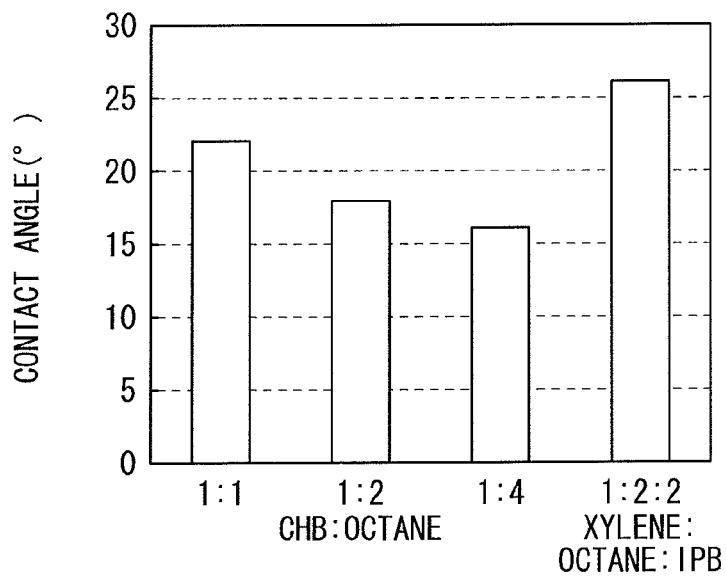
FIG. 9 is a diagram for explaining a change in contact angles in the case of mixing a straight-chain carbon hydride in the solvents.

FIG. 8 and FIG. 9 illustrate measurement results of contact angles of the respective solvents to the blanket 21. The blanket 21 having a silicone rubber soft material layer was used. According to FIG. 8, it is apparent that the contact angle (20 deg) of octane as a straight-chain carbon hydride is smaller than those of xylene (30 deg), CHB (40 deg), tetralin (41 deg), and IPB (52 deg) as aromatic carbon hydrides. Further, in the case where octane was added to CHB at a ratio of CHB:octane=1:1 (volume ratio), the contact angle was smaller than that of the case using only CHB as illustrated in FIG. 9 (22 deg), and the contact angle became smaller as the ratio of octane was increased. In addition, in the case where IPB was used singly, the contact angle is extremely large. However, in the case where octane was added to IPB at a ratio of xylene:octane:IPB=1:2:2 (volume ratio), the contact angle was decreased down to 26 deg. That is, in the case where the contact angle of the straight-chain carbon hydride to the blanket 21 is smaller than the contact angle of the aromatic carbon hydride, the contact angle of the entire reverse printing ink composition 22 is decreased.

As described above, in the case where the straight-chain carbon hydride is added to an aromatic carbon hydride, the contact angle is decreased, that is, wettability of the reverse printing ink composition 22 to the surface (soft material layer) of the blanket 21 is improved, and the transfer layer 22a with a uniform film thickness is able to be formed on the blanket 21. Accordingly, the red light emitting layer 14CR and the green light emitting layer 14CG with a uniform film thickness are able to be formed. The contact angle of the reverse printing ink composition 22 to the blanket 21 is preferably equal to or smaller than 30 degrees.

The polymer material of the reverse printing ink composition 22 composes the red light emitting layer 14CR or the green light emitting layer 14CG. In the polymer material of the reverse printing ink composition 22, if being applied with an electric field, electron-hole recombination is initiated, resulting in light generation. Examples of the polymer material include a polyfluorene polymer derivative, a (poly) paraphenylenevinylene derivative, a polyphenylene derivative, a polyvinylcarbazole derivative, a polythiophene derivative, a perylene dye, a coumarin dye, a rhodamine dye, and a substance obtained by doping the foregoing polymer with an organic EL material. As a doping material, for example, rubrene, perylene, 9,10 diphenyl anthracene, tetraphenyl butadiene, nile red, coumarin 6 or the like can be used.

The low-molecular material contained in the reverse printing ink composition 22 is intended to form the red light emitting layer 14CR and the green light emitting layer 14CG with high-definition patterning over the substrate 11. Thereby, resolution of the display unit 1 is able to be improved.

More specifically, when the transfer layer 22a is formed on the blanket 21 (FIG. 4C), or before a pattern layer 22b is transferred from the blanket 21 to the substrate 11 (substrate to be printed) described later (FIGS. 5A and 5B), the low-molecular material suppresses that the reverse printing ink composition 22 (the transfer layer 22a and the pattern layer 22b) turns into a film on the blanket 21, and therefore high-definition patterning is enabled. The conformation of the foregoing polymer material varies according to the concentration and spin coating conditions. In the case where the low-molecular material is not contained in the reverse printing ink composition 22, it is presumed that each molecule of the polymer material is likely to intertwine with each other, and accordingly the polymer material easily turns into a film on the blanket 21. Since the low-molecular material suppresses that the polymer material turns into a film, the red light emitting layer 14CR and the green light emitting layer 14CG are allowed to be formed with high-definition line and space (line resolution) on the substrate 11. In the display unit 1, the low-molecular material composes the red light emitting layer 14CR and the green light emitting layer 14CG together with the foregoing polymer material.

Since the low-molecular material contained in the reverse printing ink composition 22 composes the red light emitting layer 14CR and the green light emitting layer 14CG, injection efficiency of electron holes and electrons from the blue light emitting layer 14CB into the red light emitting layer 14CR and the green light emitting layer 14CG is allowed to be improved at the time of operating the display unit 1. That is, characteristics of the red organic EL device 10R and the green organic EL device 10G are improved.

In the case where the red light emitting layer 14CR and the green light emitting layer 14CG do not contain the low-molecular material, differences between an energy level of the blue light emitting layer 14CB formed as a common layer as described later and energy levels of the red light emitting layer 14CR and the green light emitting layer 14CG are increased. That is, there is a possibility that injection efficiency of electron holes or electrons between the blue light emitting layer 14CB, and the red light emitting layer 14CR and the green light emitting layer 14CG is decreased, and desired characteristics are not obtained. Meanwhile, in the case where the red light emitting layer 14CR and the green light emitting layer 14CG are composed of the low-molecular material together with the polymer material, the energy level differences are decreased, and the foregoing injection efficiency of electron holes and electrons is allowed to be improved.

The low-molecular material of the reverse printing ink composition 22 is a material other than compounds composed of molecules of a high molecular polymer or a condensation product generated by chain repetition of the same reaction or a similar reaction of a low-molecular compound. The low-molecular material of the reverse printing ink composition 22 represents a material in which the molecular weight is substantially unitary. Further, in the low-molecular material, new intermolecular chemical bond is not generated by heating, and the low-molecular material exists in a monomolecular state.

The weight-average molecular weight (Mw) of such a low-molecular material is preferably equal to or smaller than 50000, and is more preferably equal to or smaller than 15000 for the following reason. That is, compared to a material having a large molecular weight such as a material having a molecular weight equal to or larger than 50000, a material having a small molecular weight to some extent has various characteristics, and therefore, conditions such as solubility to a solvent are easily adjusted. Further, in a low-molecular material having a molecular weight from 500 to 15000 both inclusive, if film formation is made using such a material singly (without adding a polymer material), such a material does not turn into a film and extremely high-definition patterning is enabled. That is, in the low-molecular material having a molecular weight from 500 to 15000 both inclusive, an effect to prevent the reverse printing ink composition 22 from turning into a film is more improved.

Further, the ratio between the polymer material and the low-molecular material is preferably polymer material:low-molecular material (weight ratio)=from 10:1 to 1:2 both inclusive, and is more preferably polymer material:low-molecular material (weight ratio)=from 2:1 to 1:2 both inclusive. If polymer material:low-molecular material (weight ratio) is less than 10:1, the effect of the low-molecular material is less likely to be exerted. Meanwhile, if polymer material:low-molecular material (weight ratio) exceeds 1:2, film formation may be hardly made.

As the low-molecular material, for example, benzene, styrylamine, triphenylamine, porphyrin, triphenylene, azatriphenylene, tetracyanoquinodimethane, triazole, imidazole, carbazole, oxadiazole, polyarylalkane, phenylenediamine, arylamine, oxazole, anthracene, fluorenone, hydrazone, stilbene, and a derivative thereof, or a heterocyclic conjugate system monomer or oligomer such as a polysilane compound, a vinylcarbazole compound, a thiophene compound, and an aniline compound may be used.

Specific examples of the low-molecular material described above include α-naphthylphenylphenylenediamine, porphyrin, metal tetraphenylporphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano4,4,4-tris(3-methylphenylphenylamino)triphenyamine, N,N,N',N',-tetrakis(p-tolyl)$_p$-phenylenediamine, N,N,N',N',-tetraphenyl-4,4'-diaminobiphenyl, N-phenylcarbazole, 4-di-p-tolylaminostilbene, poly(paraphenylenevinylene), poly(thiophenevinylene), and poly(2,2'-thienylpyrrol). However, the low-molecular material is not limited thereto.

It is more preferable that low-molecular materials expressed by the following Formula 1 to Formula 3 be used.

[Formula 1]

(1)

In the formula, A1 to A3 each are an aromatic carbon hydride group, a heterocyclic group, or a derivative thereof.

[Formula 2]

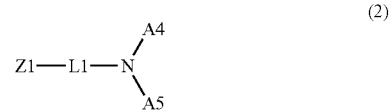

(2)

It is to be noted that, as a low-molecular material expressed by Formula 2, the compounds included in Formula 1 are excluded. In Formula 2, Z1 is a nitrogen-containing carbon hydride group or a derivative thereof. L1 is a group obtained by binding 1 to 4 bivalent aromatic ring groups to each other, specifically, a bivalent group obtained by linking 2 to 4 aromatic rings to each other or a derivative thereof. A4 and A5 are an aromatic carbon hydride group or a derivative thereof. A4 and A5 may form a ring structure by being bound to each other.

[Formula 3]

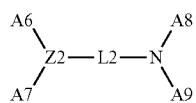
(3)

It is to be noted that, as a low-molecular material expressed by Formula 3, the compounds included in Formula 1 and Formula 2 are excluded. In Formula 3, Z2 is a nitrogen-containing carbon hydride group or a derivative thereof. L2 is a group obtained by binding 2 to 6 bivalent aromatic ring groups to each other, and specifically, a bivalent group obtained by linking 2 to 6 aromatic rings to each other or a derivative thereof. A6 to A9 are obtained by linking 1 to 10 aromatic carbon hydride groups, heterocyclic groups, or derivatives thereof.

Specific examples of the compounds shown in Formula 1 include compounds such as the following Formula 1(1) to Formula 1(48).

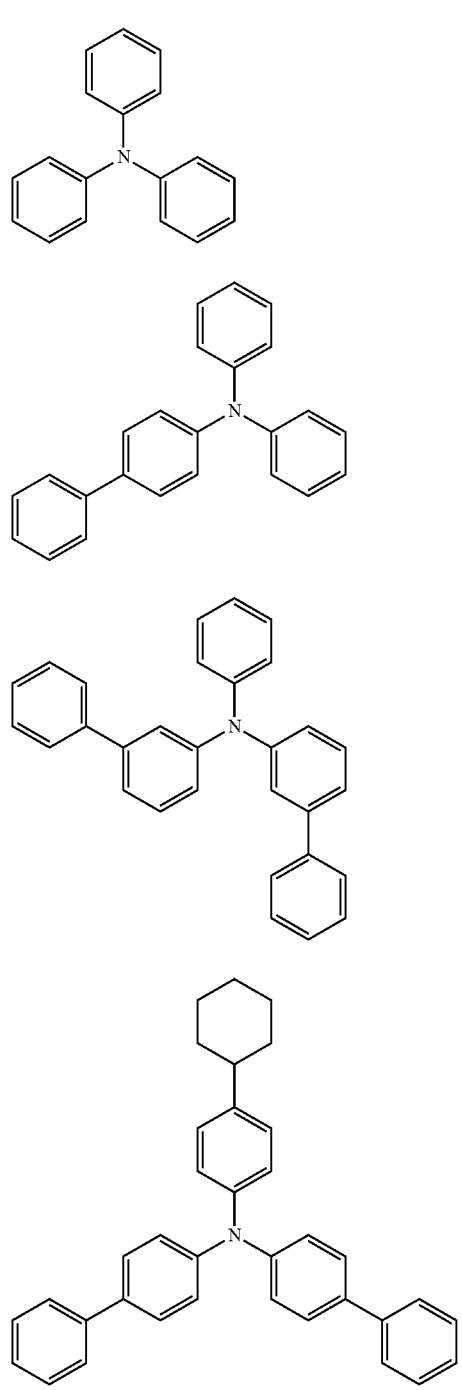

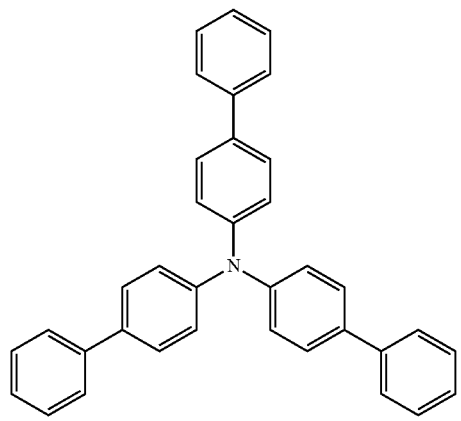
(1-9)
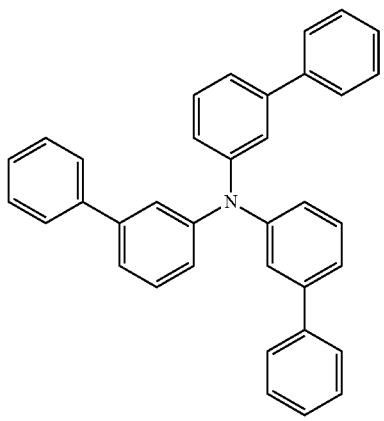
(1-10)
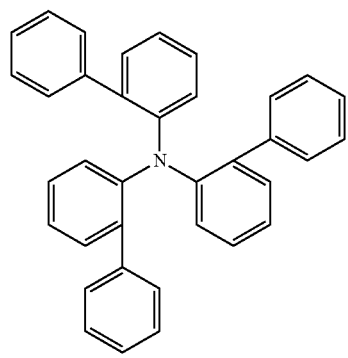
(1-11)
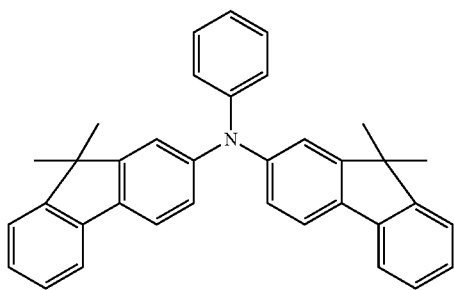
(1-12)
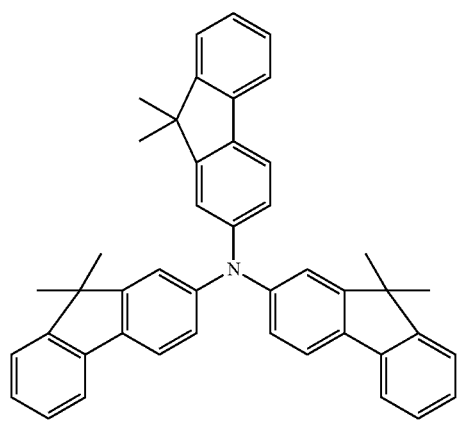
(1-13)
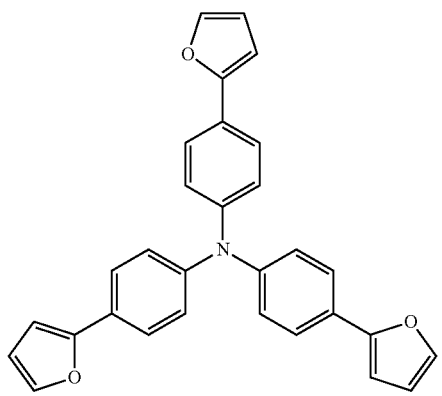
(1-14)

-continued
(1-15)
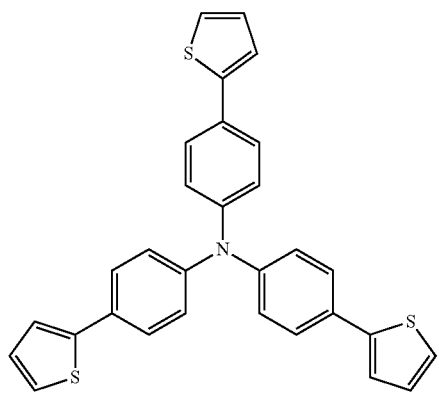
(1-16)
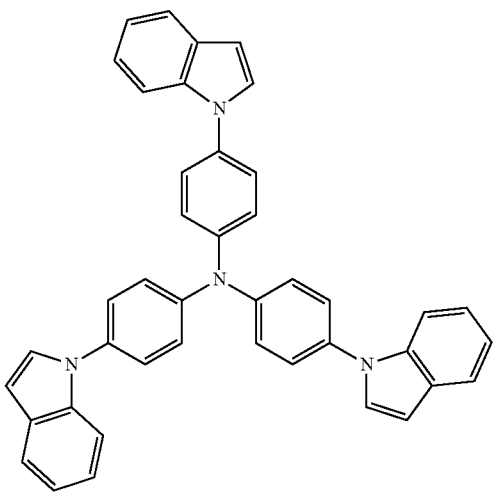
(1-17)
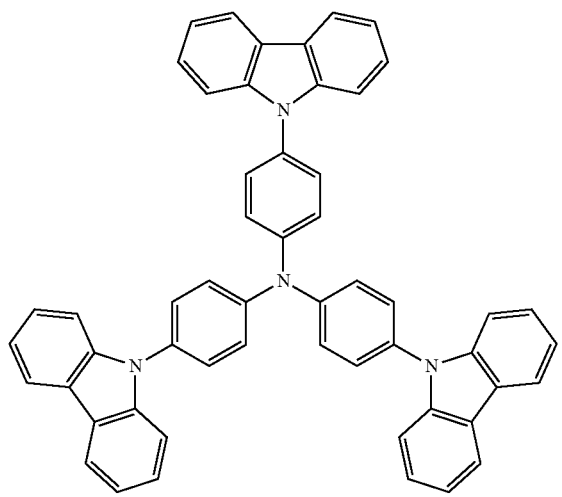
(1-18)
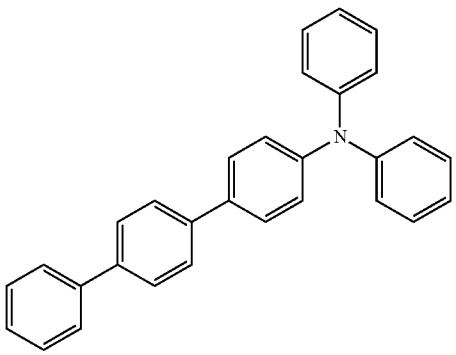
(1-19)
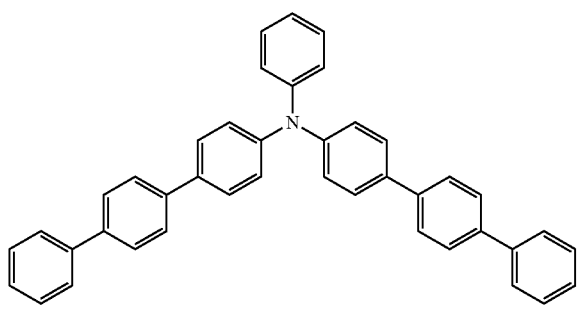
(1-20)
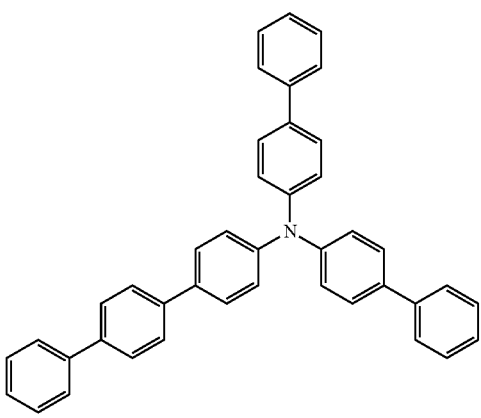

-continued
(1-21)
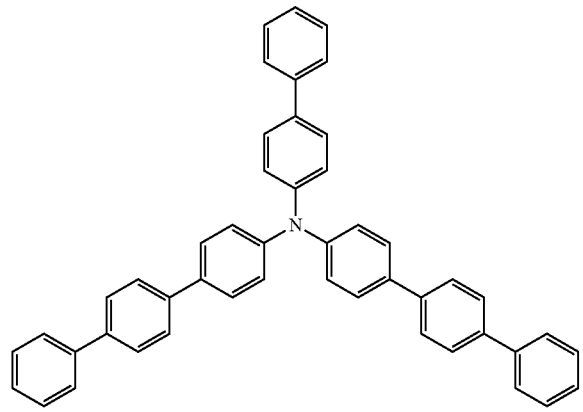
(1-22)
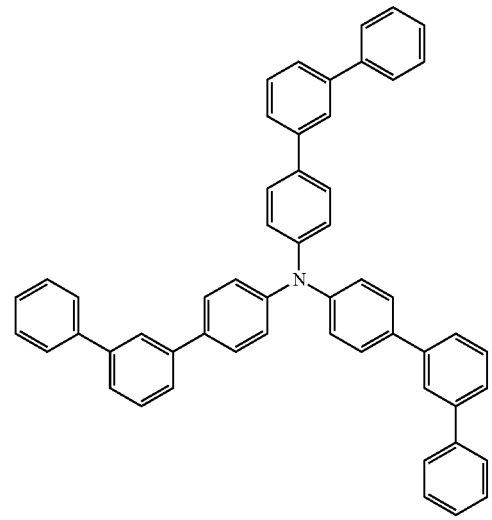
(1-23)
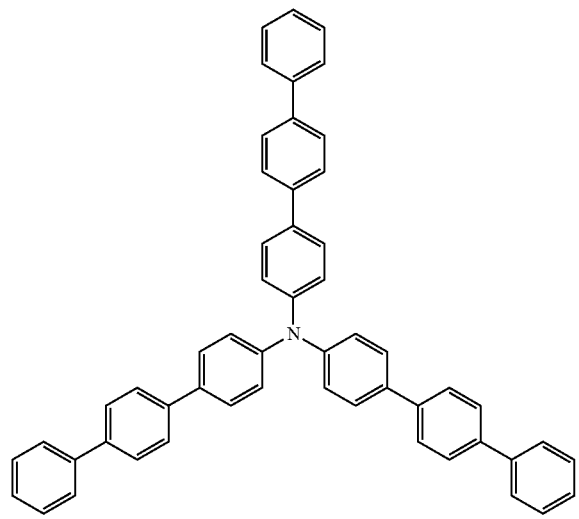
(1-24)
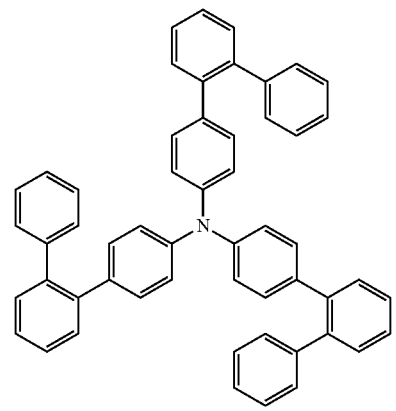
(1-25)
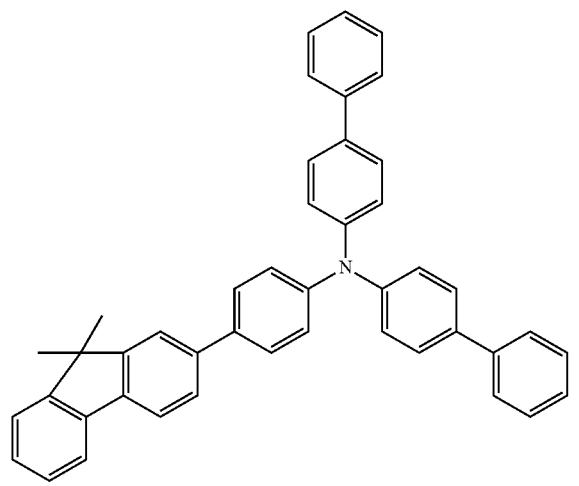
(1-26)
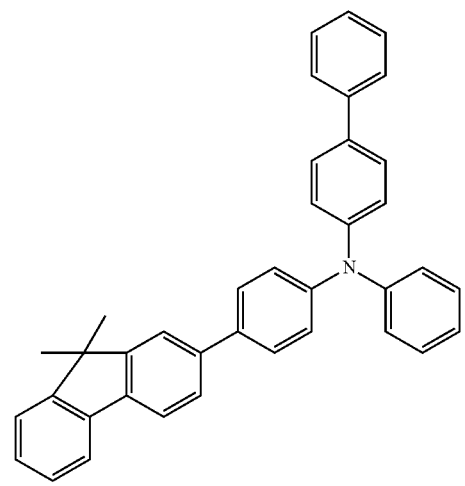

(1-27)
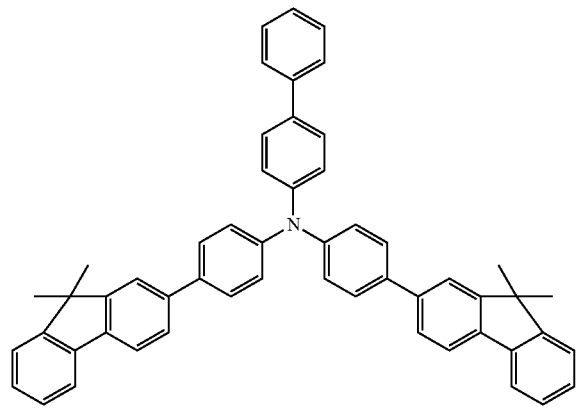
(1-28)
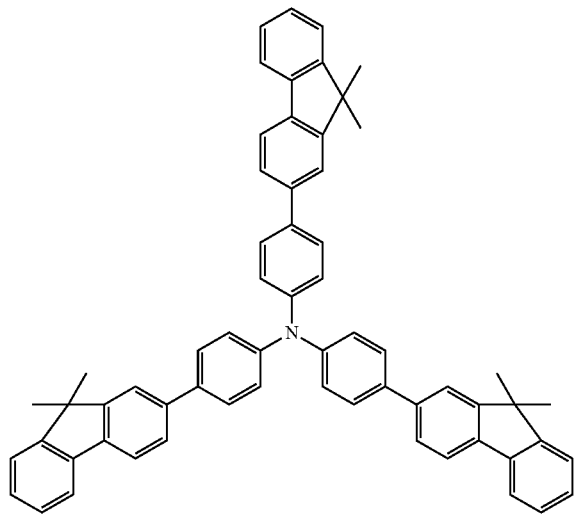
(1-29)
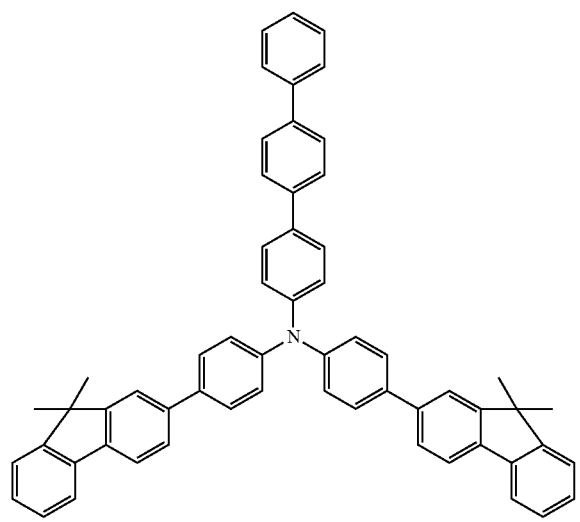
(1-30)
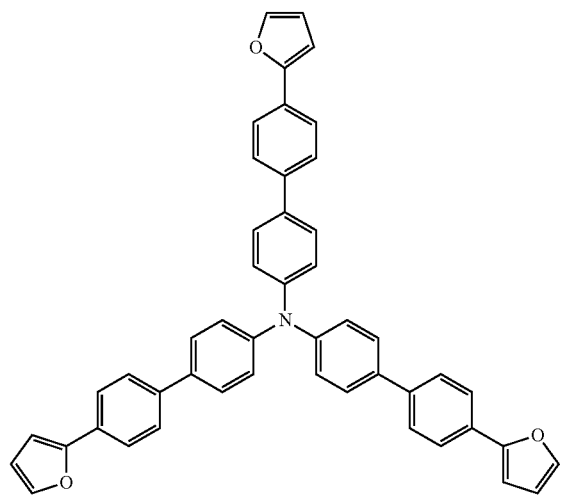

(1-31)
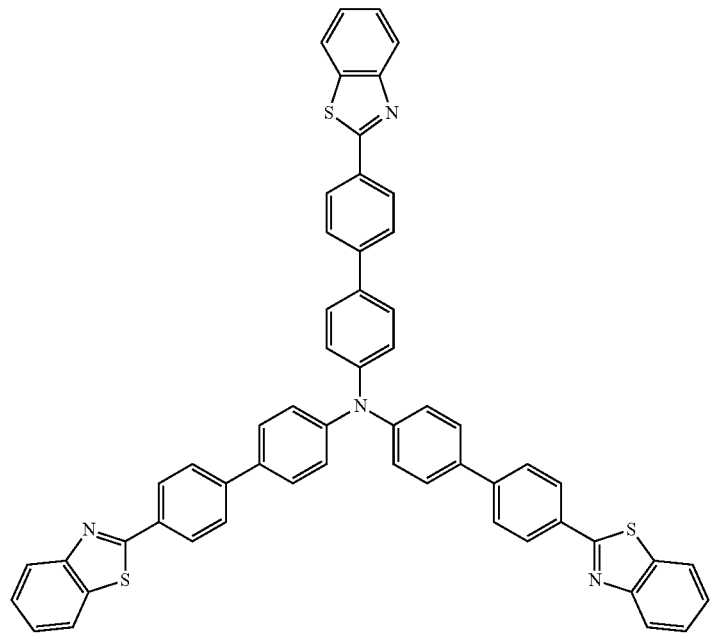
(1-32)
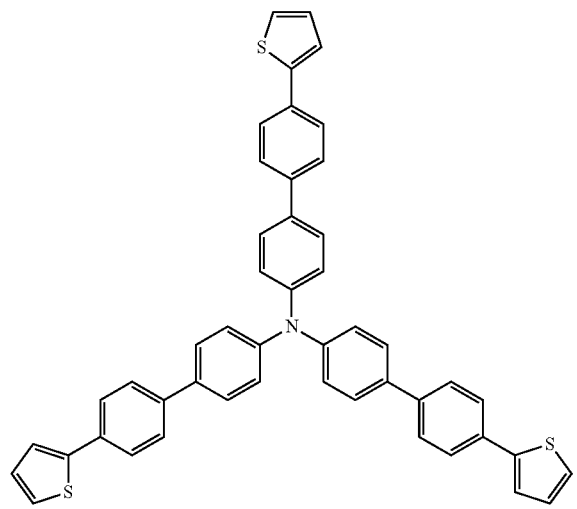
(1-33)
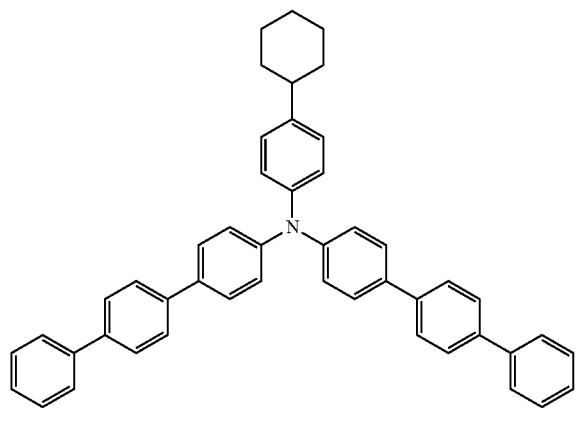
(1-34)
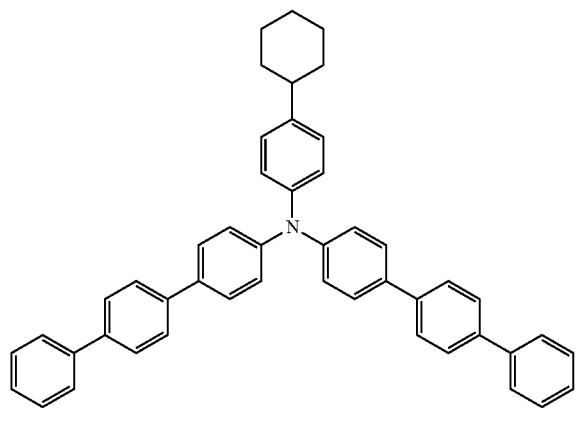
(1-35)
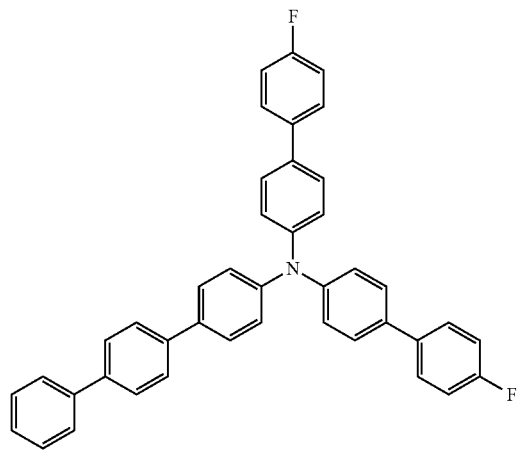

(1-36)
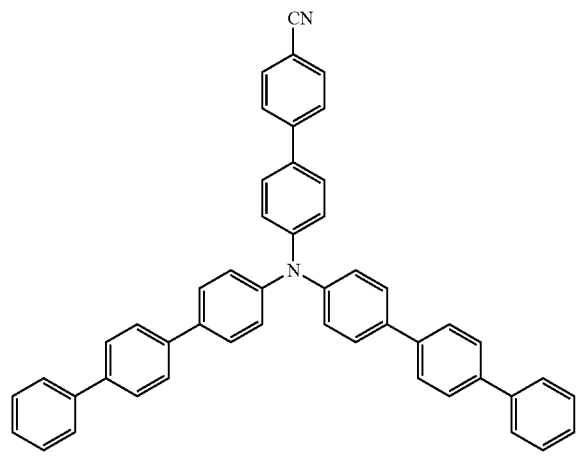
(1-37)
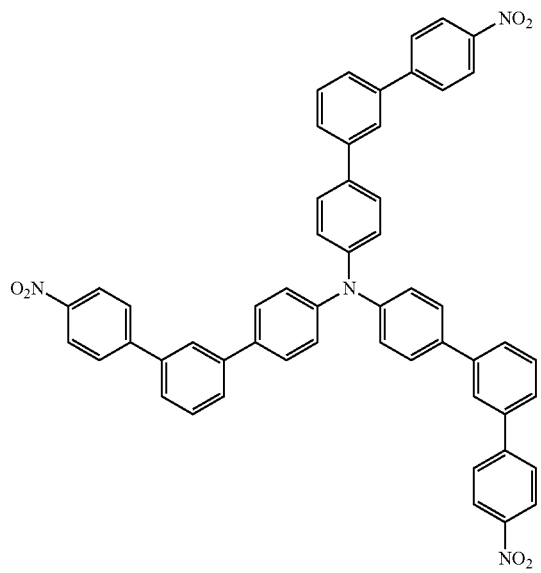
(1-38)
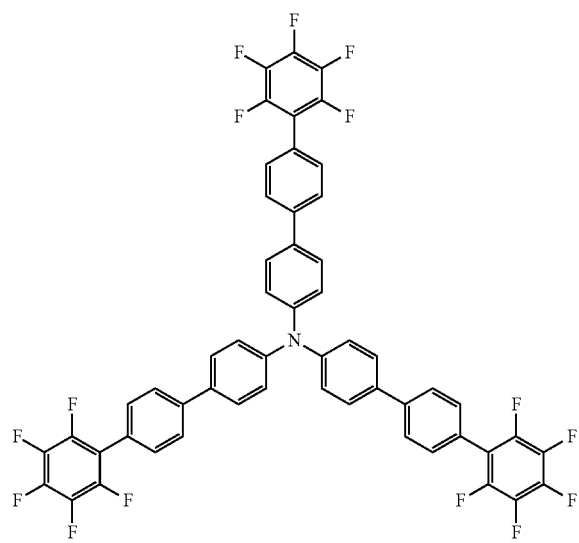
(1-39)
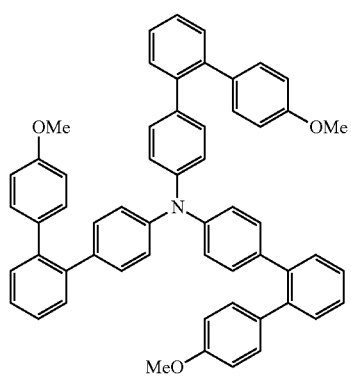
(1-40)
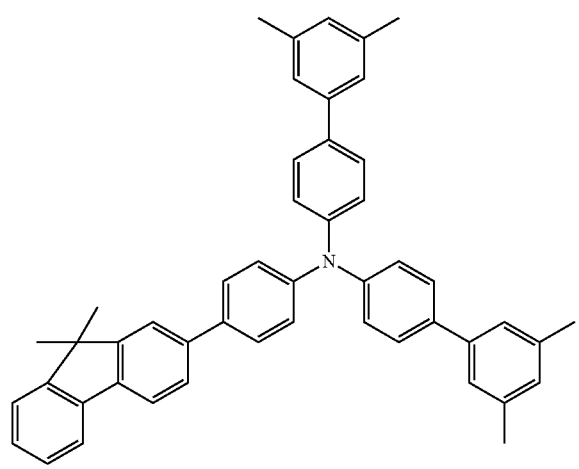
(1-41)
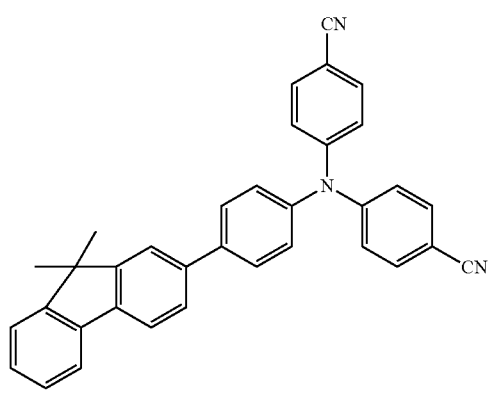

(1-42)
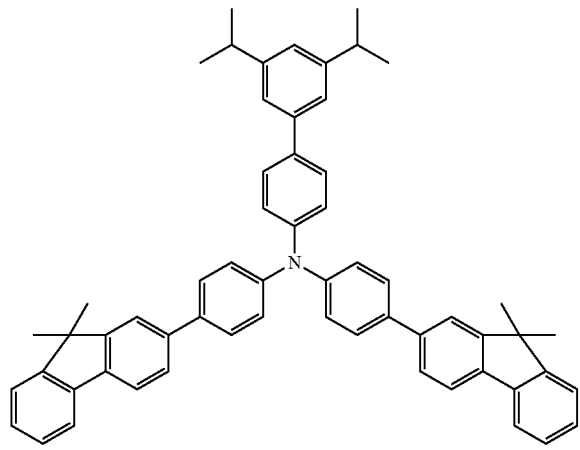
(1-43)
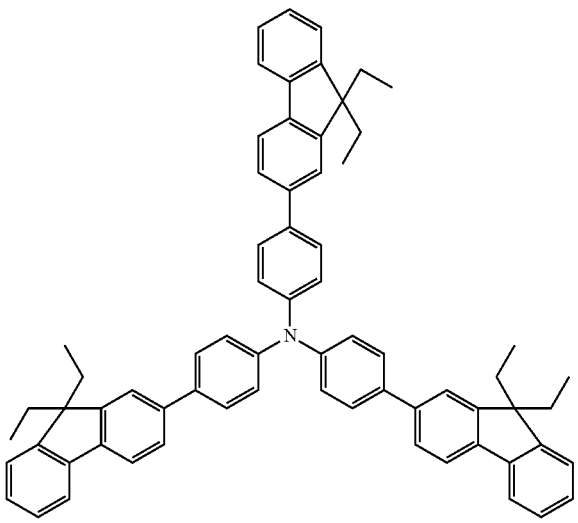
(1-44)
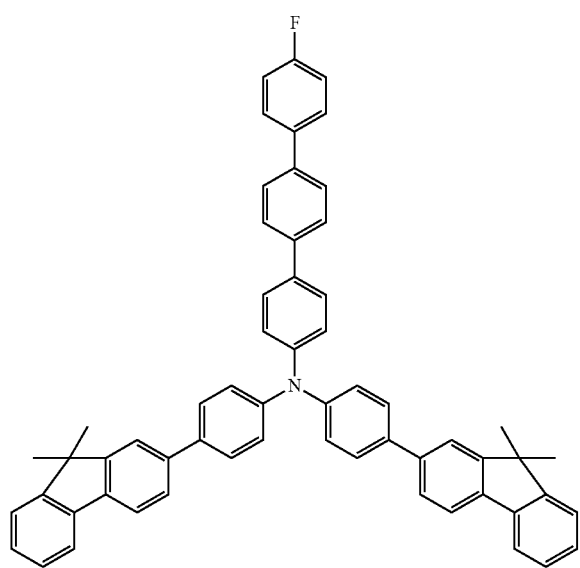
(1-45)
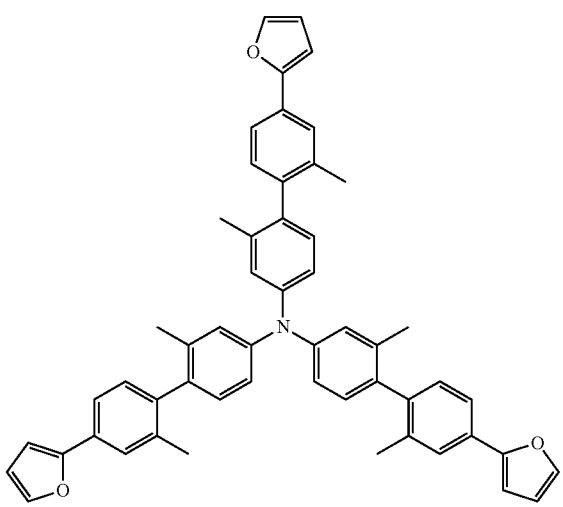

(1-46)
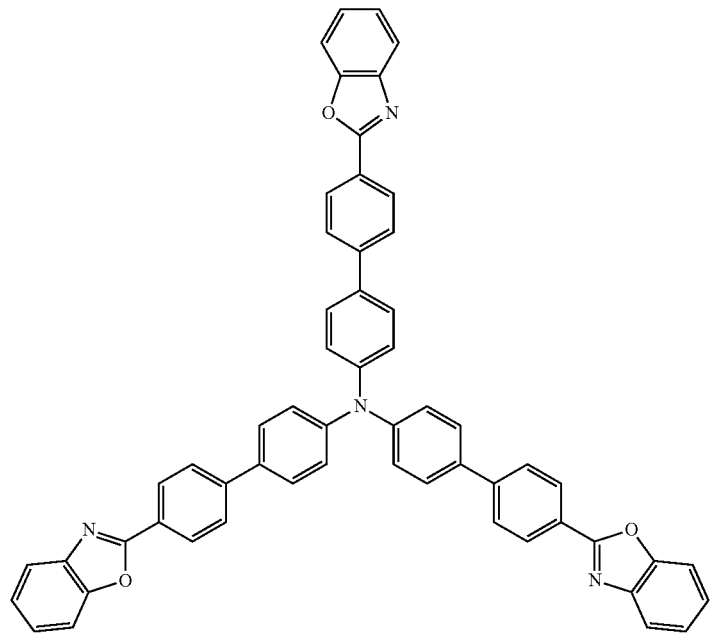
(1-47)
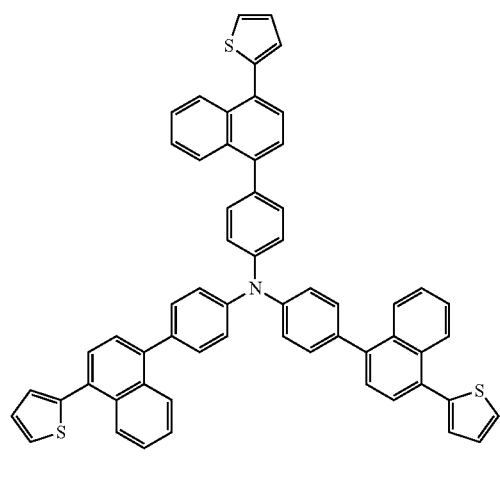
(1-48)
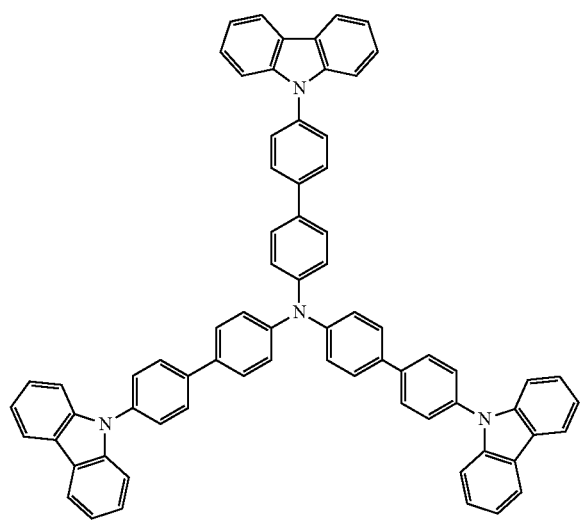
Specific examples of the compounds shown in Formula 2 include compounds such as the following Formula 2(1) to Formula 2(163).

(2-1)
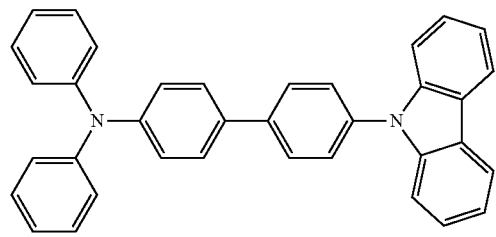
(2-2)
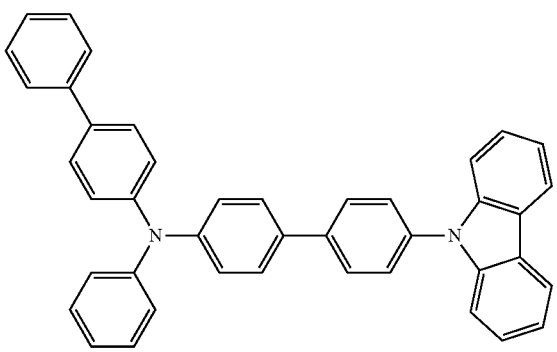
(2-3)
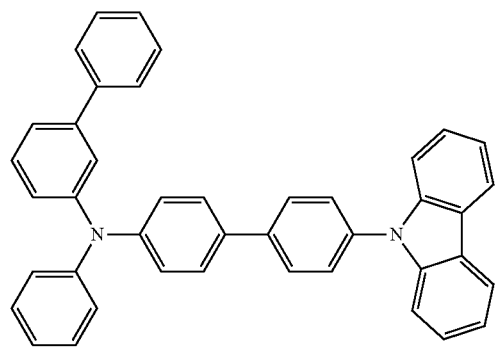
(2-4)
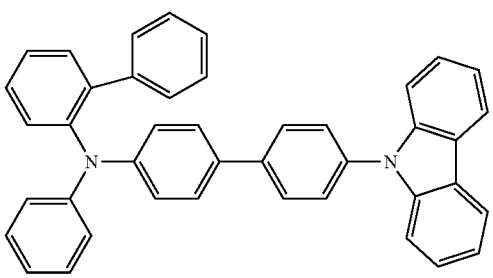
(2-5)
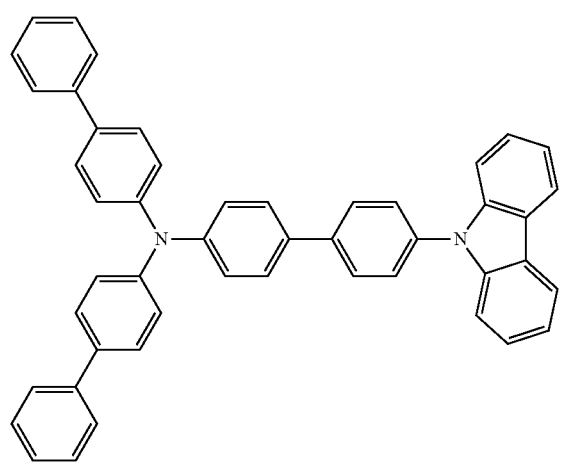
(2-6)
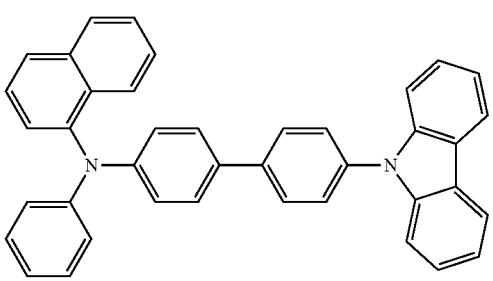
(2-7)
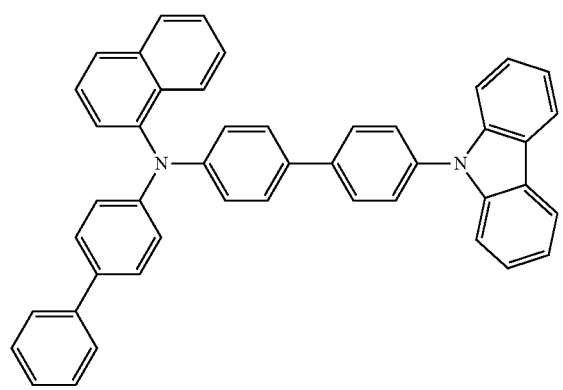

-continued
(2-8)
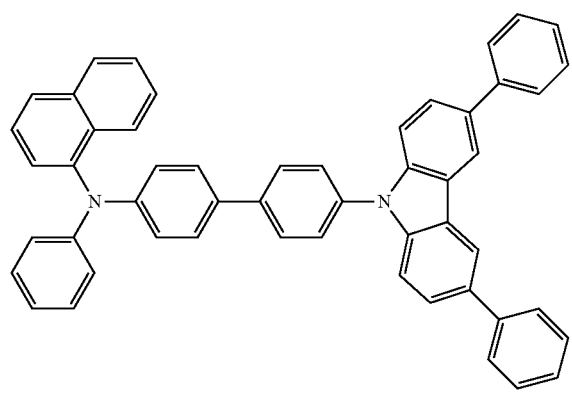
(2-9)
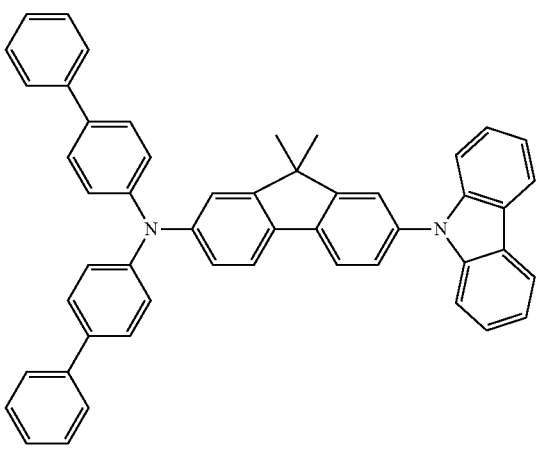
(2-10)
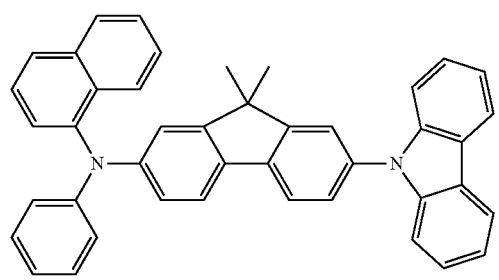
(2-11)
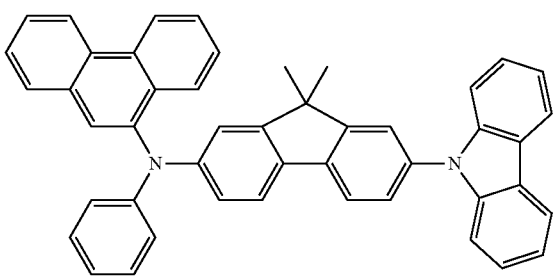
(2-12)
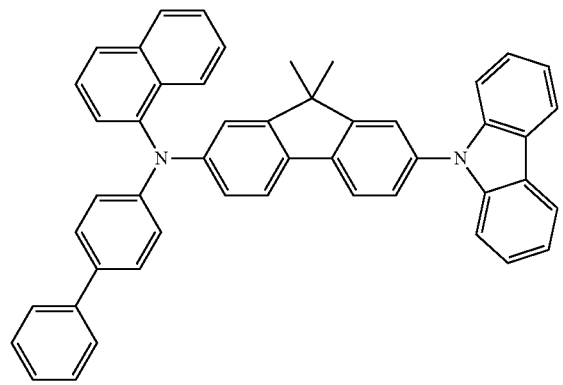
(2-13)
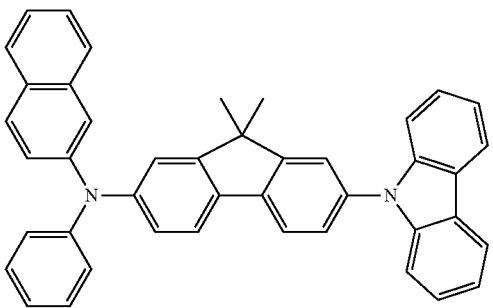
(2-14)
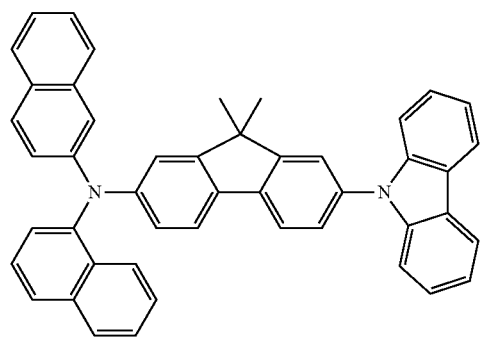
(2-15)
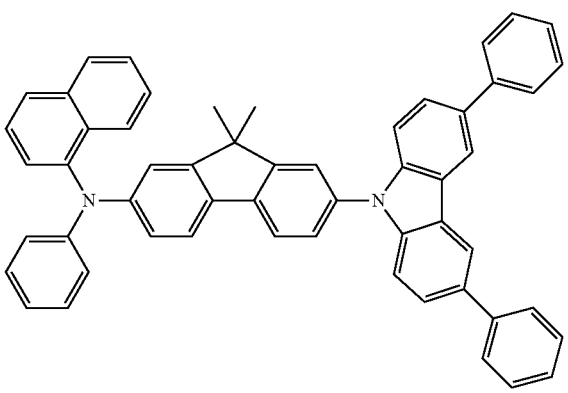

-continued
(2-16)
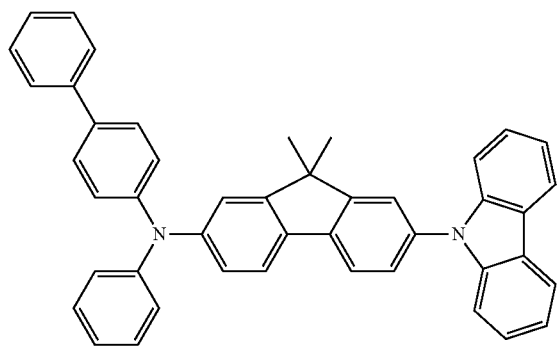
(2-17)
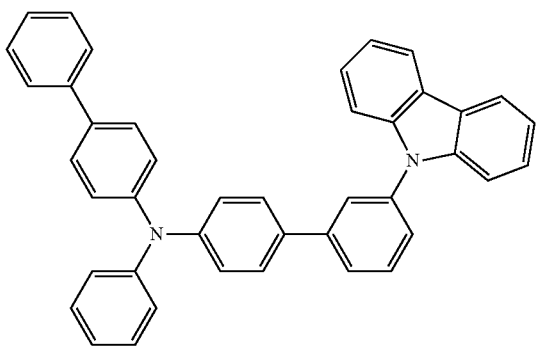
(2-18)
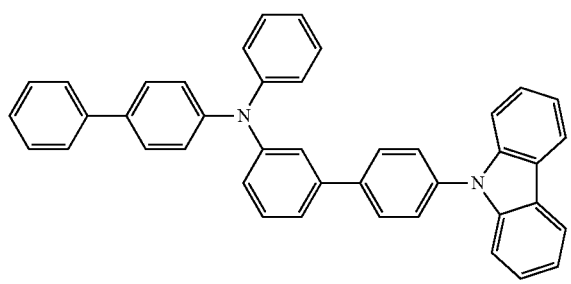
(2-19)
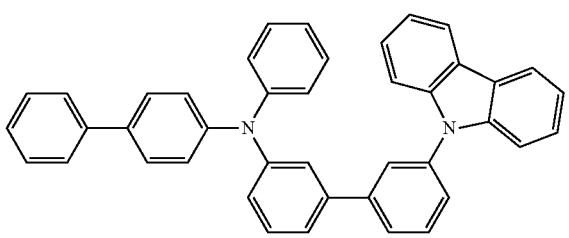
(2-20)
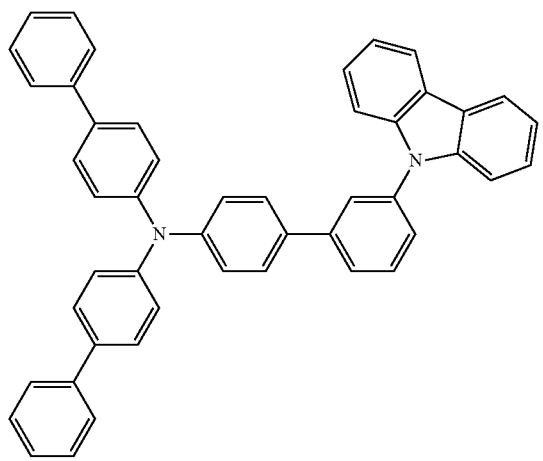
(2-21)
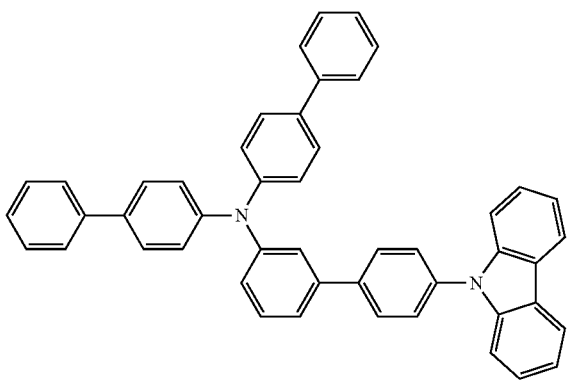
(2-22)
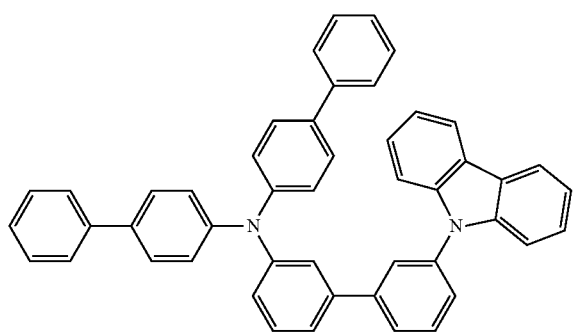
(2-23)
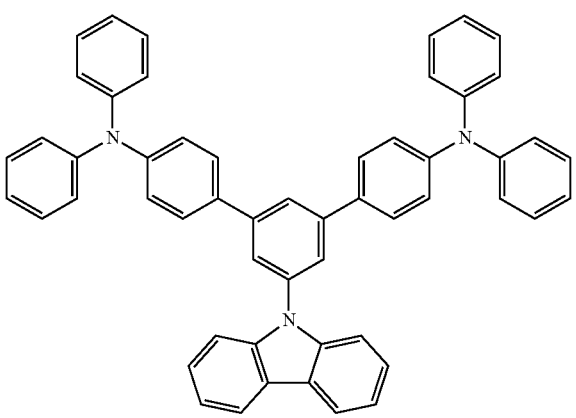

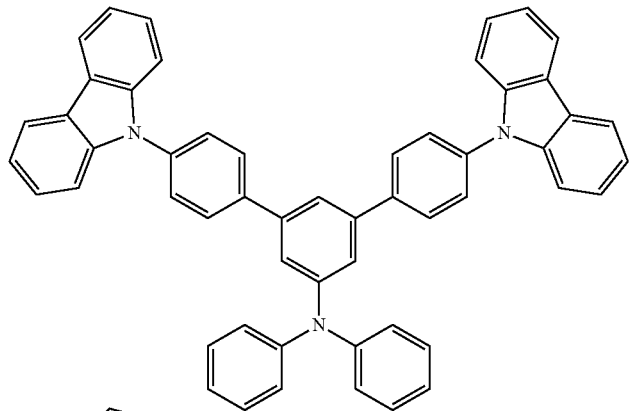
(2-24)
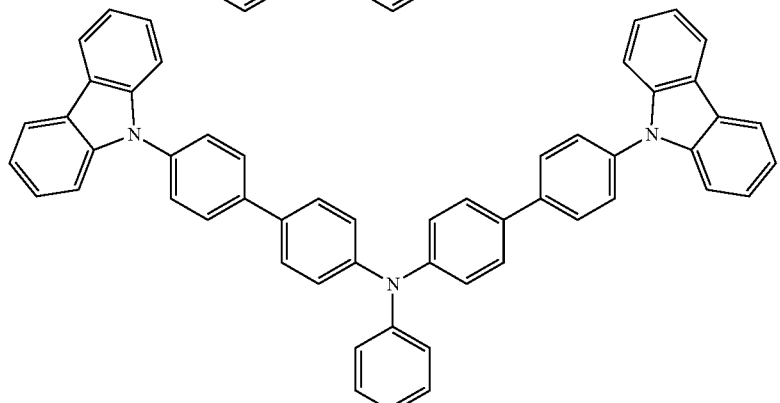
(2-25)
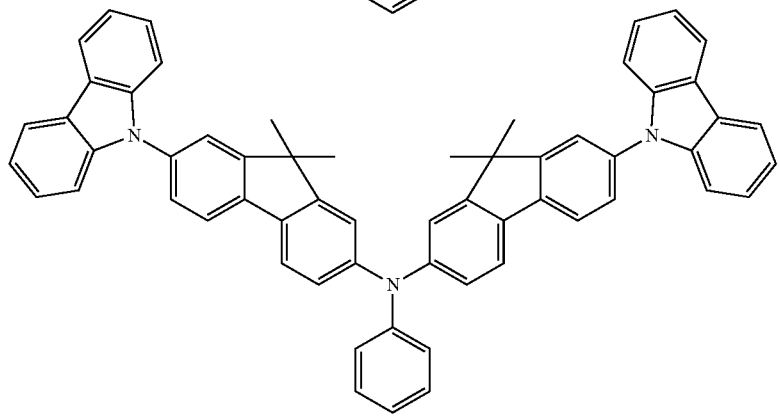
(2-26)
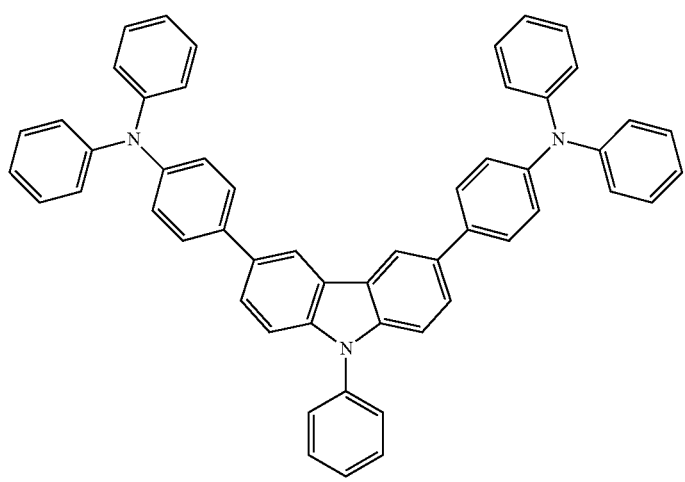
(2-27)

-continued
(2-28)
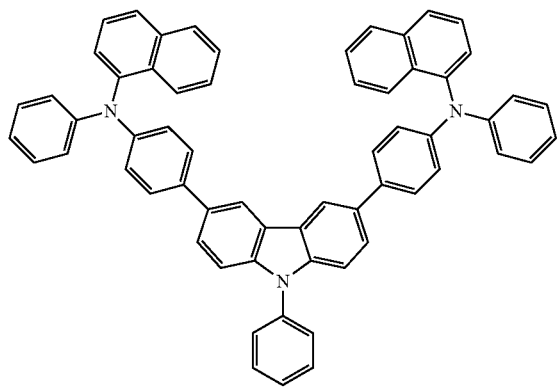
(2-29)
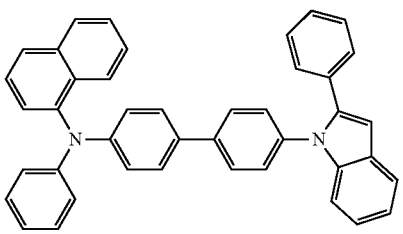
(2-30)
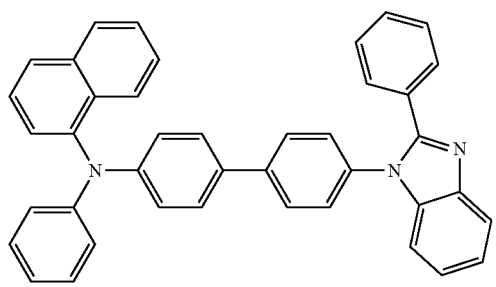
(2-31)
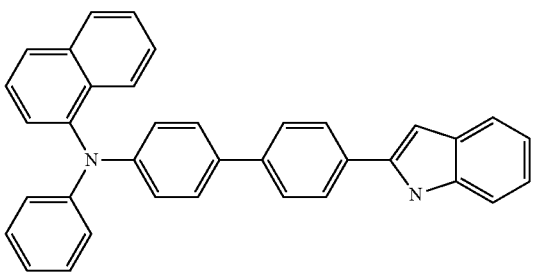
(2-32)
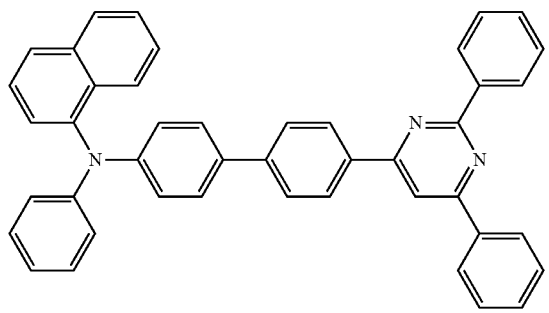
(2-33)
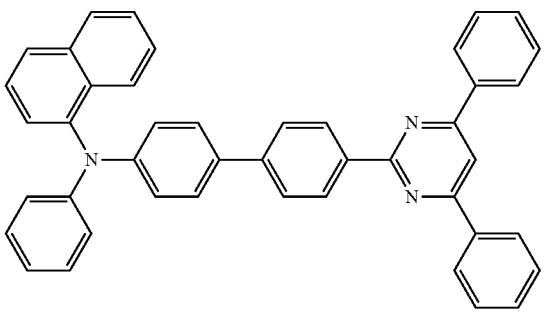
(2-34)
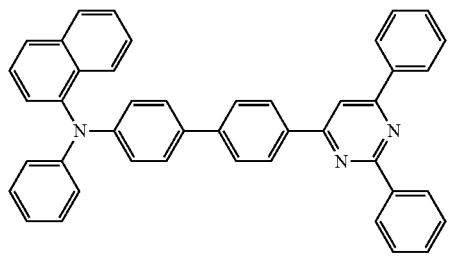
(2-35)
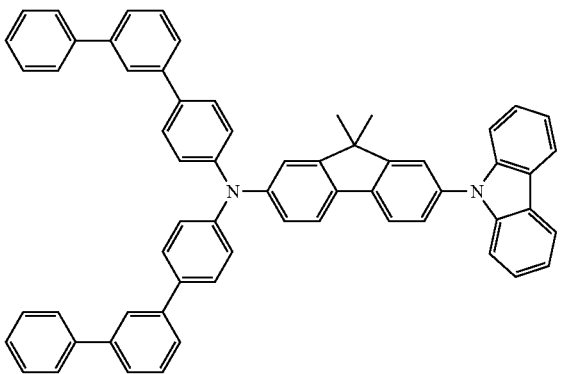

(2-36)
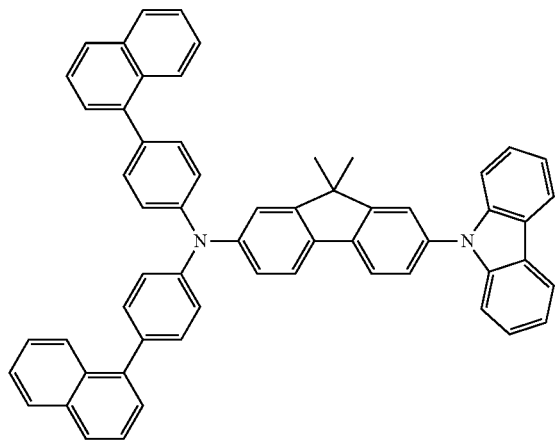
(2-37)
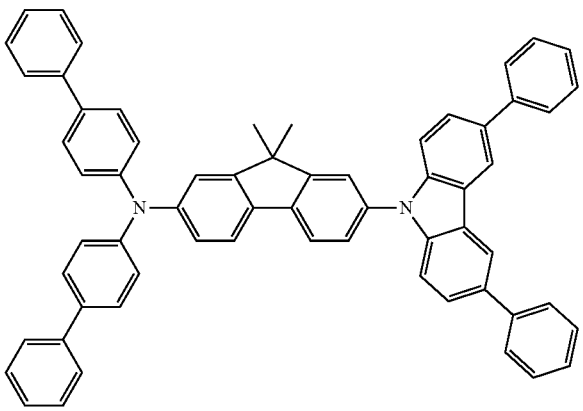
(2-38)
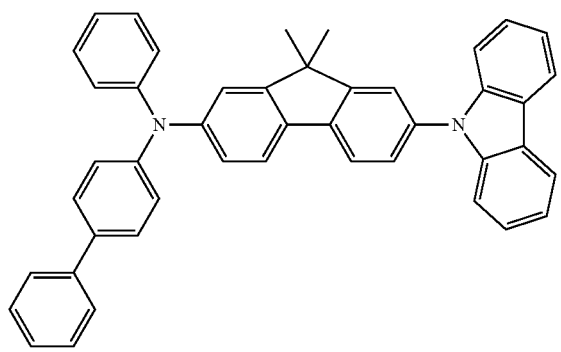
(2-39)
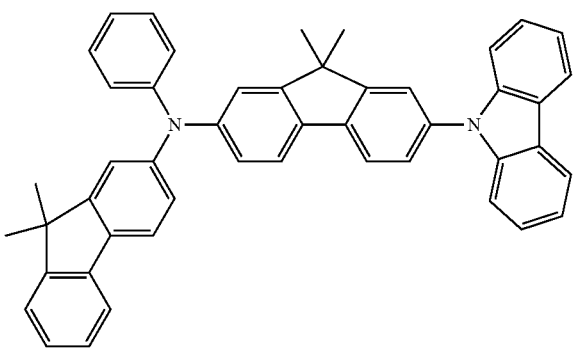
(2-40)
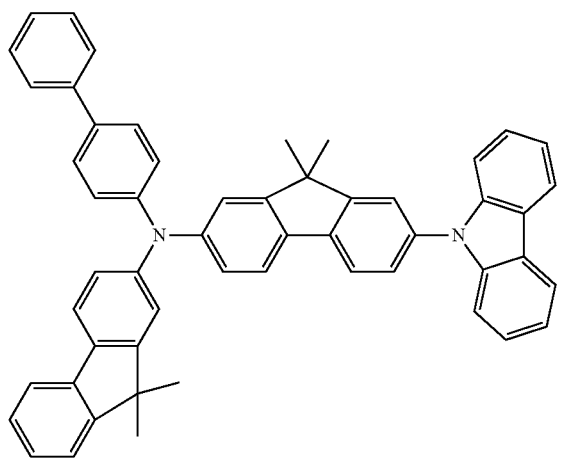
(2-41)
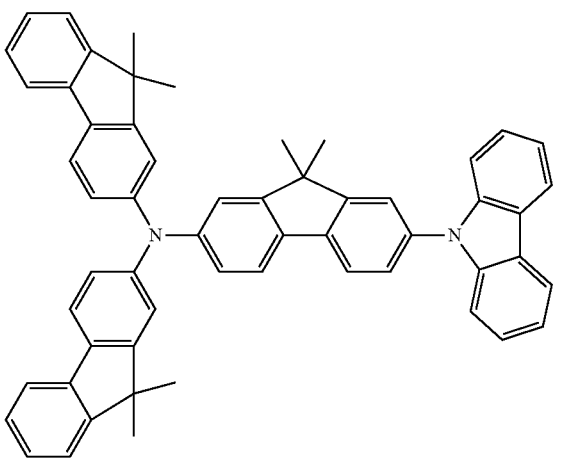

-continued
(2-42)
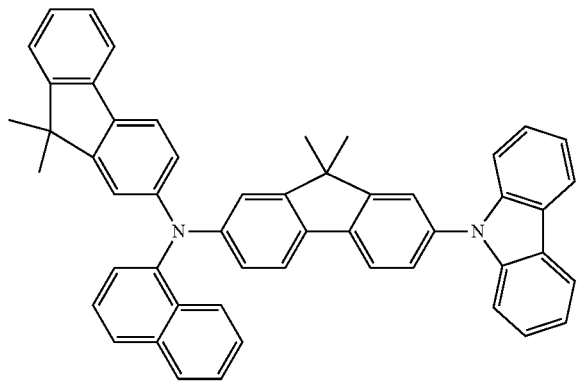
(2-43)
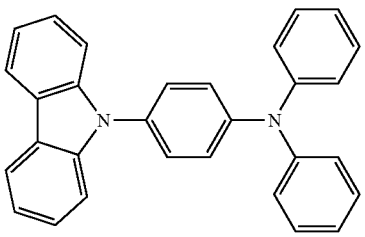
(2-44)
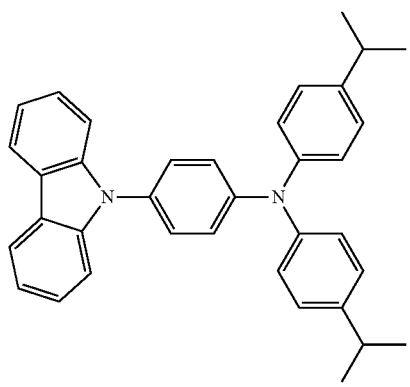
(2-45)
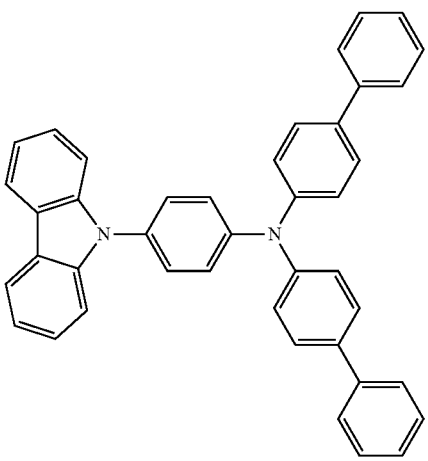
(2-46)
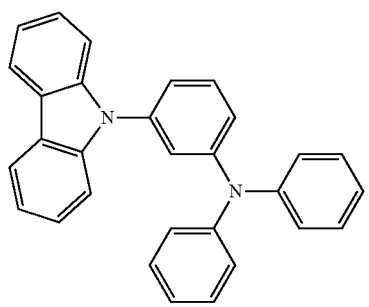
(2-47)
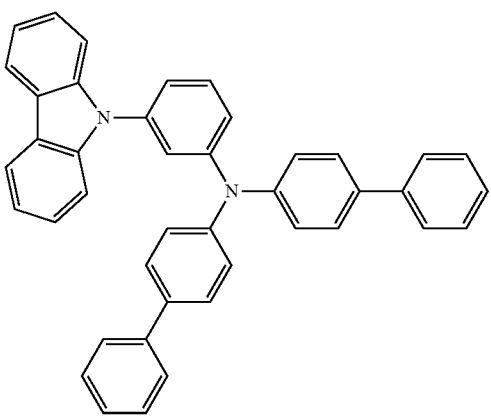

-continued
(2-48)
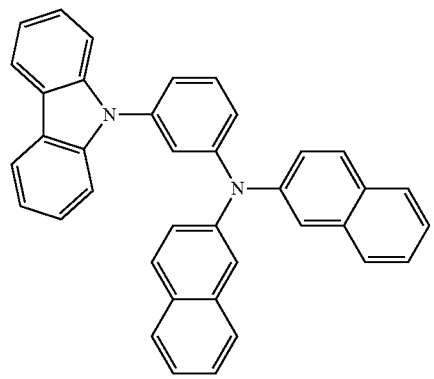
(2-49)
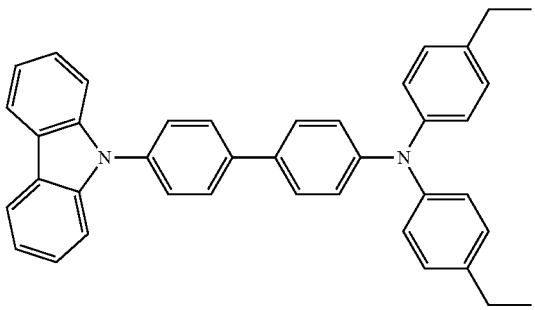
(2-50)
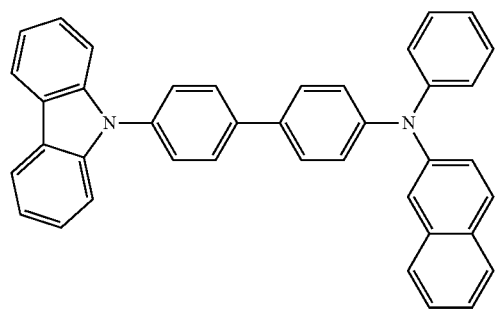
(2-51)
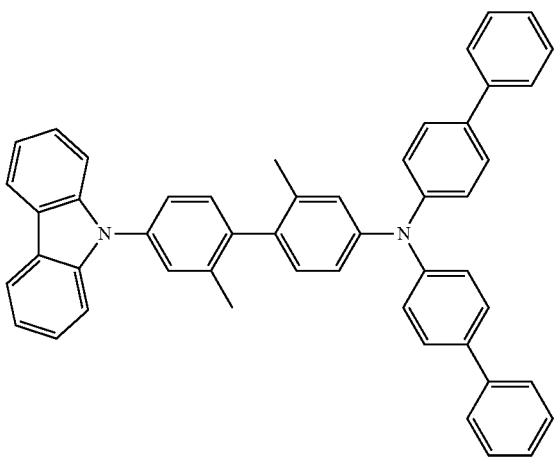
(2-52)
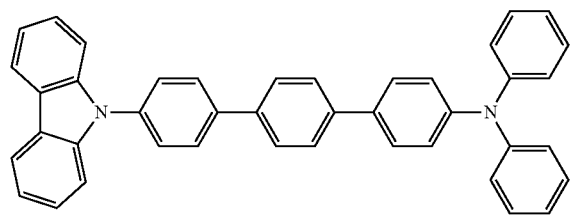
(2-53)
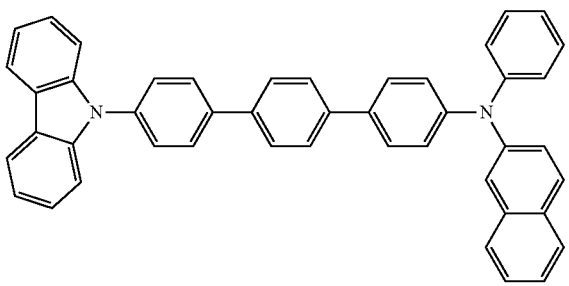
(2-54)
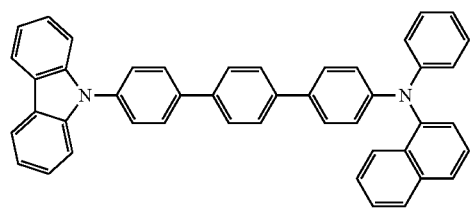
(2-55)
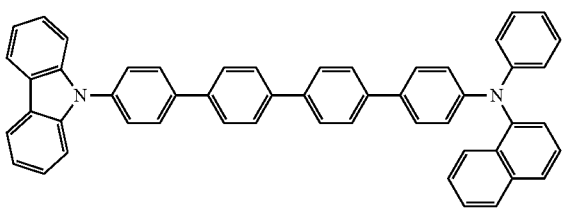

(2-56)
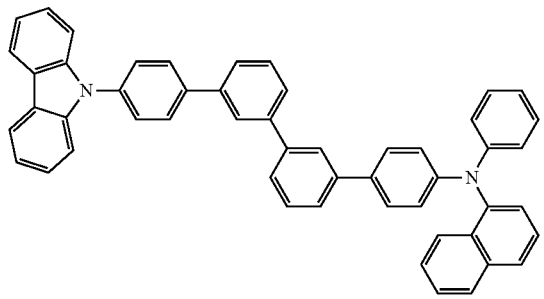
(2-57)
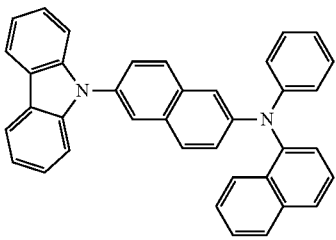
(2-58)
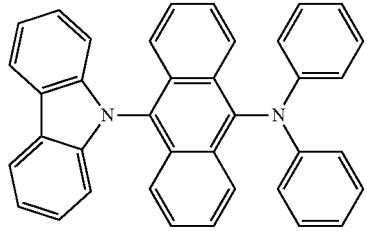
(2-59)
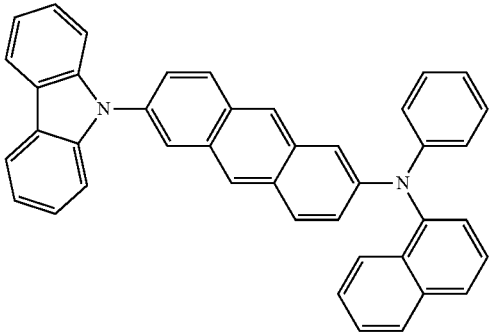
(2-60)
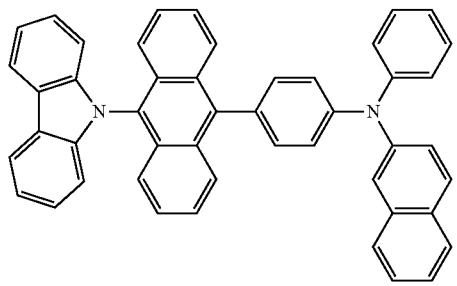
(2-61)
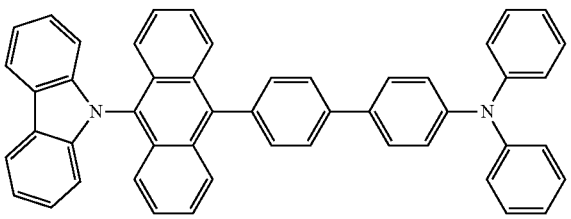
(2-62)
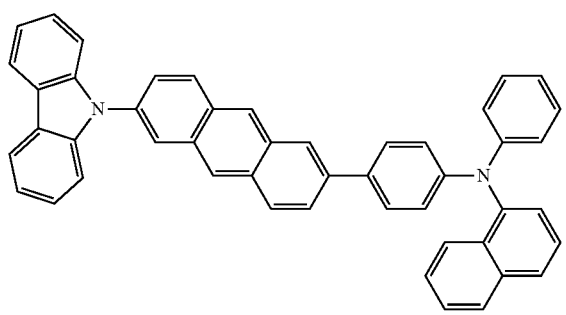
(2-63)
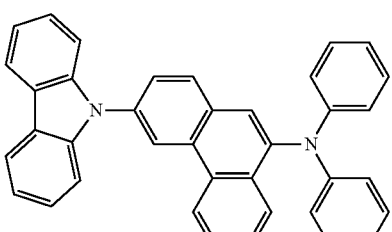
(2-64)
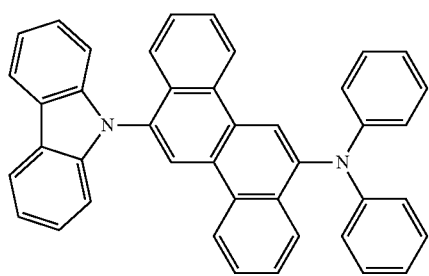
(2-65)
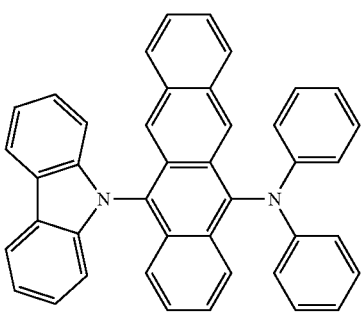

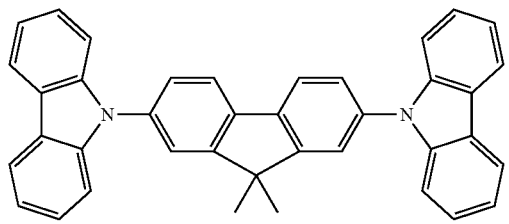 (2-66)
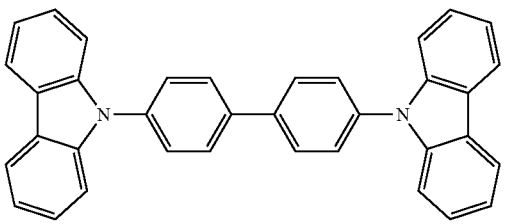 (2-67)
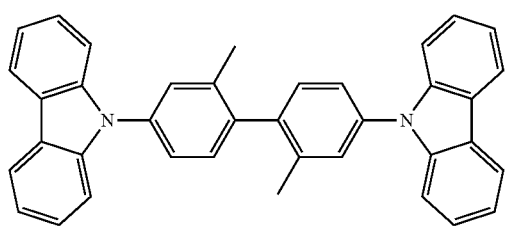 (2-68)
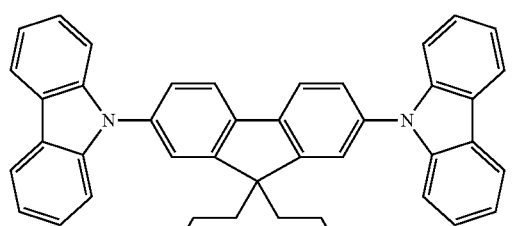 (2-69)
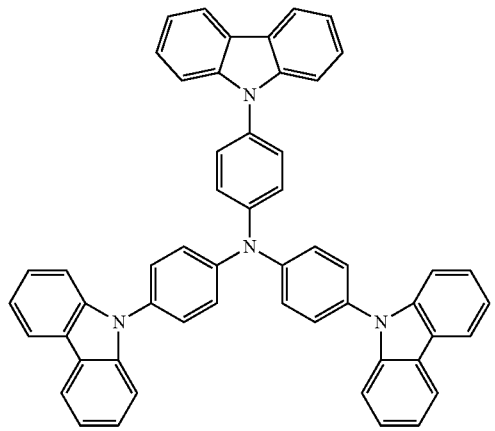 (2-70)
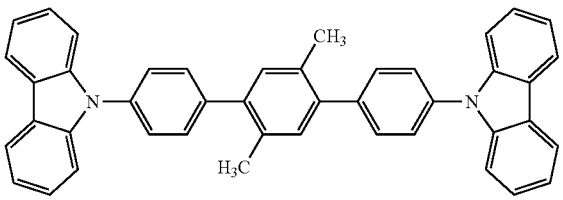 (2-71)
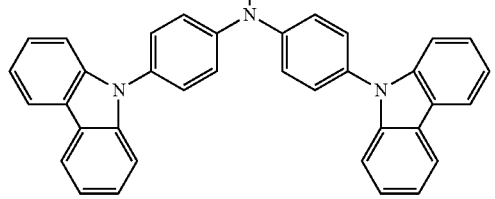
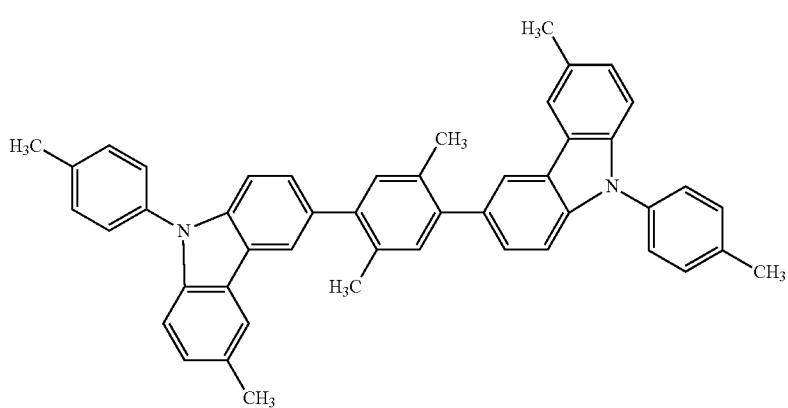 (2-72)

-continued
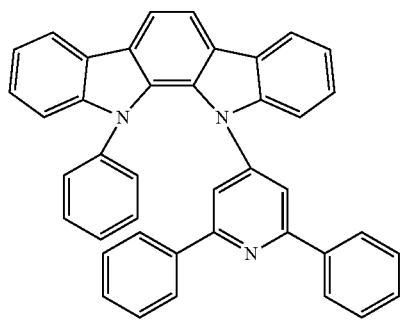
(2-73)
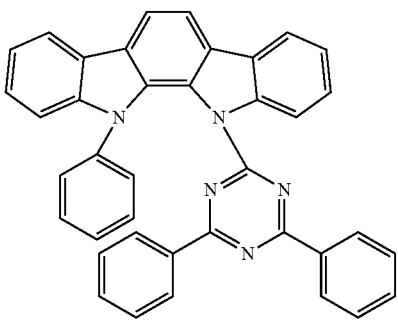
(2-74)
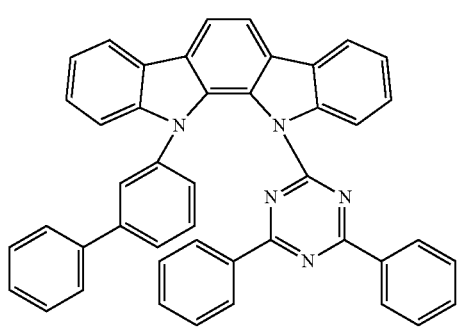
(2-75)
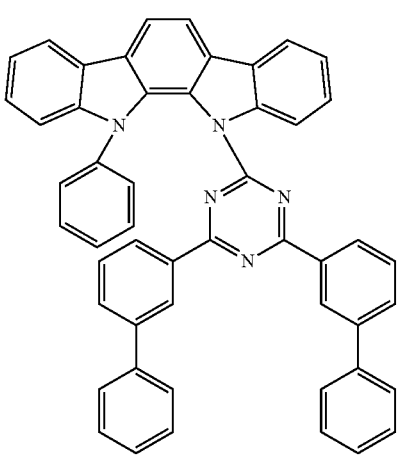
(2-76)
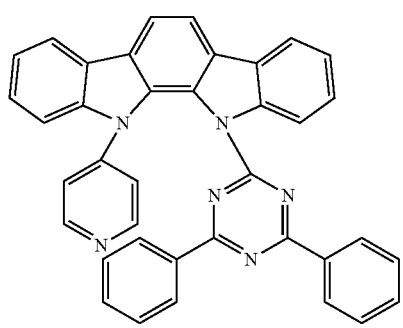
(2-77)
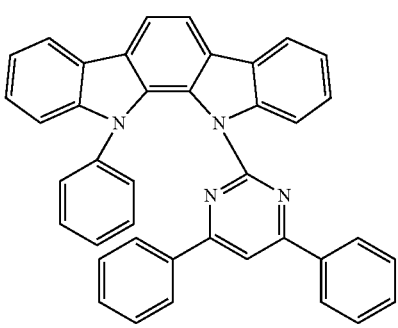
(2-78)
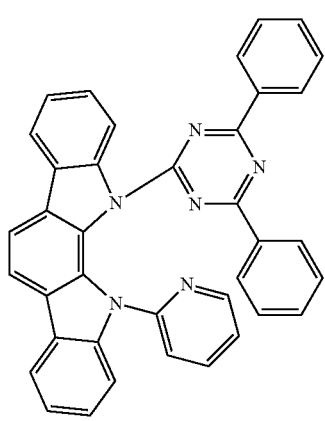
(2-79)
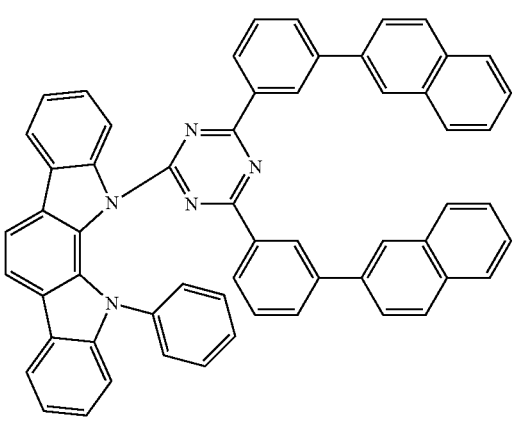
(2-80)

(2-81)
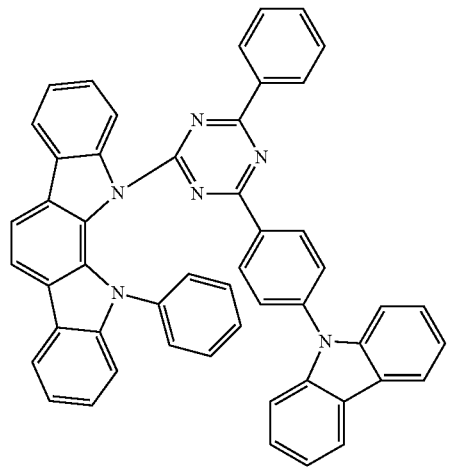
(2-82)
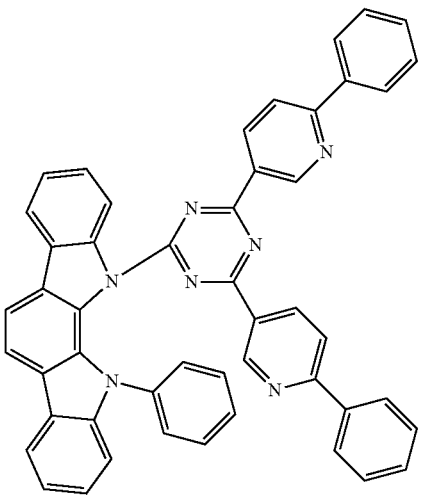
(2-83)
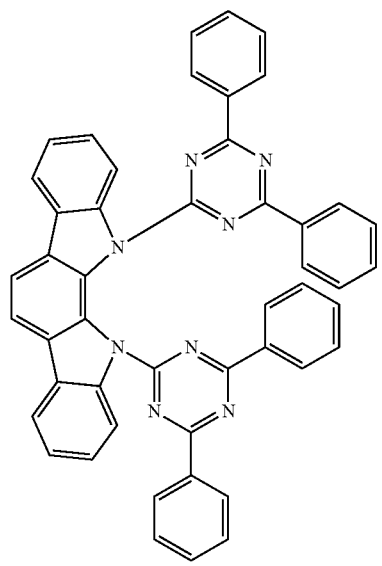
(2-84)
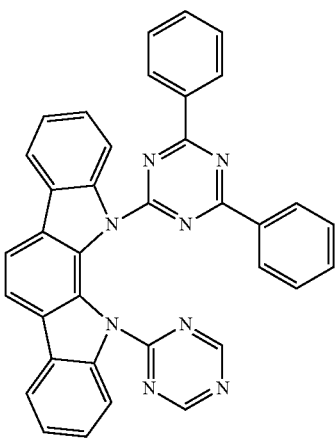
(2-85)
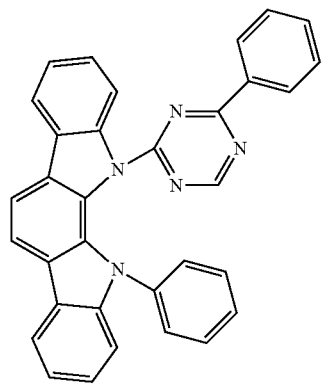
(2-86)
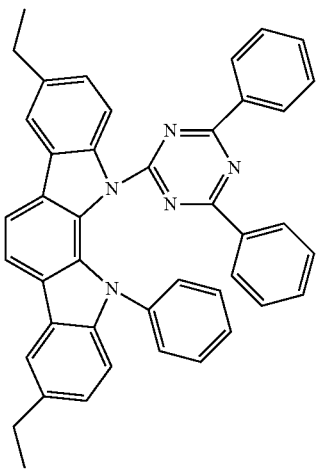

-continued
(2-87)
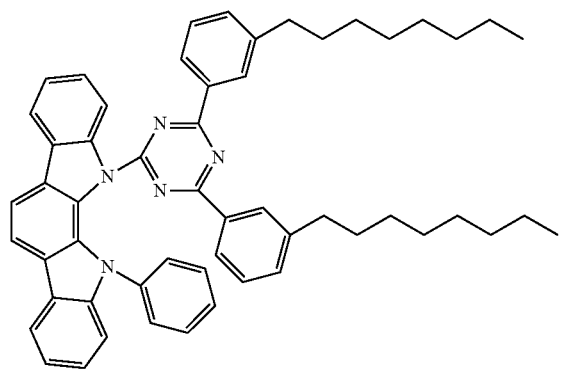
(2-88)
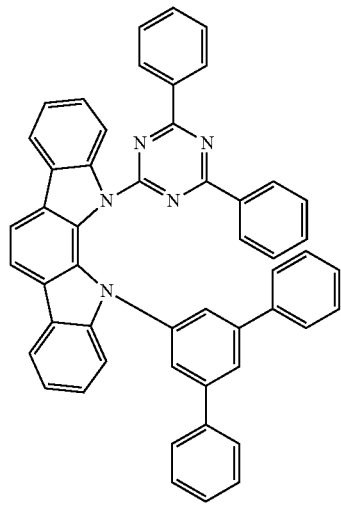
(2-89)
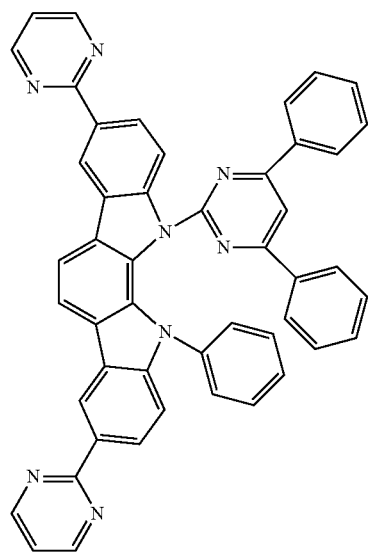
(2-90)
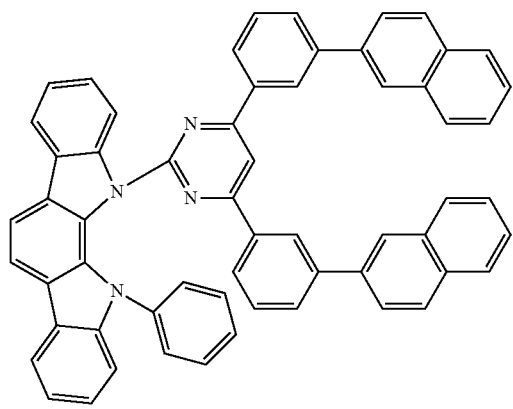
(2-91)
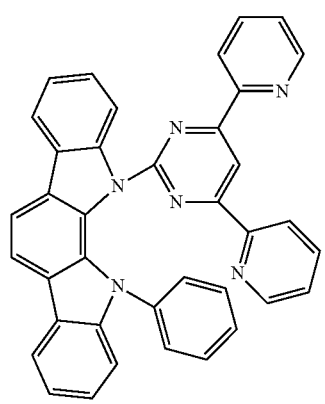
(2-92)
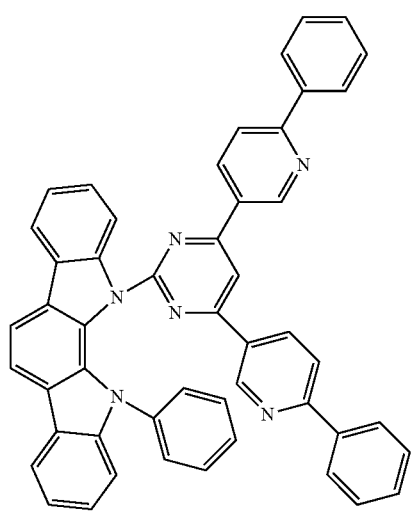

-continued
(2-93)
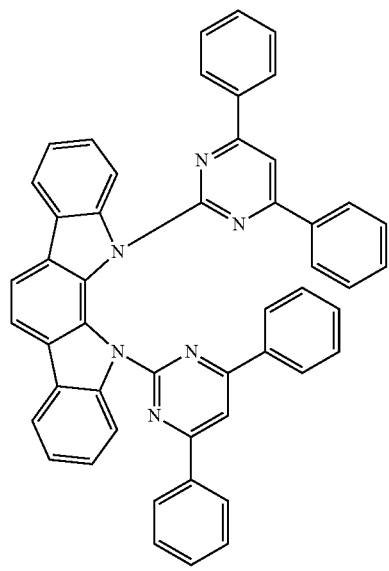
(2-94)
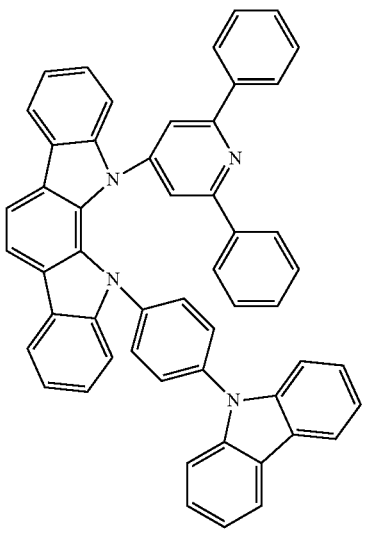
(2-95)
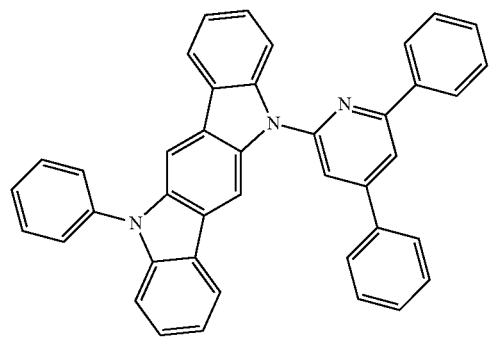
(2-96)
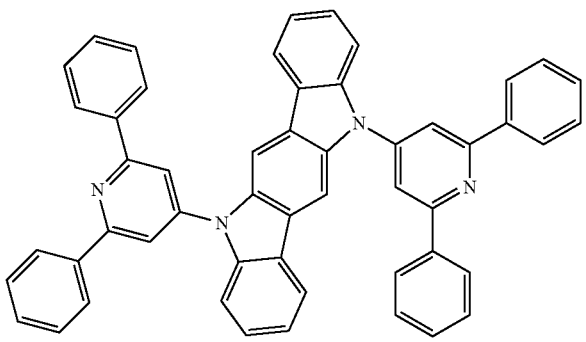
(2-97)
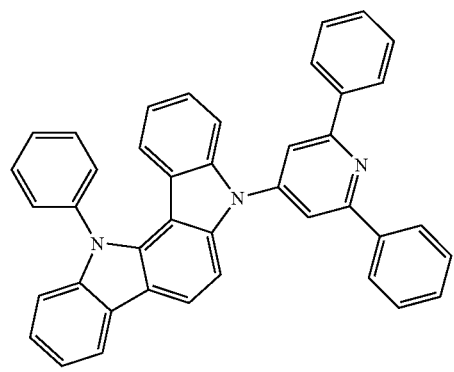
(2-98)
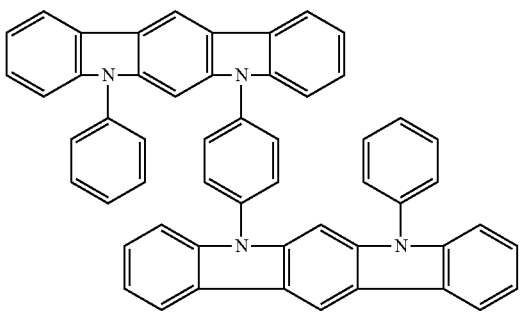

-continued
(2-99)
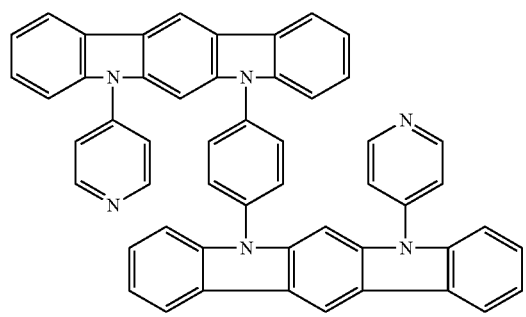
(2-100)
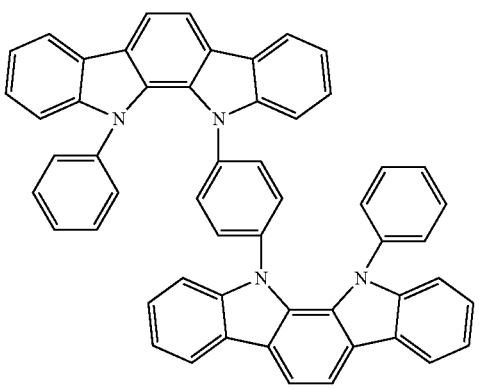
(2-101)
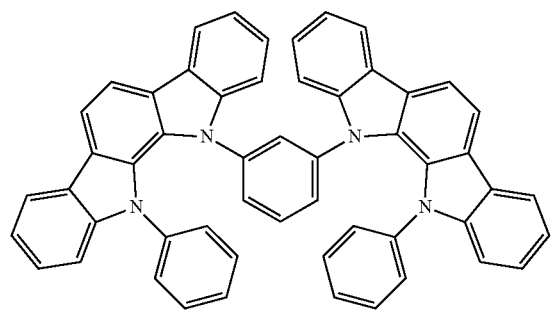
(2-102)
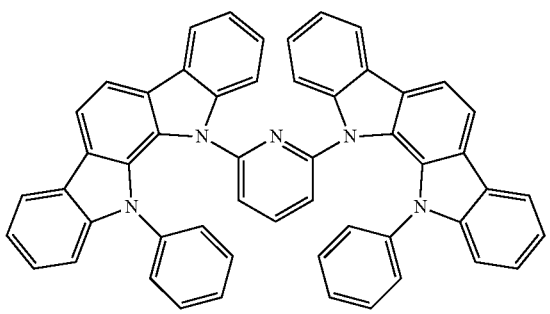
(2-103)
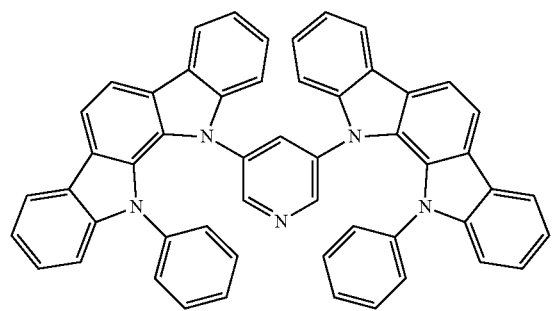
(2-104)
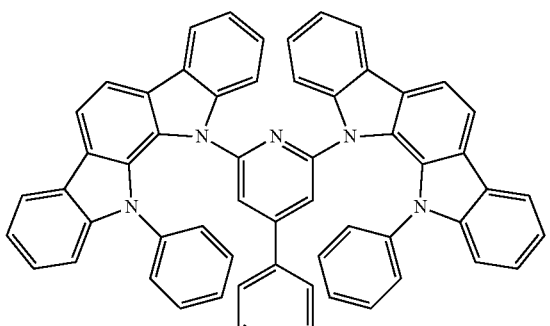
(2-105)
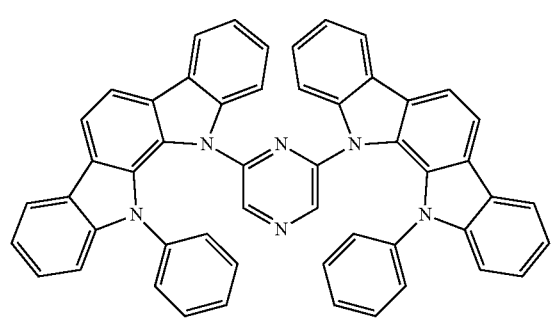
(2-106)
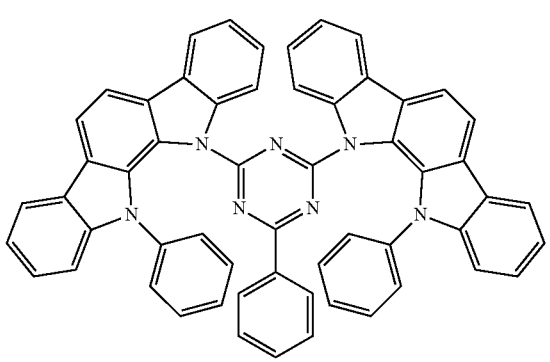

-continued
(2-107)
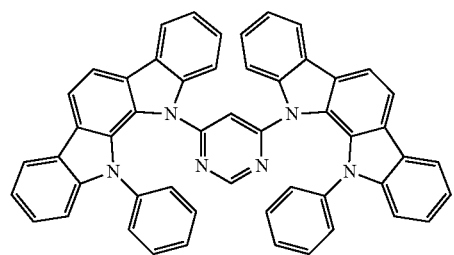
(2-108)
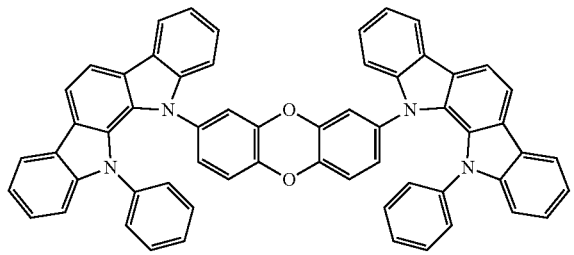
(2-109)
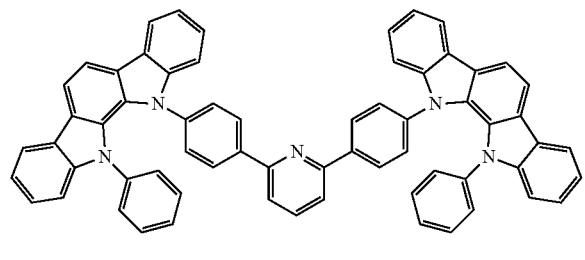
(2-110)
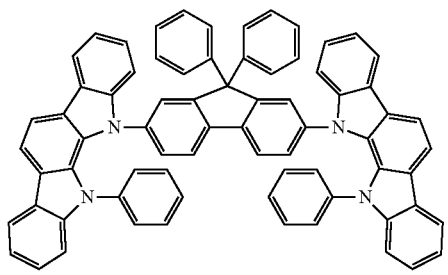
(2-111)
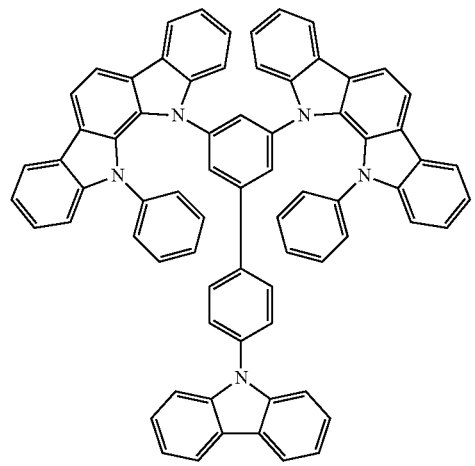
(2-112)
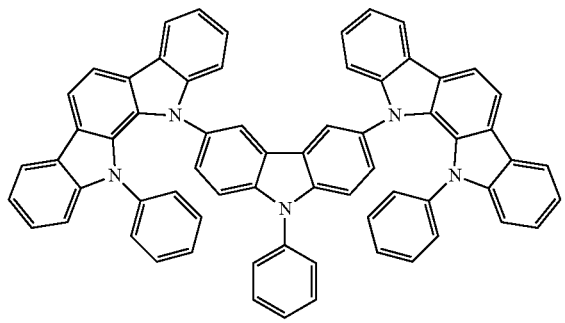
(2-113)
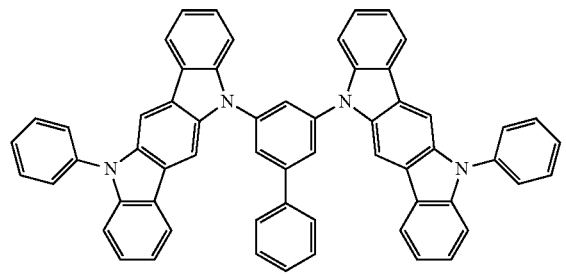
(2-114)
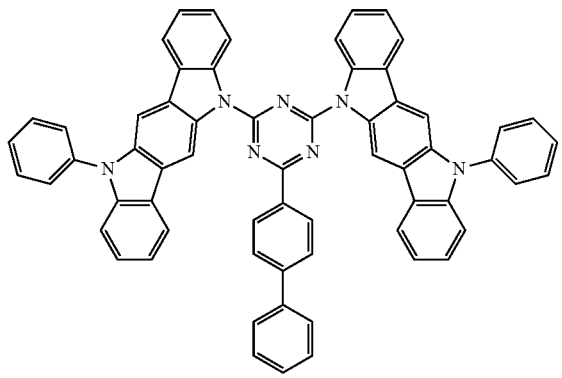

-continued
(2-115)
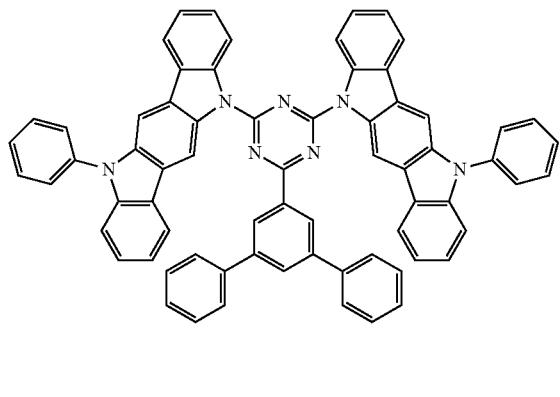
(2-116)
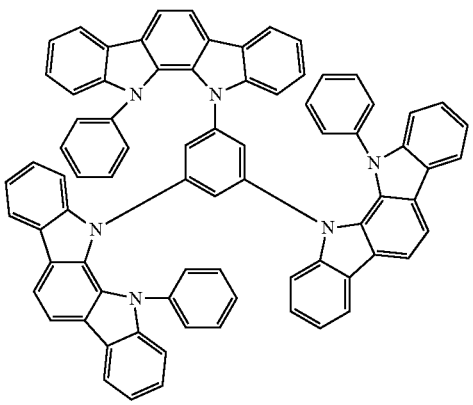
(2-117)
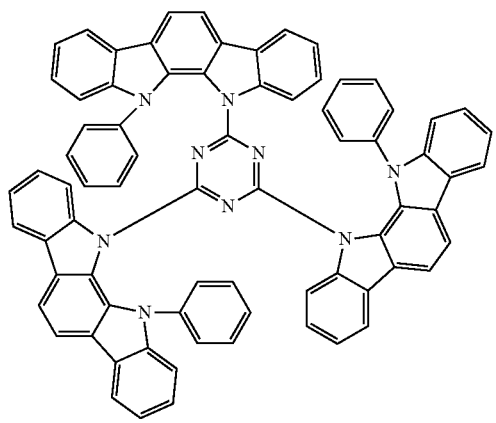
(2-118)
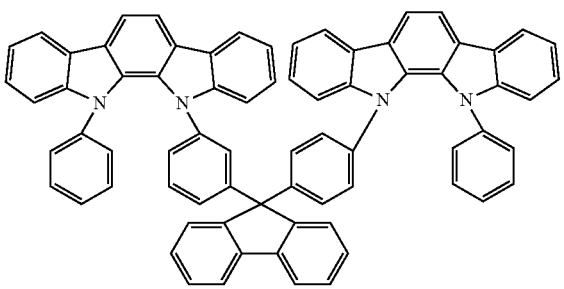
(2-119)
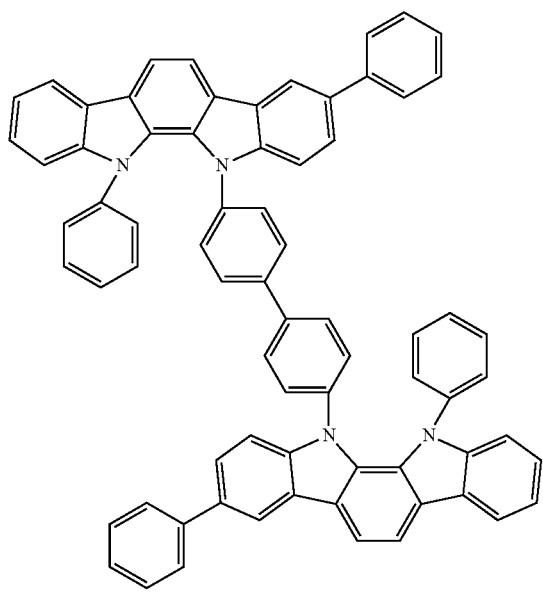
(2-120)
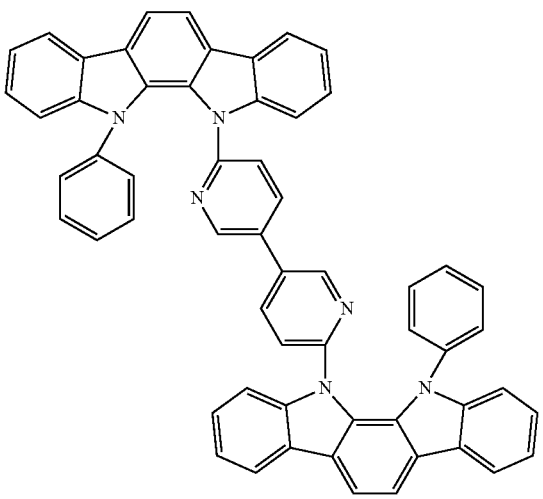

(2-121)
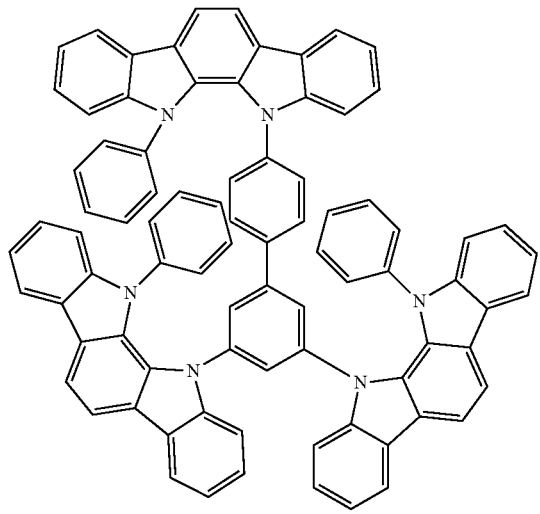
(2-122)
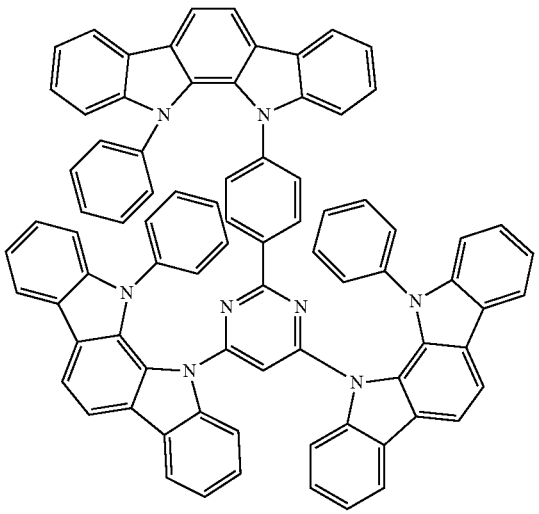
(2-123)
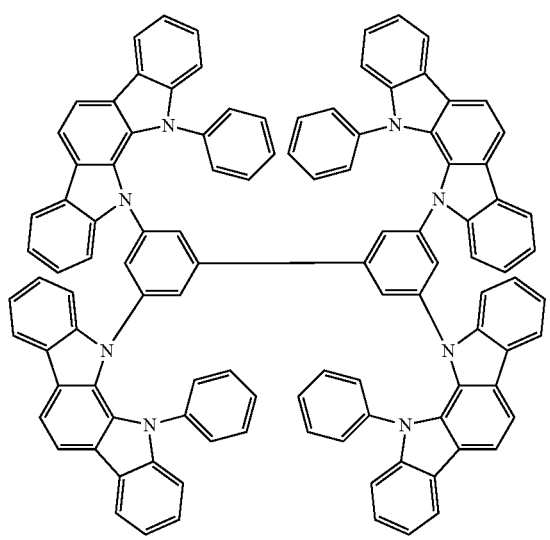
(2-124)
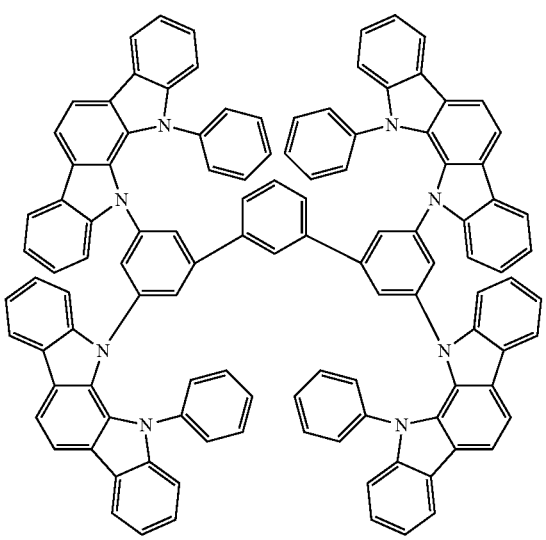

(2-125)
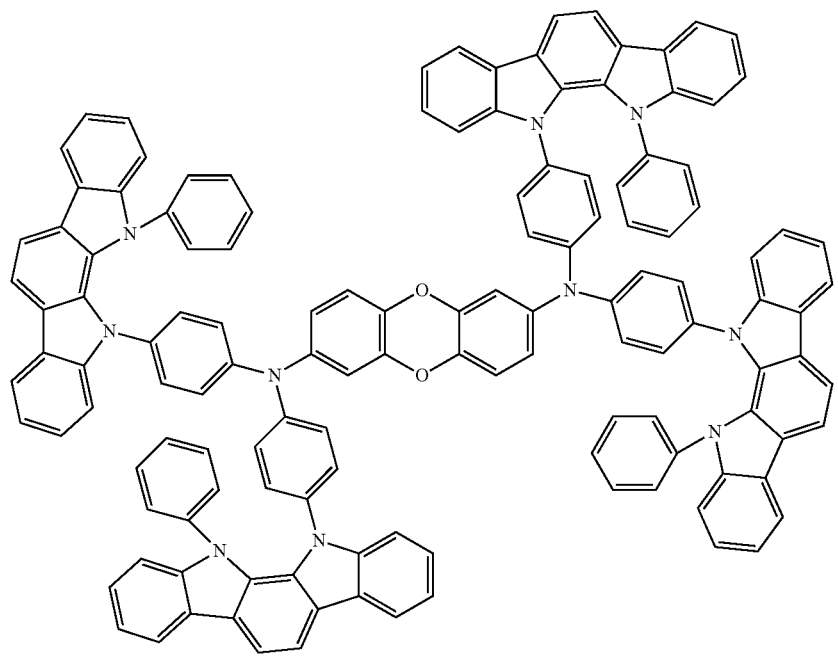
(2-126)
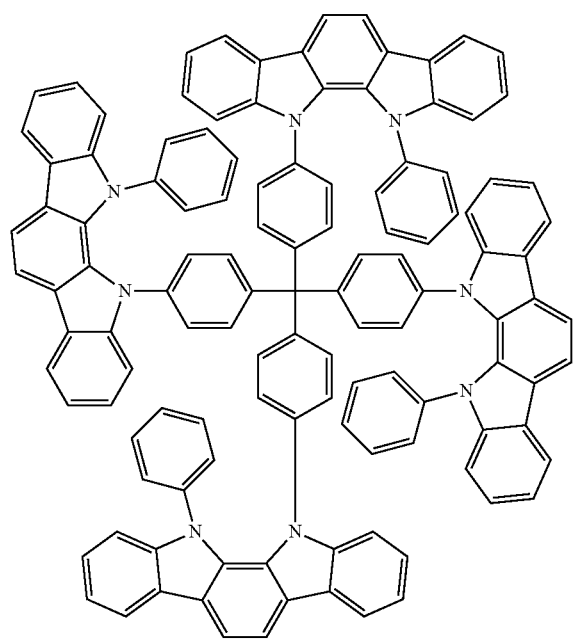
(2-127)
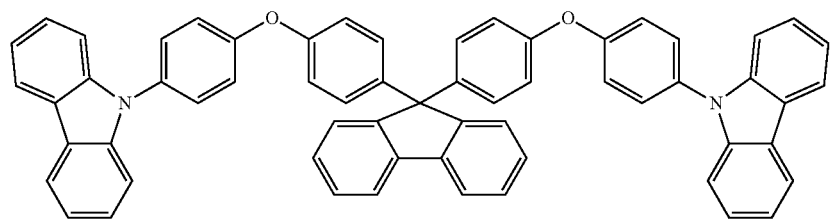

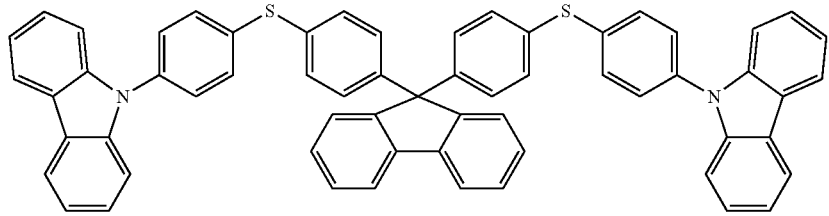
(2-128)
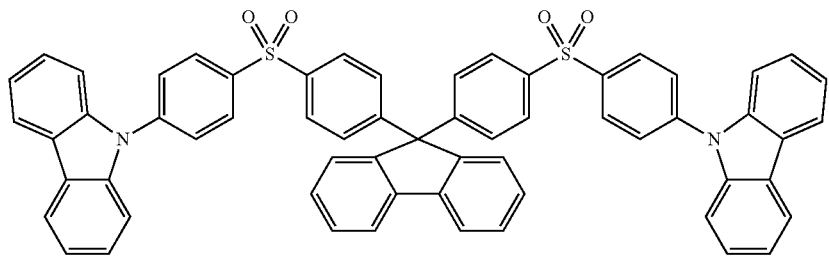
(2-129)
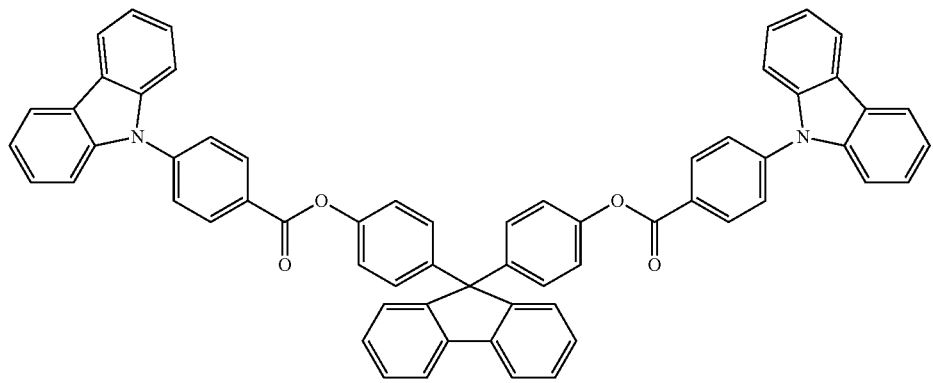
(2-130)
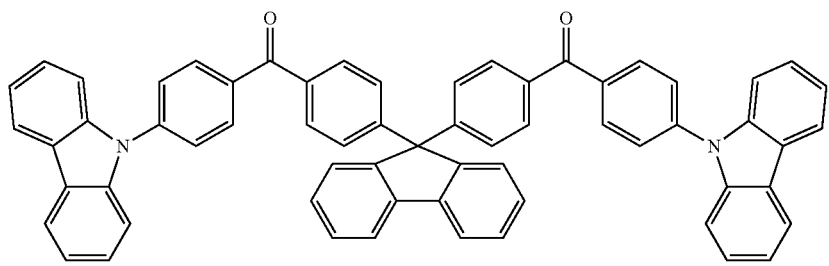
(2-131)
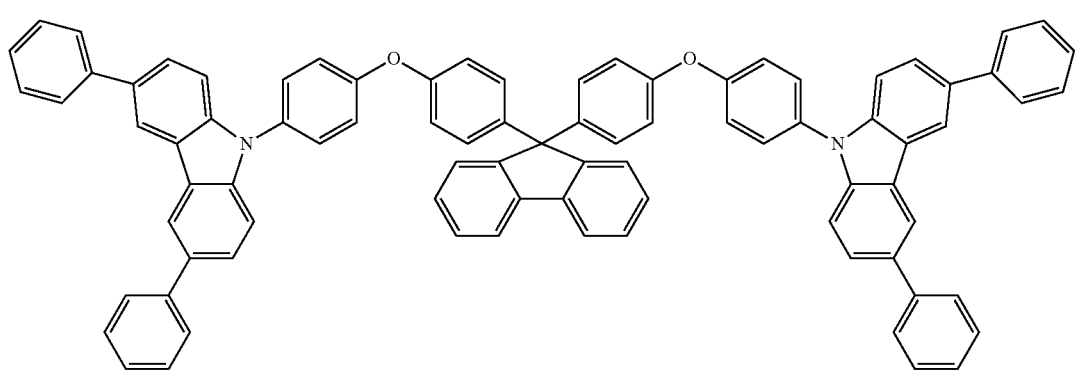
(2-132)

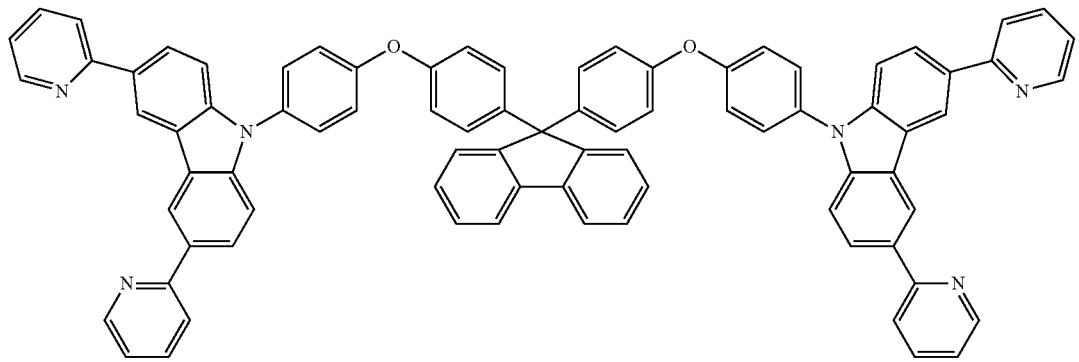
(2-133)
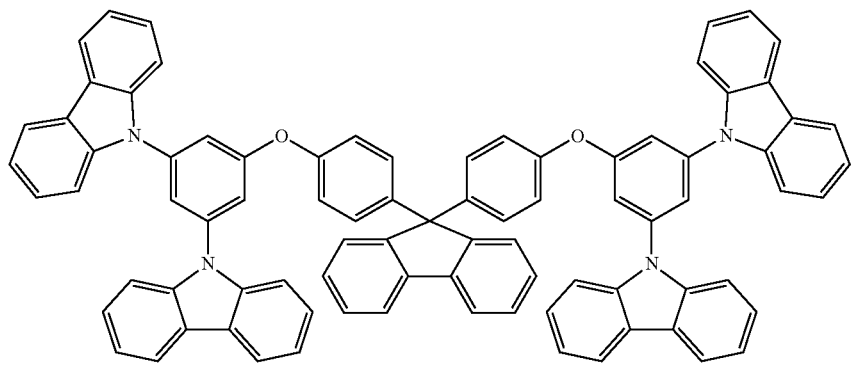
(2-134)
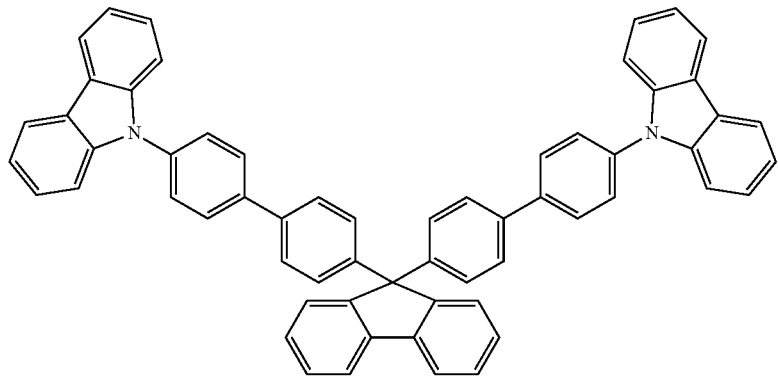
(2-135)
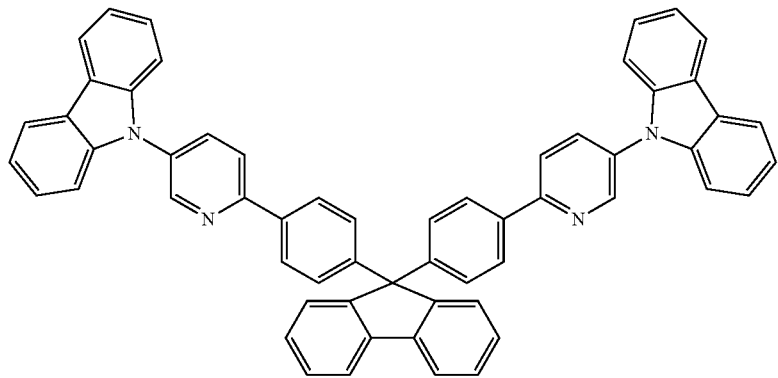
(2-136)

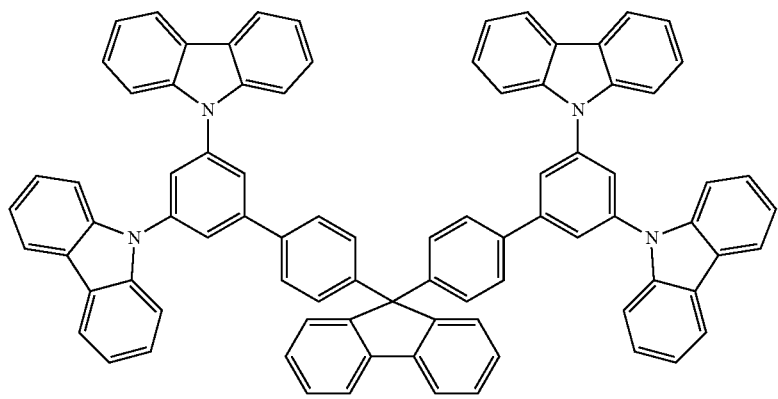
(2-137)
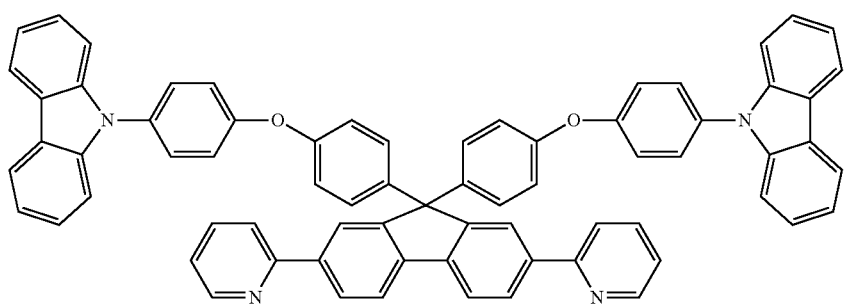
(2-138)
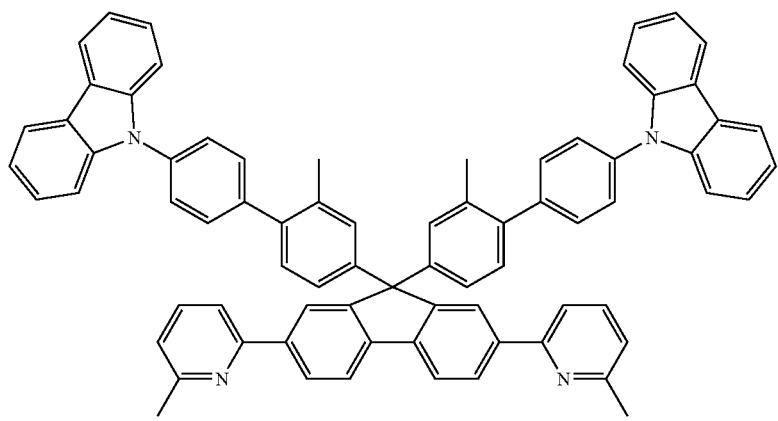
(2-139)
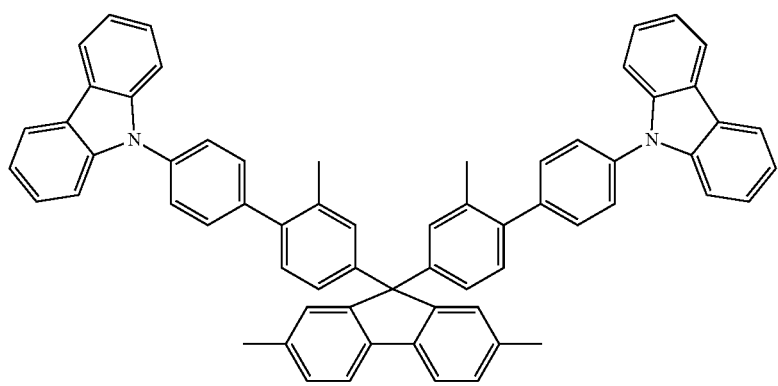
(2-140)

-continued
(2-141)
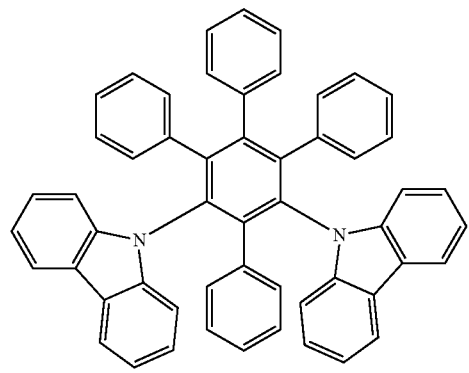
(2-142)
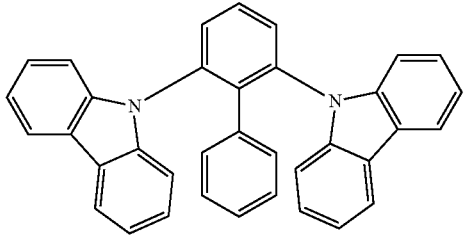
(2-143)
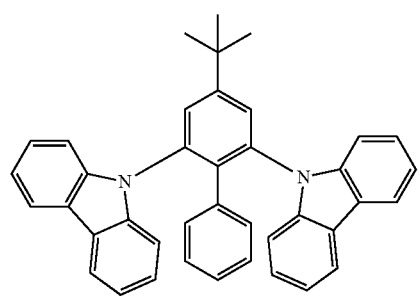
(2-144)
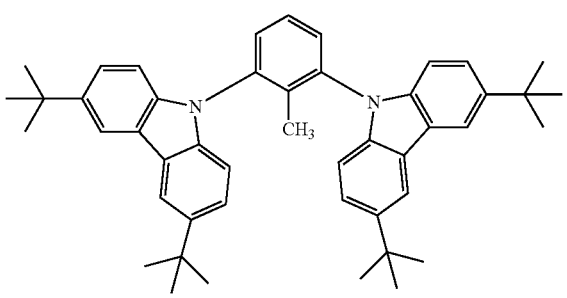
(2-145)
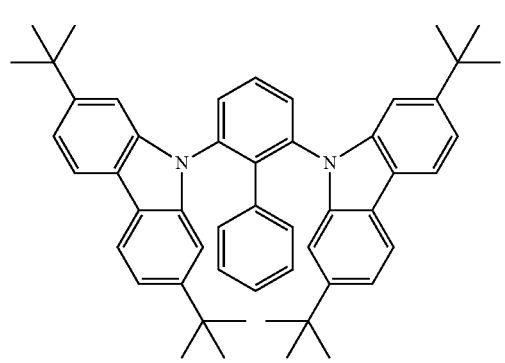
(2-146)
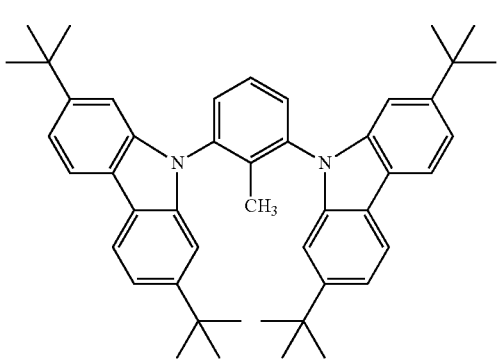
(2-147)
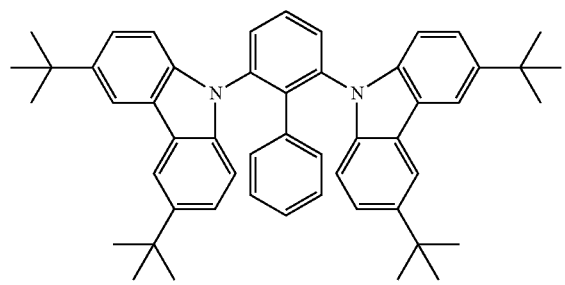
(2-148)
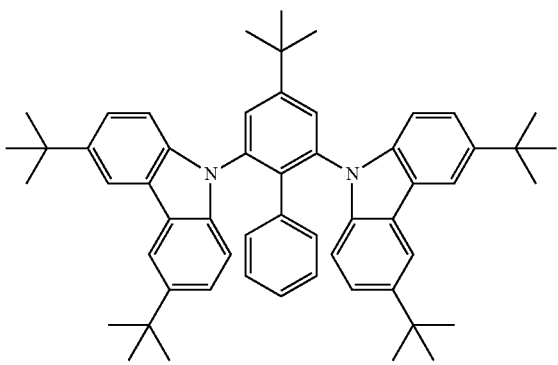

-continued
(2-149)
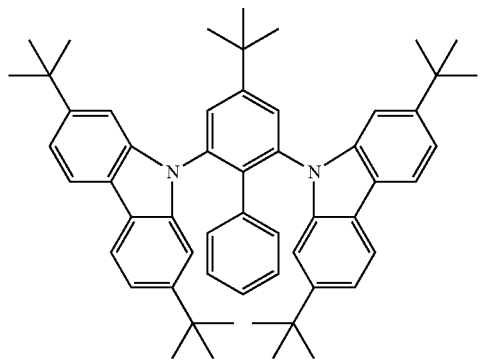
(2-150)
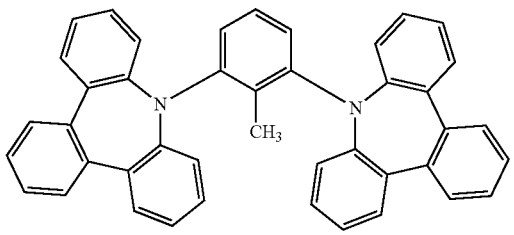
(2-151)
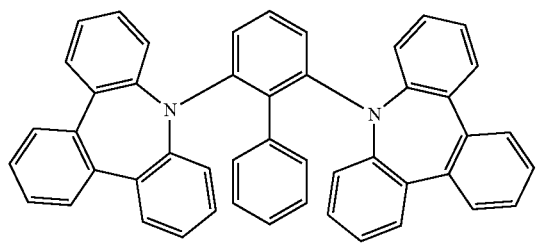
(2-152)
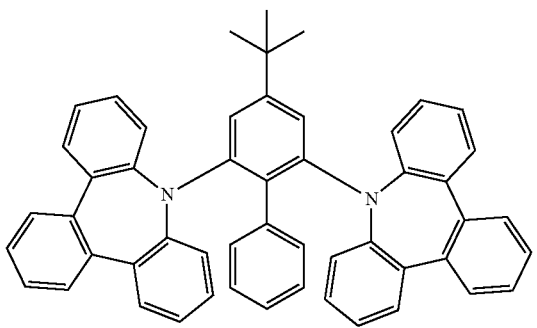
(2-153)
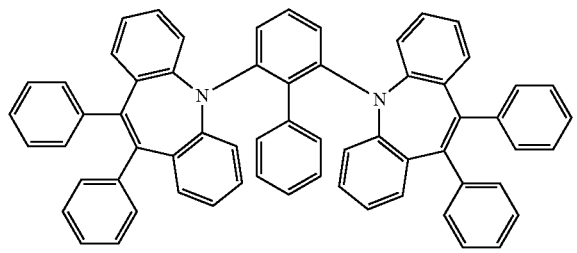
(2-154)
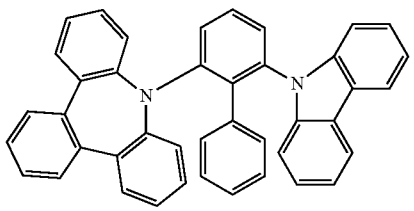
(2-155)
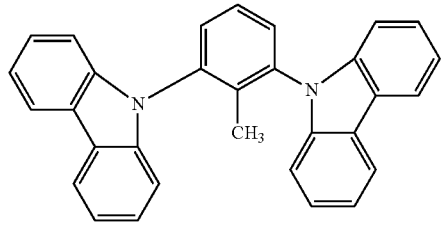
(2-156)
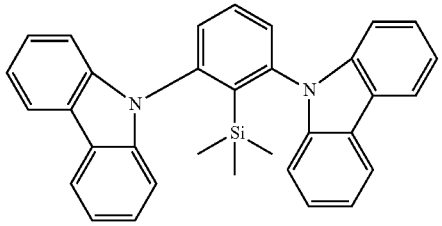
(2-157)
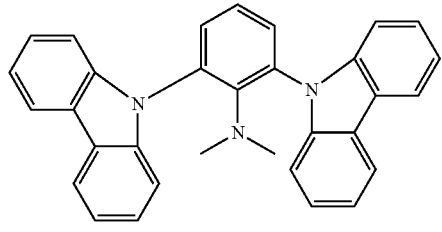
(2-158)
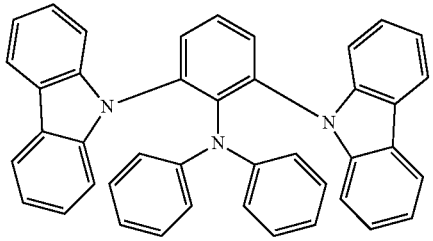

(2-159)
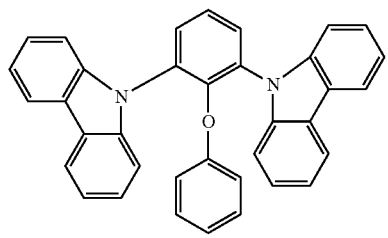
(2-160)
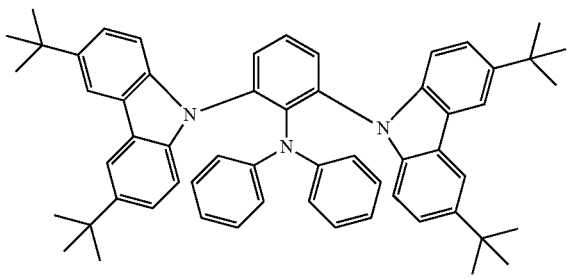
(2-161)
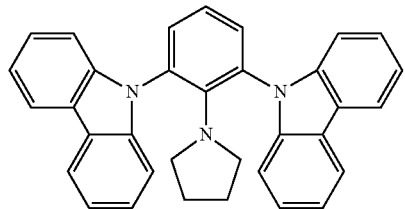
(2-162)
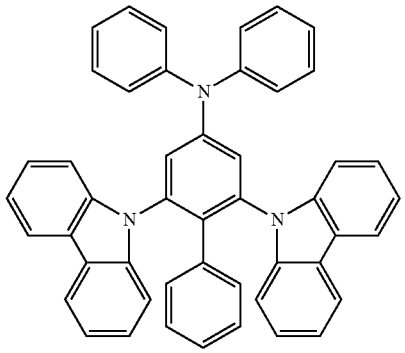
(2-163)
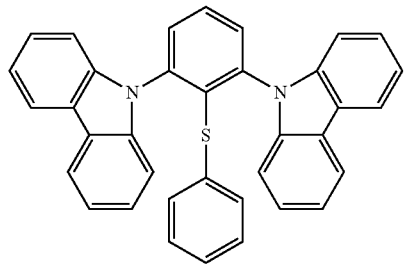
Specific examples of the compounds shown in Formula 3 include compounds such as the following Formula 3(1) to Formula 3(45).
(3-1)
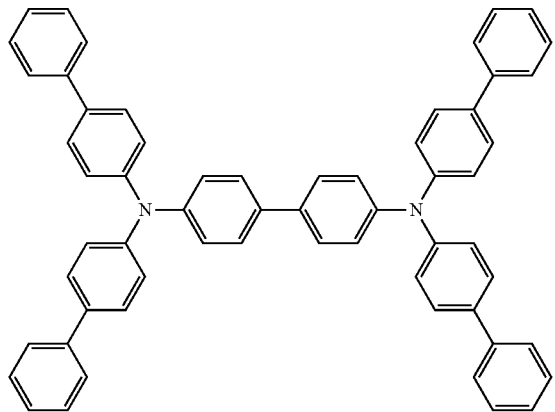
(3-2)
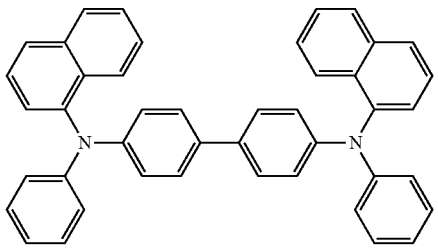

-continued
(3-3)
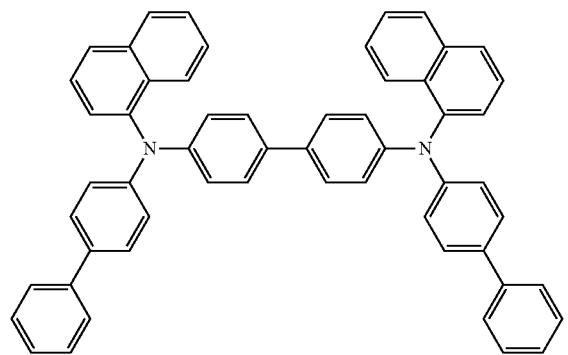
(3-4)
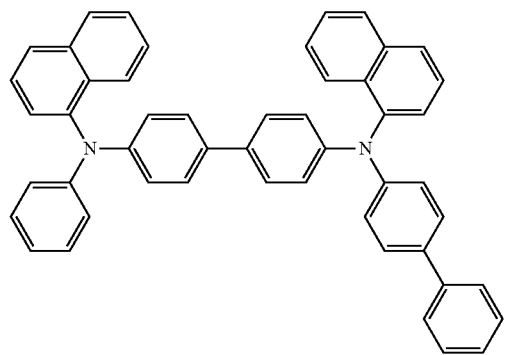
(3-5)
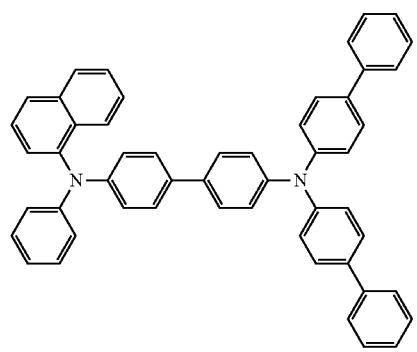
(3-6)
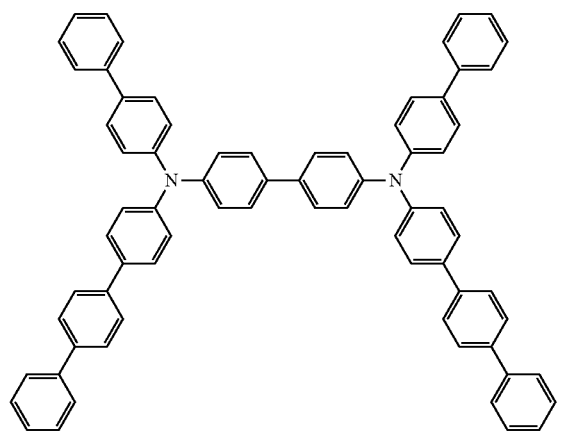
(3-7)
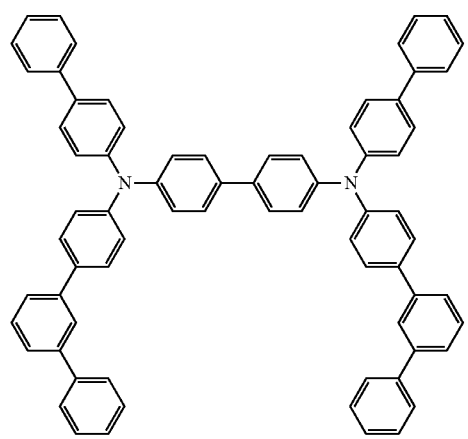
(3-8)
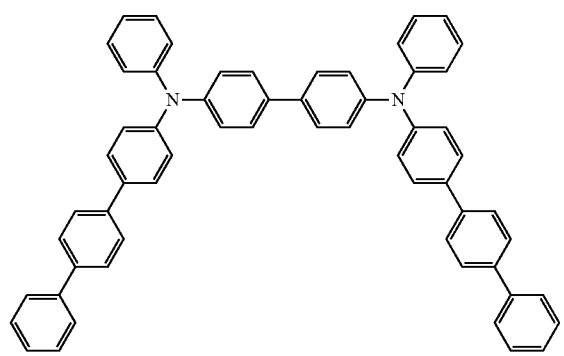

-continued
(3-9)
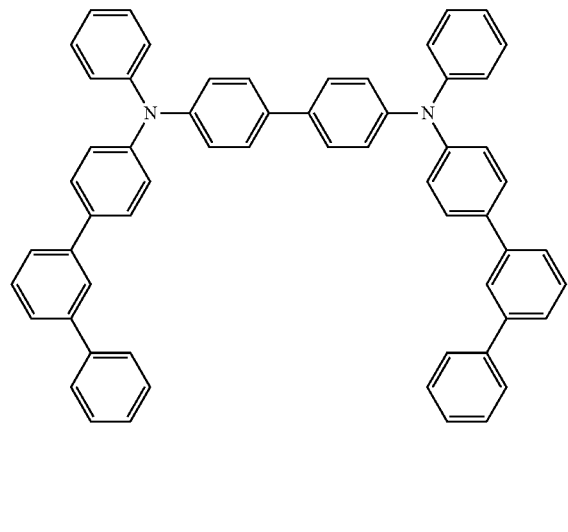
(3-10)
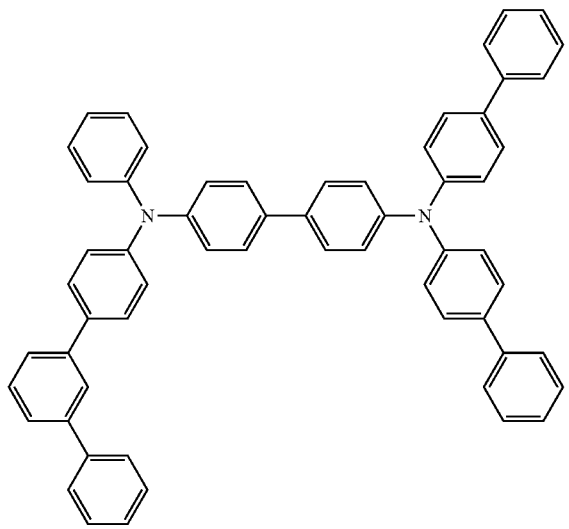
(3-11)
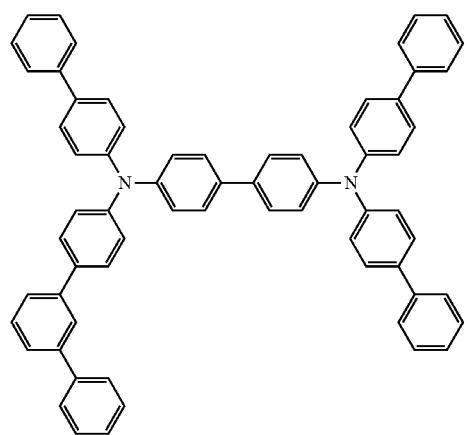
(3-12)
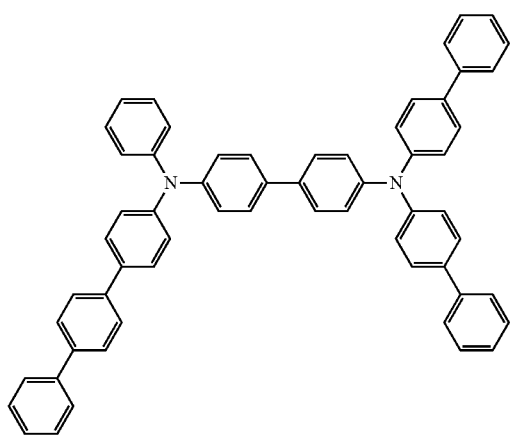
(3-13)
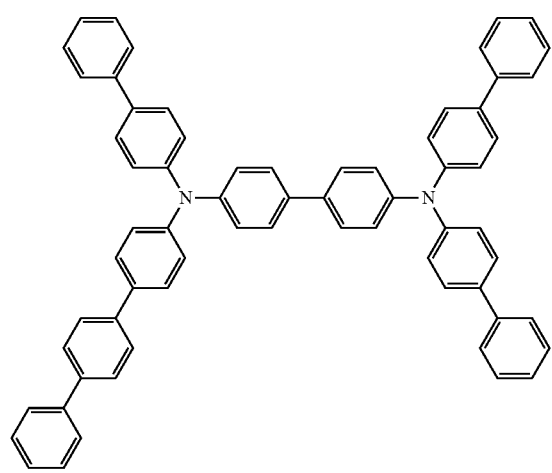
(3-14)
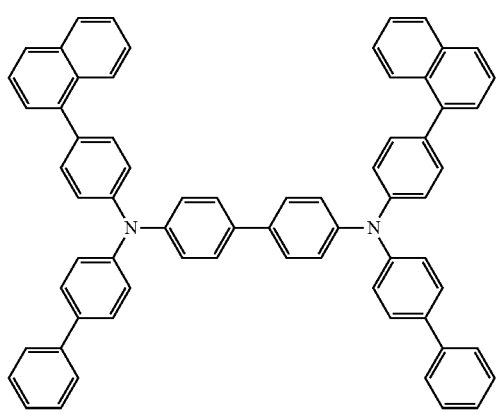

(3-15)
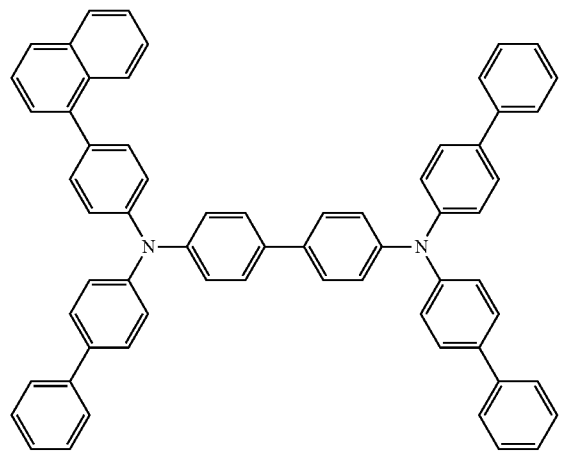
(3-16)
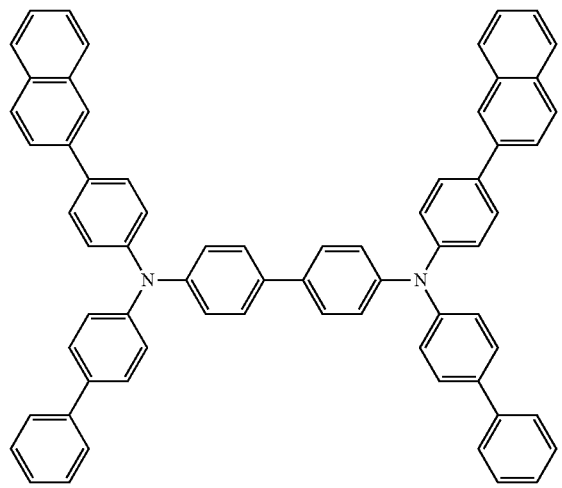
(3-17)
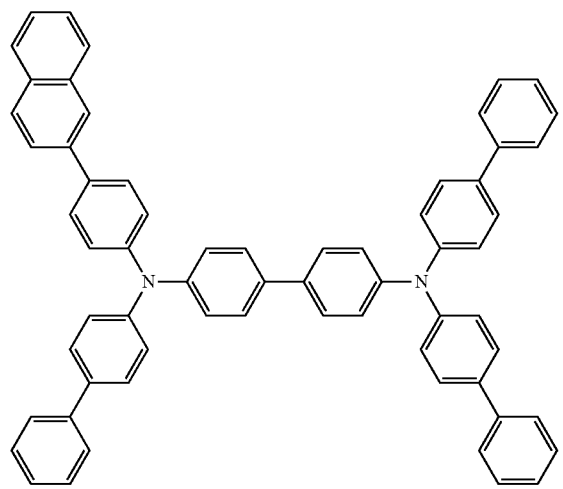
(3-18)
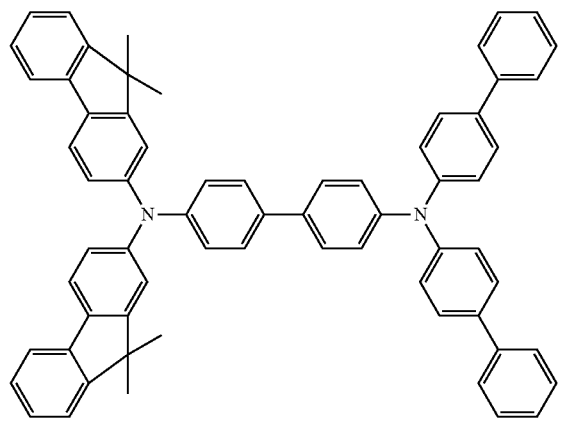
(3-19)
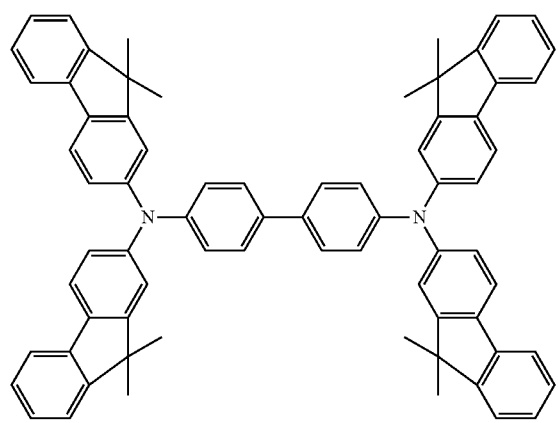
(3-20)
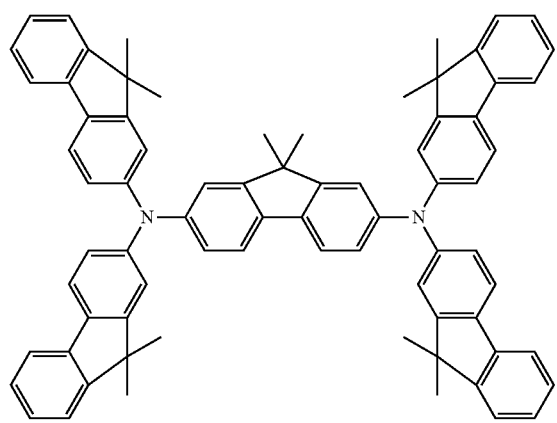

(3-21)
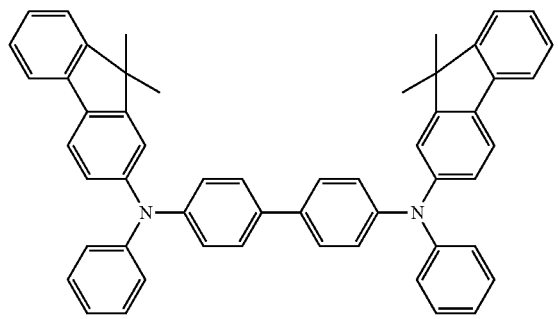
(3-22)
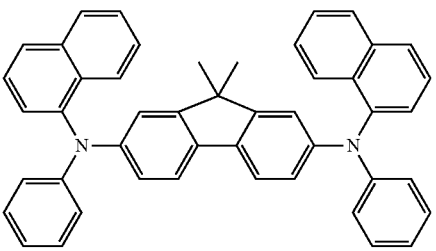
(3-23)
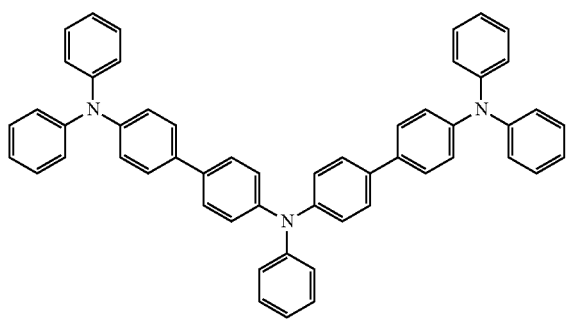
(3-24)
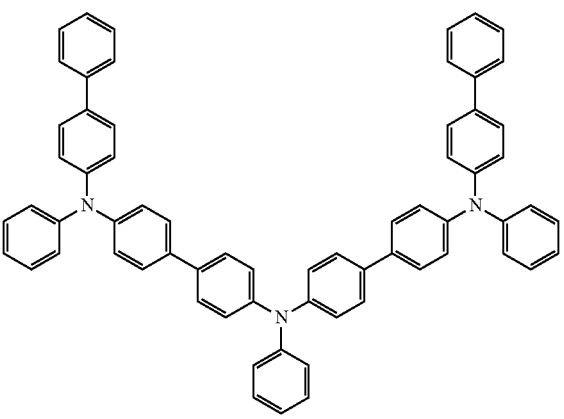
(3-25)
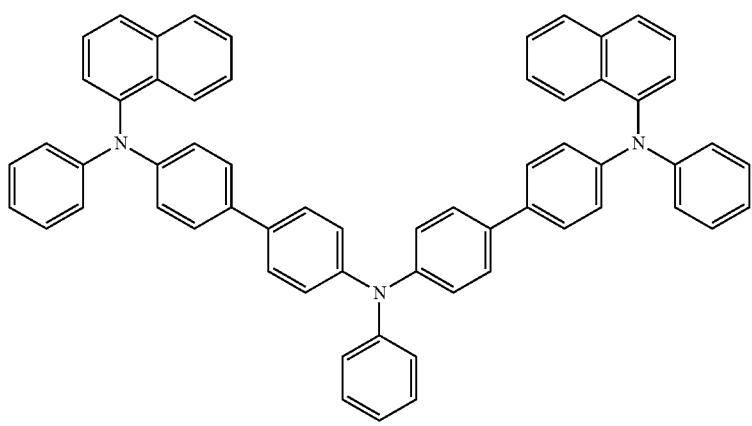

(3-26)
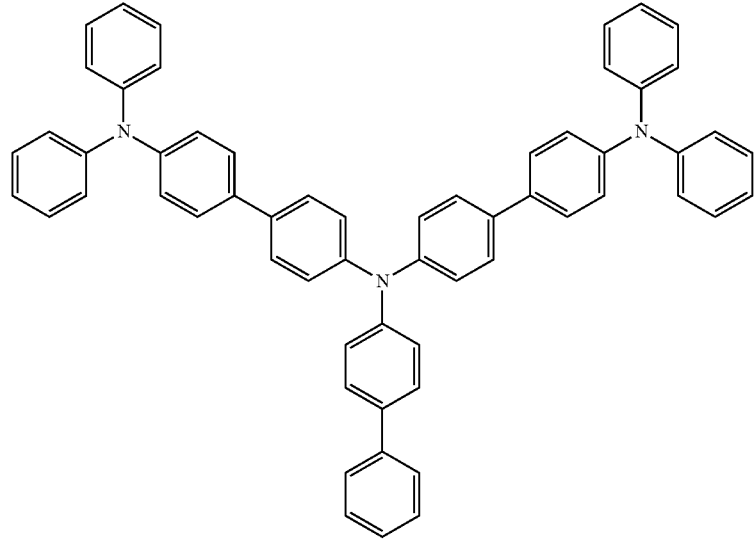
(3-27)
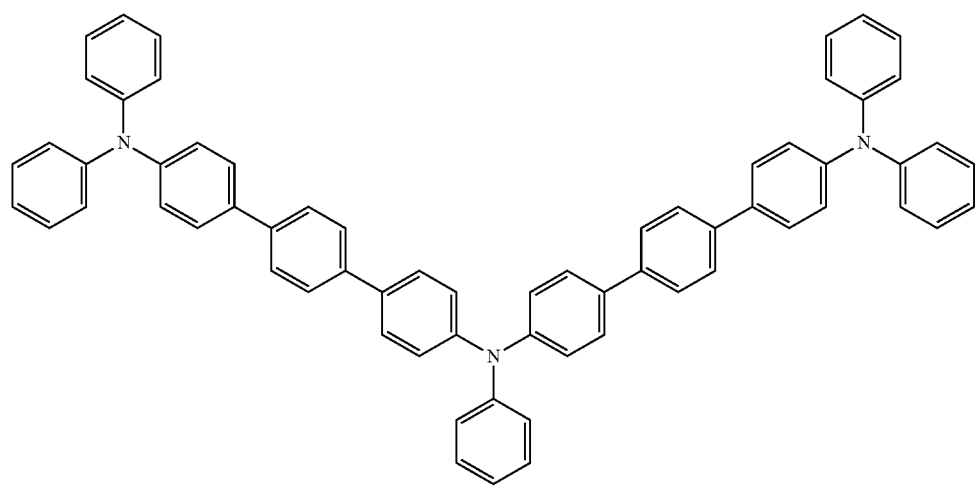
(3-28)
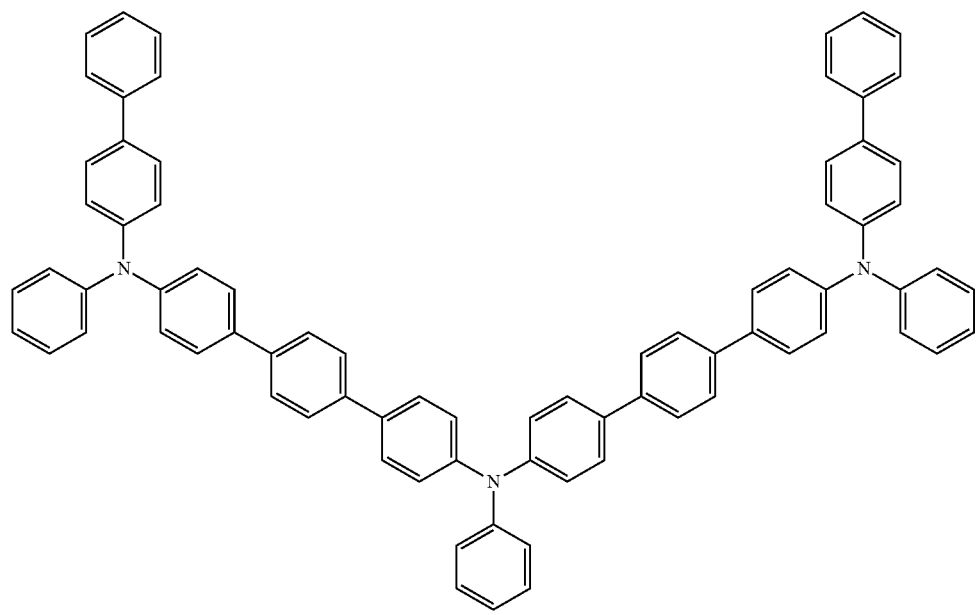

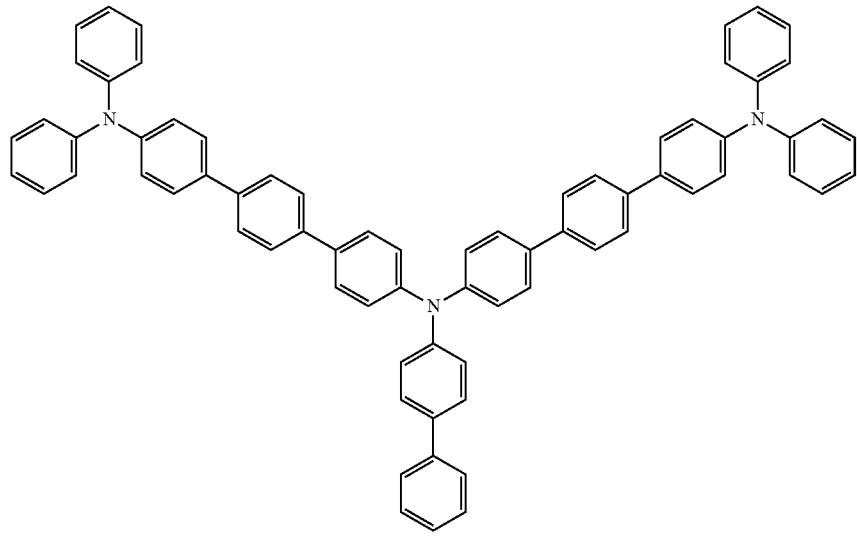
(3-29)
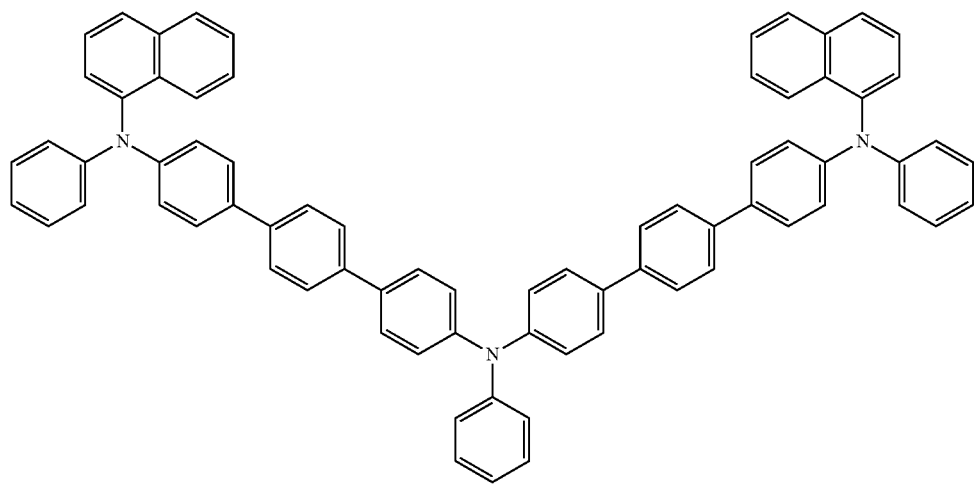
(3-30)
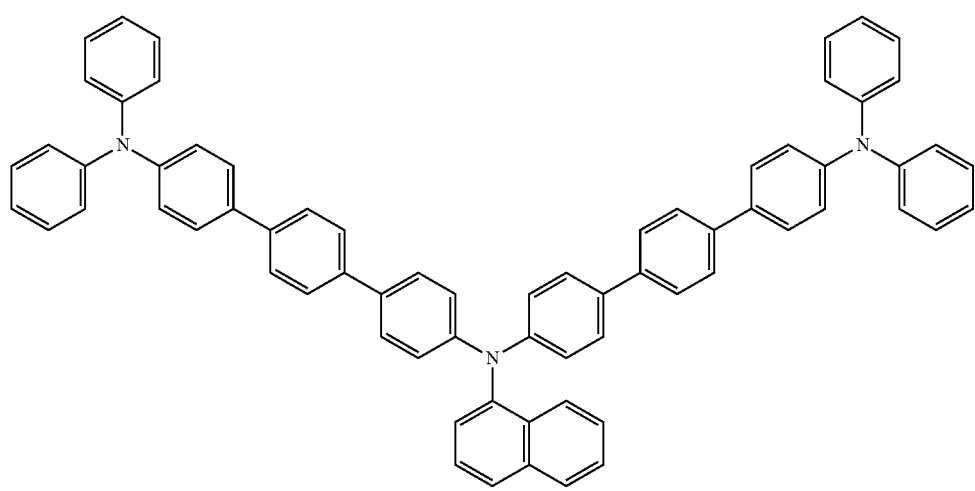
(3-31)

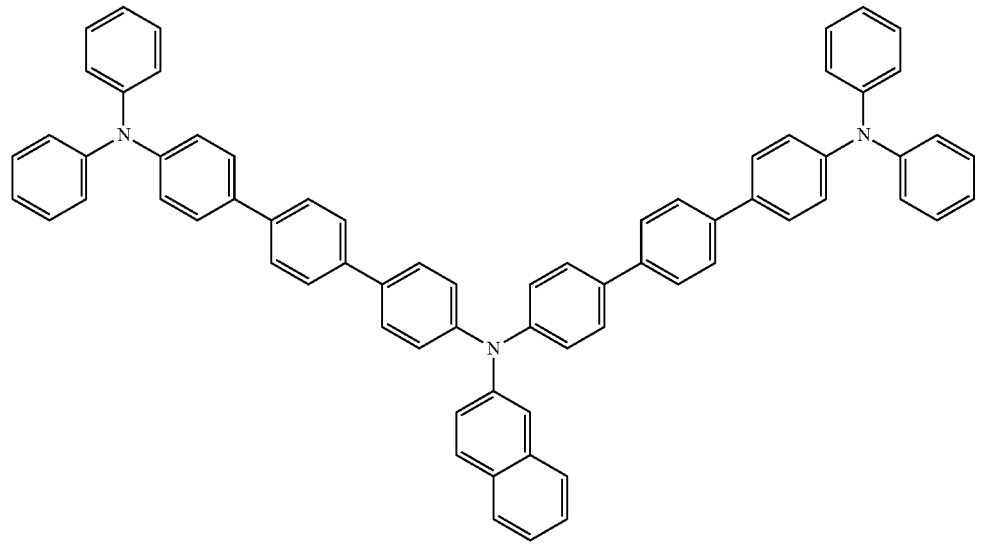
(3-32)
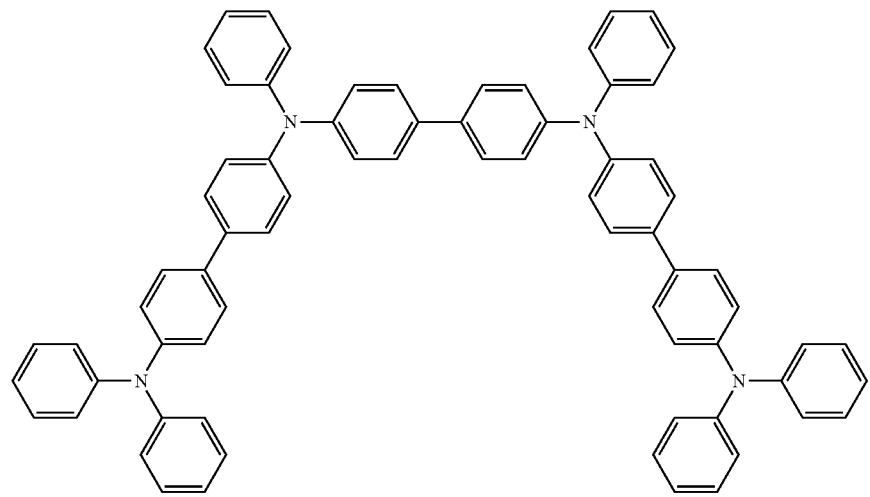
(3-33)
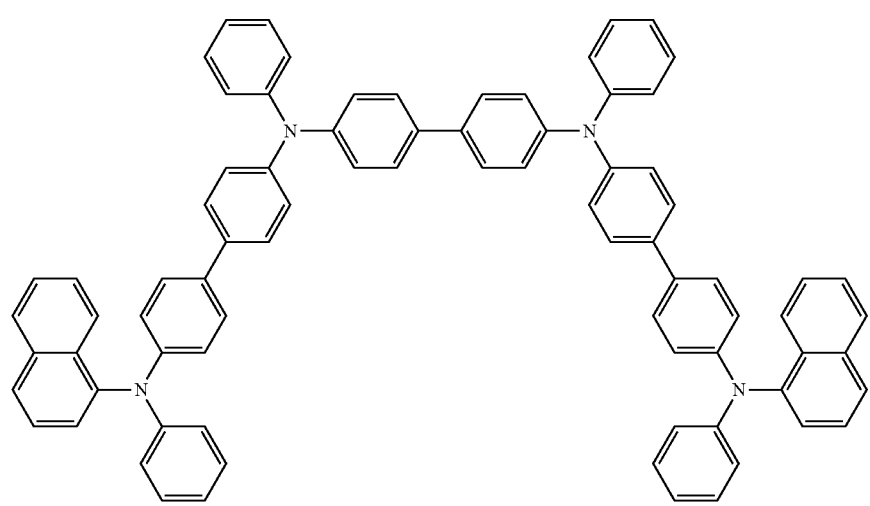
(3-34)

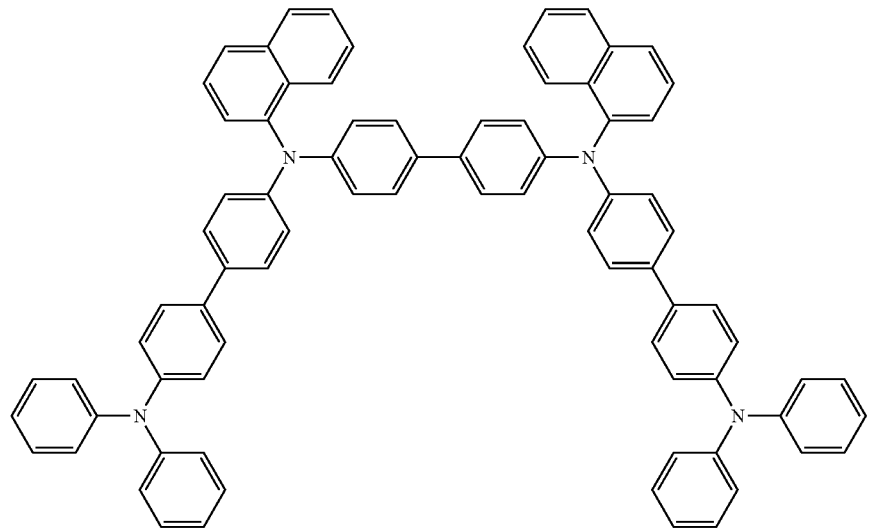
(3-35)
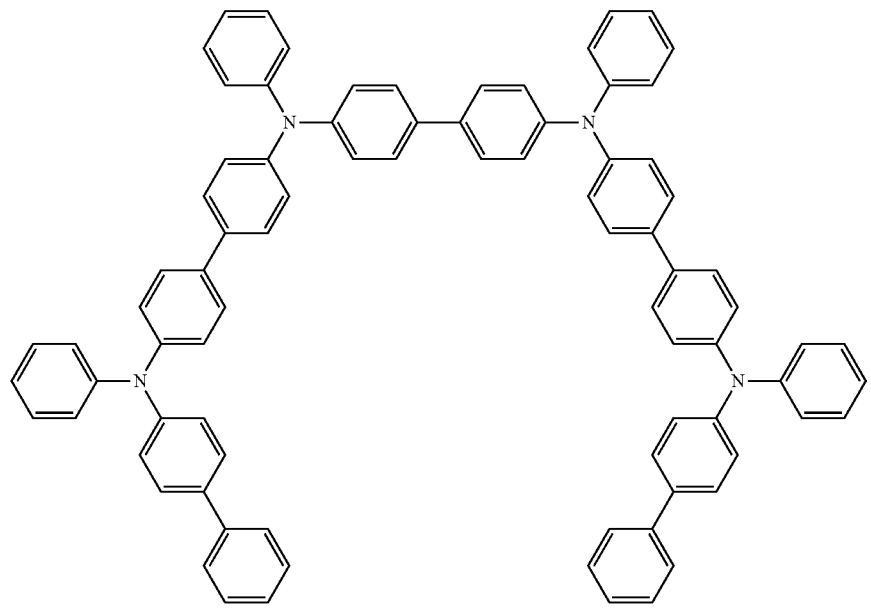
(3-36)
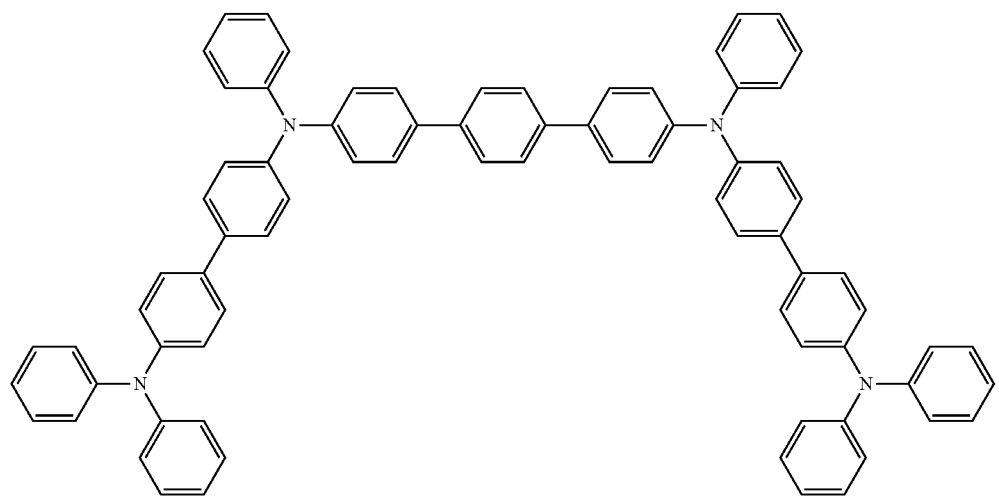
(3-37)

(3-38)
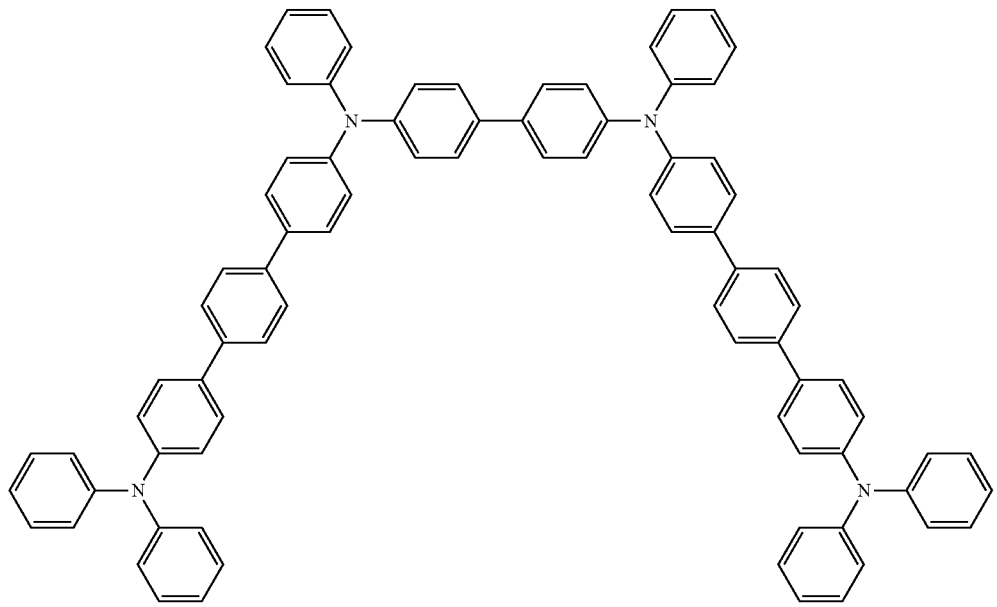
(3-39)
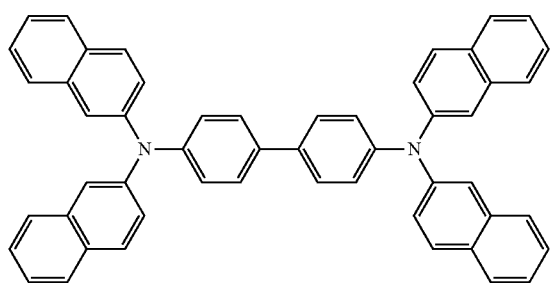
(3-40)
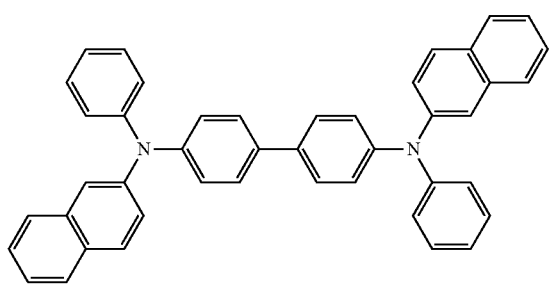
(3-41)
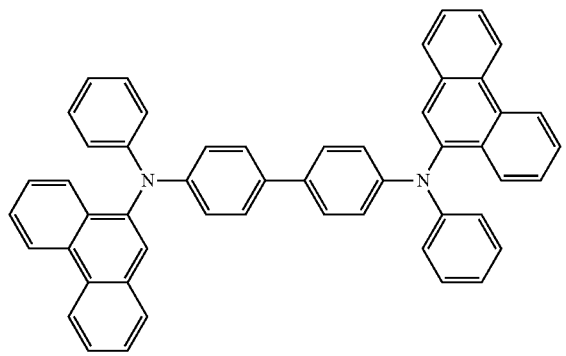
(3-42)
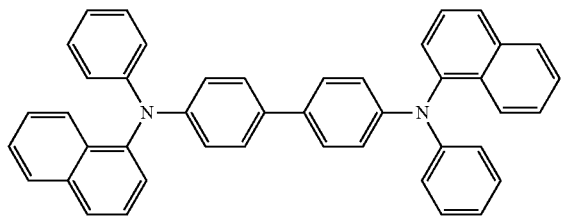
(3-43)
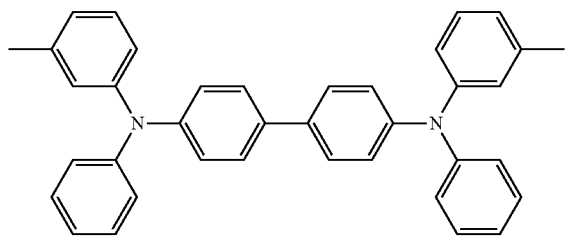
(3-44)
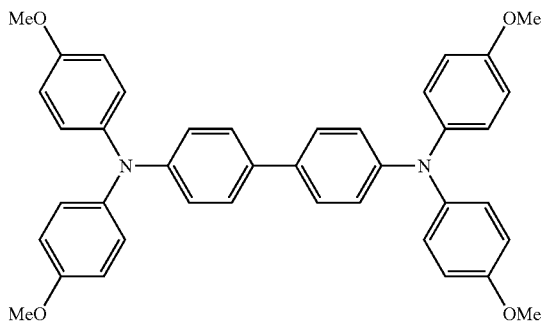

-continued (3-45)

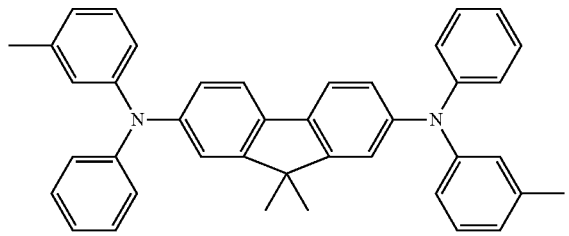

Figure 4D:
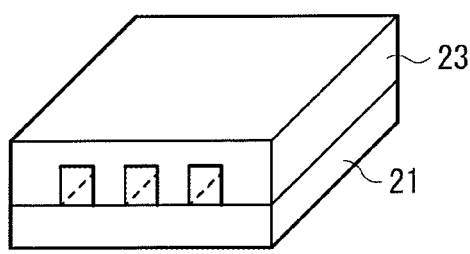

After the transfer layer 22a composed of the reverse printing ink composition 22 is formed on the blanket 21, as illustrated in FIG. 4D, a reverse printing plate 23 is pressed against the transfer layer 22a. A step of bringing the reverse printing plate 23 into contact with the transfer layer 22a (blanket 21) is performed by pressure compression. Pressurization may be performed by pushing with fingers or a roller. However, it is preferable to use a compressed gas pressurization method in which compressed gas is ejected from the rear surface of the blanket 21 and is pushed out, and contact is obtained from the central section to the end section sequentially. By such a method, controlling a pressure is more facilitated than in other methods. In the case where the contact pressure is excessively high, the reverse printing ink composition 22 easily turns into a film, and patterning fineness is lowered. Therefore, the contact pressure is preferably equal to or less than 10 kPa.

Figure 5A:
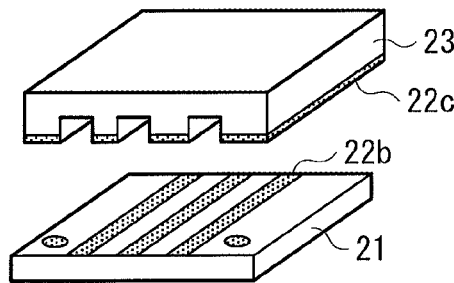
FIGS. 5A to 5D are perspective views illustrating steps following the steps in FIGS. 4A to 4D.

The reverse printing plate 23 is made of an inorganic material such as glass and silicon or a metal such as stainless steel, copper, and nickel. On one surface thereof, concave sections with a pattern corresponding to the red light emitting layer 14CR or the green light emitting layer 14CG are provided. The reverse printing plate 23 is brought into contact with the blanket 21 so that the concave sections of the reverse printing plate 23 are opposed to the transfer layer 22a. Thereby, as illustrated in FIG. 5A, the pattern layer 22b composed of the reverse printing ink composition 22 having the same pattern (pattern corresponding to the red light emitting layer 14CR or the green light emitting layer 14CG) as that of the concave sections of the reverse printing plate 23 is formed on the blanket 21. On the reverse printing plate 23, a non-printing section 22c composed of the reverse printing ink composition 22 having a reverse pattern of the pattern of the concave sections (the same pattern as that of the convex sections) is formed. Contact of the reverse printing plate 23 with the blanket 21 is preferably made within 1 minute after the transfer layer 22a is formed on the blanket 21. If time elapses excessively, the solvent contained in the reverse printing ink composition 22 vaporizes, and the transfer layer 22a turns into a film.

Figure 5B:
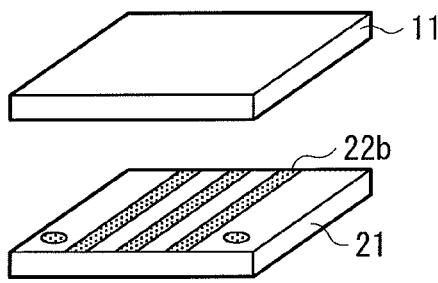
Figure 5C:
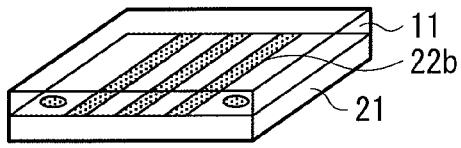
Figure 5D:
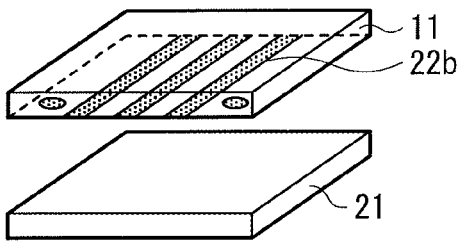

Next, as illustrated in FIG. 5B, the substrate 11 in which the electron hole transfer layer 14B is formed is prepared, and alignment is made so that the pattern layer 22b of the blanket 21 is opposed to the electron hole transport layer 14B. Subsequently, as illustrated in FIG. 5C, the substrate 11 is pressed against the blanket 21 by, for example, the foregoing compressed gas pressurization method. After that, as illustrated in FIG. 5D, the blanket 21 is detached from the substrate 11, and thereby the pattern layer 22b is printed on the substrate 11.

Contact of the blanket 21 with the substrate 11 is preferably made within 30 minutes after the pattern layer 22b is formed. If time elapses excessively, the solvent of the reverse printing ink composition 22 vaporizes, and the pattern layer 22b is less likely to be transferred (detached) from the blanket 21. The pattern layer 22b on the substrate 11 is heated, the solvent is totally removed, and thereby the red light emitting layer 14CR (the green light emitting layer 14CG) is formed.

[Step of Forming Blue Light Emitting Layer 14CB]

After the red light emitting layer 14CR and the green light emitting layer 14CG are formed, the blue light emitting layer 14CB is formed on the whole surface of the red light emitting layer 14CR, the green light emitting layer 14CG, and the electron hole transport layer 14B by an evaporation method (step S106).

In the blue light emitting layer 14CB, if being applied with an electric field, electron-hole recombination is initiated, and light is generated. The blue light emitting layer 14CB is obtained by, for example, doping an anthracene compound as a host material with a blue or green fluorescent dye guest material, and emits blue or green light.

[Step of Forming Electron Transport Layer 14D, Electron Injection Layer 14E, and Upper Electrode 15]

After the blue light emitting layer 14CB is formed, an electron transport layer 14D, an electron injection layer 14E, and the upper electrode 15 are formed over the whole surface of the blue light emitting layer 14CB in this order by an evaporation method (steps S107, S108, and S109).

The electron transport layer 14D is intended to improve electron transport efficiency into the red light emitting layer 14CR, the green light emitting layer 14CG, and the blue light emitting layer 14CB. Examples of the electron transport layer 14D include quinoline, perylene, phenanthroline, bisstyryl, pyrazine, triazole, oxazole, fullerene, oxadiazole, fluorenone, and a derivative or a metal complex thereof. Specific examples thereof include tris(8-hydroxyquinoline) aluminum (abbreviated to Alq3), anthracene, naphthalene, phenanthrene, pyrene, perylene, butadiene, coumarin, $C_{60}$, acridine, stilbene, 1,10-phenanthroline, and a derivative or a metal complex thereof.

The electron injection layer 14E is intended to improve electron injection efficiency. As a material of the electron injection layer 14E, for example, lithium oxide ($Li_2O$) as an oxide of lithium (Li), cesium carbonate ($Cs_2CO_3$) as a composite oxide of cesium (Cs), or a mixture thereof may be used. Further, as a material of the electron injection layer 14E, for example, an alkali earth metal such as calcium (Ca) and barium (Ba), an alkali metal such as lithium and cesium, a metal with small work function such as indium (In) and magnesium (Mg), or an oxide, a composite oxide, a fluoride, or the like of these metals may be used as a simple body, a mixture, or an alloy.

The upper electrode 15 is formed as unpatterned film over the substrate 11 in a state of being insulated from the lower electrode 12 by the dividing wall 13 and the organic layer 14. The upper electrode 15 functions as an electrode common to the red organic EL device 10R, the green organic EL device 10G, and the blue organic EL device 10B. The upper electrode 15 is formed of a metal conductive film such as aluminum, magnesium, calcium, and sodium (Na). The upper electrode 15 is preferably formed of an alloy of magnesium and silver (Mg—Ag alloy) that has favorable conductivity in the case of being used as a thin film and that has small light absorption. Though the ratio between magnesium and silver in the Mg—Ag alloy is not particularly limited, the ratio is preferably in the range from Mg:Ag=20:1 to Mg:Ag=1:1 (film thickness ratio) both inclusive. As a material of the upper electrode 15, an alloy of aluminum and lithium (Al—Li alloy) may be used.

The upper electrode 15 may be formed of a mixed layer containing an organic light emitting material such as an aluminum quinolin complex, a styryl amine derivative, and phthalocyanine derivative. In this case, as a third layer, a light transmissive layer made of Mg—Ag alloy or the like may be further formed.

After the upper electrode 15 is formed, a protective layer 16 made of amorphous silicon nitride having low permeability by, for example, an evaporation method and a CVD method. After the protective layer 16 is formed, finally, a sealing substrate 17 provided with a light shielding film and a color filter (not illustrated) is adhered to the protective layer 16 with an adhesion layer (not illustrated) in between. Accordingly, the display unit 1 illustrated in FIG. 2 is completed.

As described above, in this embodiment, the reverse printing ink composition 22 contains the straight-chain carbon hydride and the low-molecular material. Therefore, in coating the blanket 21 with the reverse printing ink composition 22, coating unevenness is less likely to be generated, and it is allowed to be suppressed that the reverse printing ink composition 22 (the transfer layer 22a and the pattern layer 22b) turns from turning into a film on the blanket 21. Accordingly, the red light emitting layer 14CR and the green light emitting layer 14CG with a uniform film thickness and high-definition patterning are allowed to be printed on the substrate 11.

EXAMPLES

A description will be given of specific examples of the present technology.

Example 1

TFB (poly(9,9'-dioctylfluorene-co-N-(4-butylphenyl) diphenylamine) shown in Formula 4 as a polymer material was dissolved at a concentration of 0.3 wt % in a solvent to prepare the reverse printing ink composition 22. The blanket 21 was coated with the reverse printing ink composition 22 by a spin coating method to form the transfer layer 22a. The results obtained by visually checking coating unevenness of the transfer layer 22a at this time are illustrated in Table 1. As the blanket 21, STD700 (available from Fujikura rubber) was used. Spin coating was performed under the conditions of 7000 rpm for 5 seconds and slope (after rotation) for 2 seconds.

[Formula 4]

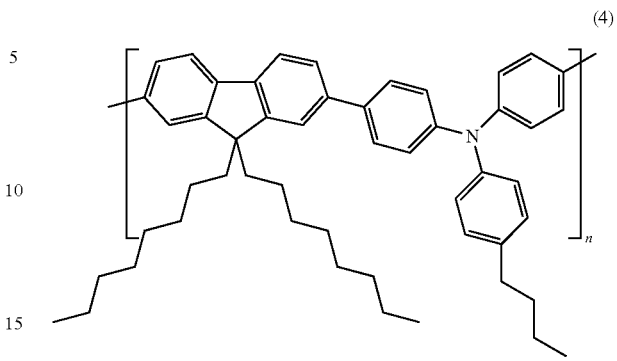

(4)

TABLE 1

| | Solvent (volume ratio) | Coating unevenness |
|---|---|---|
| Example 1-1 | Xylene:octane (1:1) | Not present |
| Example 1-2 | Xylene:octane:CHB (2:3:1) | Not present |
| Example 1-3 | Xylene:octane:CHB (2:2:1) | Not present |
| Example 1-4 | Xylene:hexane:CHB (2:3:1) | Not present |
| Example 1-5 | Xylene:tetradecane:CHB (2:3:1) | Not present |
| Example 1-6 | Xylene | Present |
| Example 1-7 | Xylene:CHB (1:1) | Present |

As can be seen from Table 1, coating unevenness was observed in the solvents containing only the aromatic carbon hydrides (Examples 1-6 and 1-7). Meanwhile, coating unevenness was not observed in Examples 1-1, 1-2, and 1-3 containing octane as a straight-chain carbon hydride, in Example 1-4 containing hexane as a straight-chain carbon hydride, and in Example 1-5 containing tetradecane as a straight-chain carbon hydride. That is, in the case where a solvent containing a straight-chain carbon hydride was used, the transfer layer 22a with a uniform film thickness was allowed to be formed.

Example 2

Printing was performed by changing the type and amount of low-molecular materials of the reverse printing ink composition 22. The results obtained by measuring film thickness unevenness and line resolution of the pattern layer 22b at this time are illustrated in Table 2. Measurement of film thickness unevenness and line resolution were performed as follows.

First, the blanket 21 made of STD700 (available from Fujikura rubber) was coated with xylene, and resultant was swollen for 3 minutes. After that, the resultant was rotated under the conditions of 3000 rpm for 2 seconds and slope (after rotation) for 2 seconds to remove xylene on the surface thereof. Next, a mixture obtained by mixing the polymer material shown in Formula 4 and a low-molecular material shown in Table 2 at each ratio was dissolved at a concentration of 2 wt % in a solvent obtained by mixing xylen, octane, and CHB at a ratio of xylene:oxtane:CHB=2:3:1 (volume ratio) to prepare the reverse printing ink composition 22. The blanket 21 was coated with the reverse printing ink composition 22 by a spin coating method under the conditions of 3000 rpm for 2 seconds and slope (after rotation) for 2 seconds to form the transfer layer 22a. Subsequently, the reverse printing plate 23 was pressed against the transfer layer 22a to form the pattern layer 22b on the blanket 21. As the reverse printing plate 23, a plate provided with concave sections with line and space (line width) from 10 to 100 μm both inclusive was used. Finally, the pattern layer 22b on the blanket 21 was transferred to the substrate 11 made of glass and the film thickness unevenness was checked visually. Out of the reverse printing plates 23 with line and space from 10 to 100 μm both inclusive, cases with successful patterning are illustrated as line resolution in Table 2.

TABLE 2

|  | Polymer material/ low-molecular material (mixture ratio) | Solvent | Line resolution | Coating unevenness |
|---|---|---|---|---|
| Example 2-1 | Polymer material/ Formula 8 (1:1) | Xylene: octane:CHB (2:3:1) | 10 μm | Not present |
| Example 2-2 | Polymer material/ Formula 2(6) (1:1) |  | 10 μm |  |
| Example 2-3 | Polymer material/ Formula 2(24) (1:1) |  | 10 μm |  |
| Example 2-4 | Polymer material/ Formula 2(39) (1:1) |  | 10 μm |  |
| Example 2-5 | Polymer material/ Formula 3(5) (1:1) |  | 10 μm |  |
| Example 2-6 | Polymer material/ Formula 3(10) (1:1) |  | 10 μm |  |
| Example 2-7 | Polymer material/ Formula 1(29) (1:1) |  | 10 μm |  |
| Example 2-8 | Polymer material/ Formula 1(34) (1:1) |  | 10 μm |  |
| Example 2-9 | Polymer material/ Formula 2(38) (1:1) |  | 10 μm |  |
| Example 2-10 | Polymer material/ Formula 2(38) (1:2) |  | 10 μm |  |
| Example 2-11 | Polymer material/ Formula 2(38) (2:1) |  | 15 μm |  |
| Example 2-12 | Polymer material/— |  | 100 μm |  |

As can be seen from Table 2, line resolution was 100 μm in Example 2-12 not containing a low-molecular material in the reverse printing ink composition 22. Meanwhile, in Examples 2-1 to 2-9 respectively containing Formulas 8, 2(6), 2(24), 2(39), 3(5), 3(10), 1(29), 1(34), and 2(38) as a low-molecular material with the same amount as that of the polymer material, line resolution was improved to 10 μm. That is, in the case where the reverse printing ink composition 22 contained a low-molecular material, high-definition patterning was allowed to be performed. The content of the low-molecular material may be higher than that of the polymer material (polymer material:low-molecular material=1:2, Example 2-10). There is a tendency that, as the ratio of the low-molecular material is decreased, line resolution is decreased (Example 2-11). Therefore, the mixture ratio (weight ratio) between the polymer material and the low-molecular material is preferably from 2:1 to 1:2 both inclusive. In Examples 2-1 to 2-12, since octane was contained as a straight-chain carbon hydride, no film thickness unevenness was observed in all cases.

Example 3

The results obtained by measuring film thickness unevenness and line resolution by a procedure similar to that of the foregoing Table 2 by changing the type of aromatic carbon hydride are illustrated in Table 3. In Examples 3-1 to 3-7, a mixture obtained by mixing the polymer material shown in Formula 4 and the low-molecular material shown in Formula 2(38) at a ratio of 1:1 (weight ratio) was dissolved at a concentration of 2 wt % in each solvent.

TABLE 3

|  | Polymer material/ low-molecular material (mixture ratio) | Solvent | Line resolution | Coating unevenness |
|---|---|---|---|---|
| Example 3-1 | Polymer material/ Formula 2(38) (1:1) | Octane:CHB (1:1) | 10 μm | Not present |
| Example 3-2 |  | Xylene: octane:CHB (2:3:1) | 10 μm | Not present |
| Example 3-3 |  | Xylene: octane: mesitylene (2:3:1) | 10 μm | Not present |
| Example 3-4 |  | Xylene: octane:tetralin (2:3:1) | 10 μm | Not present |
| Example 3-5 |  | Xylene: octane:IPB (2:3:1) | 10 μm | Not present |
| Example 3-6 |  | Xylene:octane (1:1) | 30 μm | Not present |
| Example 3-7 |  | Octane |  | Not dissolved |

As can be seen from Example 3-7, since the high molecular material and the low-molecular material were not dissolved in the solvent not containing an aromatic carbon hydride, that is, in the solvent containing only the straight-chain carbon hydride, the transfer layer 22a (pattern layer 22b) was not allowed to be formed. Meanwhile, in the case where an aromatic carbon hydride was contained as in Examples 3-1 to 3-6, the pattern layer 22b was allowed to be formed. Further, in the case where CHB (boiling point: 236 deg C., Example 3-1) having the boiling point higher than that of octane (boiling point: 125 deg C.) was used as an aromatic carbon hydride, patterning was allowed to be made with line and space of 10 μm. In the case where combination of xylene with high solubility and CHB (Example 3-2), mesitylene (boiling point: 165 deg C., Example 3-3), tetralin (boiling point: from 206 to 208 deg C. both inclusive, Example 3-4), or IPB (boiling point: 291 deg C., Example 3-5) having a boiling point higher than that of octane was used, high-definition patterning was also allowed to be made with line and space of 10 μm. It is possible that only xylene is used as an aromatic carbon hydride (boiling point: from 138 to 144 deg C. both inclusive, Example 3-6), line resolution is decreased in that case. Therefore, it is preferable that substance having a boiling point higher than that of xylene be used as an aromatic carbon hydride.

Example 4

The green organic EL device 10G was formed by the method of this embodiment, and the characteristics thereof were examined.

First, as the substrate 11, a glass substrate (25 mm×25 mm) was prepared. On the substrate 11, as the lower electrode 12, a two-layer structure composed of a silver alloy layer made of an Ag—Pd—Cu alloy having a thickness of 120 nm and a transparent conductive film made of ITO having a thickness of 10 nm was formed (step 101).

Next, as the electron hole injection layer 14A, coating was made with ND1501 (polyaniline, available from Nissan Chemical Industries Ltd.) to obtain a thickness of 15 nm by a spin coating method in the air. After that, the resultant was thermally hardened on a hot plate for 30 minutes at 220 deg C. (step S103).

Subsequently, the electron hole injection layer 14A was coated with a polymer (polyvinylcarbazole) shown in Formula 5 as the electron hole transport layer 14B by a spin coating method under nitrogen atmosphere (dew point: −60 deg C., oxygen concentration: 10 ppm) so that the coating thickness became 20 nm. After that, the resultant was thermally hardened on a hot plate for 60 minutes at 180 deg C. under nitrogen atmosphere (dew point: −60 deg C., oxygen concentration: 10 ppm) (step S104).

[Formula 5]

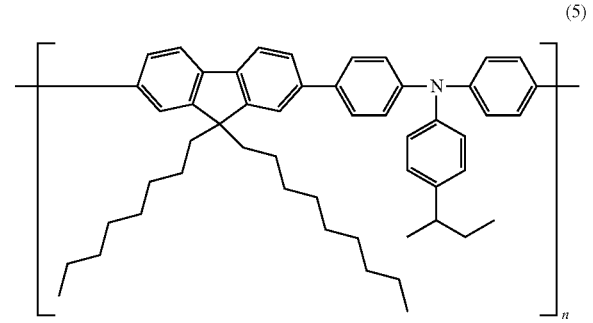

(5)

After the electron hole transport layer 14B was formed, the reverse printing ink composition 22 was prepared. As a solvent of the reverse printing ink composition 22, a solvent containing xylene and CHB as an aromatic carbon hydride and octane as a straight-chain carbon hydride was used. The mixture ratio of xylene, CHB, and octane was xylene:octane:CHB=2:3:1 (volume ratio). As a low-molecular material of the reverse printing ink composition 22, the material shown in Formula 2(38) was used. As a polymer material, a fluorenone polyarylene material having anthracene as a block was used. The mixture ratio between the polymer material and the low-molecular material in the reverse printing ink composition 22 was polymer material:low-molecular material=2:1 (weight ratio), and the mixture was dissolved in the foregoing solvent at a concentration of 2 wt %.

After the reverse printing ink composition 22 was prepared, the green light emitting layer 14CG with a thickness of 80 nm was formed on the electron hole transport layer 14B by a reverse offset printing method. Reverse offset printing of the green light emitting layer 14CG was performed as follows. First, the blanket 21 made of STD700 (available from Fujikura Rubber Ltd.) was coated with xylene, and resultant was swollen for 3 minutes. After that, the resultant was rotated under the conditions of 3000 rpm for 2 seconds and slope (after rotation) for 2 seconds to remove xylene on the surface thereof. Next, the blanket 21 was coated with the previously prepared reverse printing ink composition 22 by a spin coating method in nitrogen atmosphere under the conditions of 3000 rpm for 2 seconds and slope (after rotation) for 2 seconds to form the transfer layer 22a. Subsequently, the reverse printing plate 23 was pressed against the transfer layer 22a to form the pattern layer 22b on the blanket 21. As the reverse printing plate 23, a plate provided with concave sections with line and space of 10 μm was used. After the pattern layer 22b was formed on the blanket 21, the pattern layer 22b was transferred to the foregoing substrate 11 on which the electron hole transport layer 14B was formed. The resultant was heated in a glove box at 130 deg C. for 20 minutes to form the green light emitting layer 14CG.

After the green light emitting layer 14CG was formed, the blue light emitting layer 14CB, the electron transport layer 14D, and the electron injection layer 14E were evaporated with a vacuum evaporation apparatus (steps S106, 107, and 108).

As the blue light emitting layer 14CB, ADN (9,10-di(2-naphthyl)anthracene) shown in Formula 6 and a blue dopant shown in Formula 7 were co-evaporated at a ratio of 95:5 (weight ratio), and the resultant was used. As the electron transport layer 14D, Alq3 shown in Formula 8 having a thickness of 15 nm was used. As the electron injection layer 14E, LiF having a thickness of 0.3 nm was used.

[Formula 6]

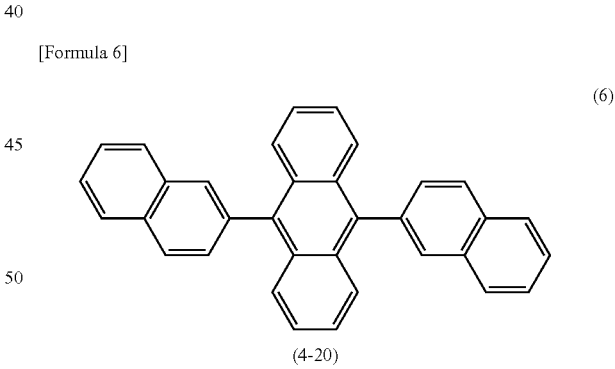

(6)

(4-20)

[Formula 7]

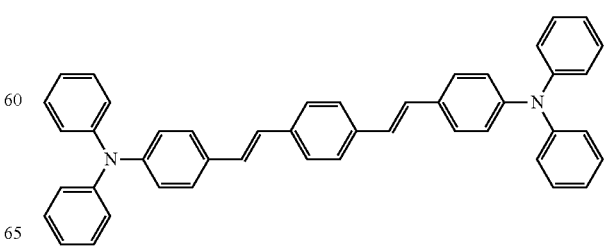

(7)

[Formula 8]

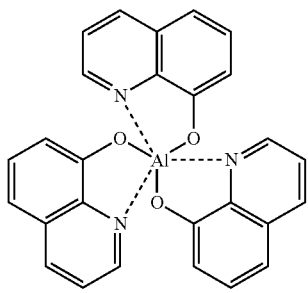

(8)

After the electron injection layer 14E was formed, the upper electrode 15 that had a thickness of 10 nm and was made of Mg—Ag alloy was formed (step S109). Finally, the protective layer 16 made of SiN was formed by a CVD method, and solid sealing was performed by using a transparent resin.

Figure 10:
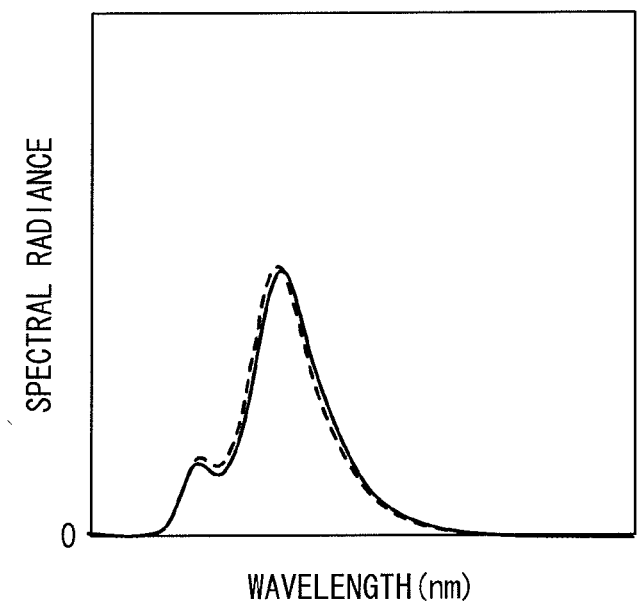
FIG. 10 is a diagram illustrating spectra-radiance of an organic EL device manufactured by the method illustrated in FIG. 1.
Figure 11:
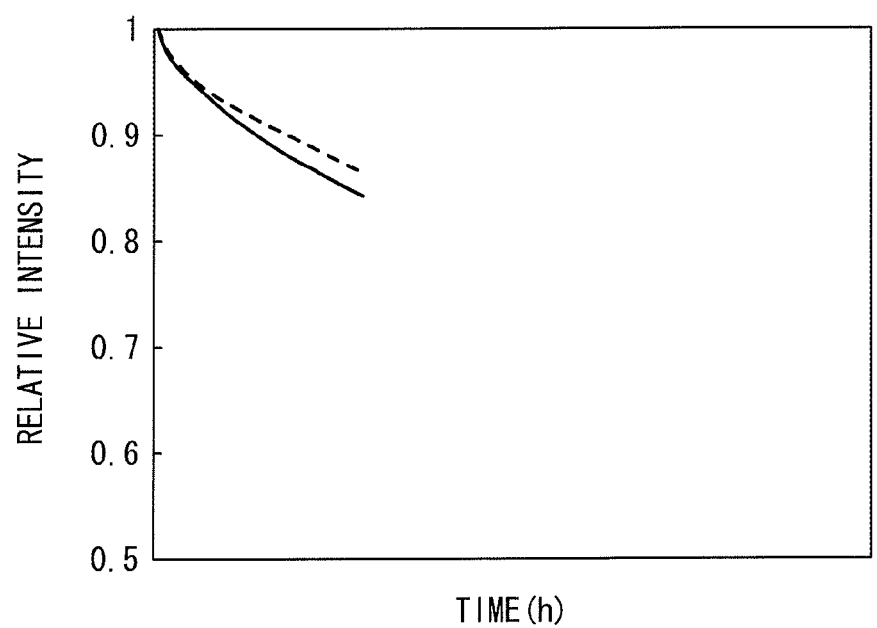
FIG. 11 is a diagram illustrating light-emitting life of the organic EL display device manufactured by the method illustrated in FIG. 1.

FIG. 10 and FIG. 11 illustrate results of measuring luminance and light emitting life of the green organic EL device 10G obtained by the foregoing steps with the use of full lines. By way of comparison, luminance and light emitting life of the green organic EL device 10G in which the unpatterned green light emitting layer 14CG was formed by spin coating are illustrated with the use of dashed lines. According to the results, it was confirmed that, in this embodiment, characteristics equal to those of the green organic EL device formed by spin coating were retained.

While the present technology has been described with reference to the embodiment and the examples, the present technology is not limited to the foregoing embodiment and the like, and various modifications may be made. For example, in the foregoing embodiment and the like, the example in which the red light emitting layer 14CR or the green light emitting layer 14CG is formed by using the reverse printing ink composition 22 has been described. However, light emitting layers other than the red light emitting layer 14CR and the green light emitting layer 14CG or other organic layer 14 such as the electron hole injection layer 14A and the electron hole transport layer 14B may be formed by patterning. In particular, if the electron hole injection layer 14A is formed by patterning, leak current is allowed to be suppressed.

Further, FIG. 2 exemplifies the display unit 1 in which the red organic EL device 10R, the green organic EL device 10G, and the blue organic EL device 10B are arranged. However, the present technology is allowed to be applied to a case of printing light emitting layers of display units having arrangement such as an arrangement of RGBY having a yellow organic EL device (Y), an arrangement of RGBW having a white organic EL device (W), and an arrangement of YB.

Further, for example, the material, the thickness, the film-forming method, the film-forming conditions, and the like of each layer are not limited to those explained in the foregoing embodiment, and other material, other thickness, other film-forming method, and other film-forming conditions may be adopted.

Further, in the foregoing embodiment, the description has been specifically given of the structures of the red organic EL device 10R, the green organic EL device 10G, and the blue organic EL device 10B. However, it is not always necessary to provide all of the layers, and other layer may be further provided.

It is possible to achieve at least the following configurations from the above-described exemplary embodiments and the modifications of the disclosure.

(1) A reverse printing ink composition comprising:
a solvent containing an aromatic carbon hydride and a straight-chain carbon hydride and
a low-molecular material.
(2) The reverse printing ink composition according to (1), wherein a molecular weight of the low-molecular material is equal to or less than 15000.
(3) The reverse printing ink composition according to (1) or (2), wherein the low-molecular material is a compound expressed by Formula 1,

[Formula 1]

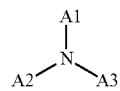

(1)

where A1 to A3 each are an aromatic carbon hydride group, a heterocyclic group, or a derivative thereof.
(4) The reverse printing ink composition according to (1) or (2), wherein the low-molecular material is a compound expressed by Formula 2, where the compounds included in Formula 1 are excluded,

[Formula 2]

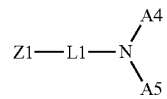

(2)

where Z1 is a nitrogen-containing carbon hydride group or a derivative thereof,
L1 is a group obtained by binding 1 to 4 bivalent aromatic ring groups to each other, and specifically, a bivalent group obtained by linking 2 to 4 aromatic rings to each other or a derivative thereof,
A4 and A5 are an aromatic carbon hydride group or a derivative thereof, and
A4 and A5 are allowed to form a ring structure by being bound to each other.
(5) The reverse printing ink composition according to (1) or (2), wherein the low-molecular material is a compound expressed by Formula 3, where the compounds included in Formula 1 and Formula 2 are excluded,

[Formula 3]

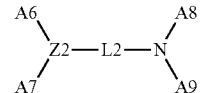

(3)

where Z2 is a nitrogen-containing carbon hydride group or a derivative thereof,
L2 is a group obtained by binding 2 to 6 bivalent aromatic ring groups to each other, and specifically, a bivalent group obtained by linking 2 to 6 aromatic rings to each other or a derivative thereof and A6 to A9 each are obtained by linking 1 to 10 aromatic carbon hydride groups, heterocyclic groups, and derivatives thereof.

(6) The reverse printing ink composition according to any one of (1) to (5), wherein a boiling point of the aromatic carbon hydride is higher than a boiling point of xylene.

(7) The reverse printing ink composition according to any one of (1) to (6), wherein a contact angle of the straight-chain carbon hydride to a blanket is smaller than a contact angle of the aromatic carbon hydride to the blanket.

(8) The reverse printing ink composition according to any one of (1) to (7), wherein the straight-chain carbon hydride is octane.

(9) The reverse printing ink composition according to any one of (1) to (8), wherein the aromatic carbon hydride is xylene and cyclohexylbenzene.

(10) A printing method comprising:

forming a transfer layer by coating a blanket with a reverse printing ink composition in which a low-molecular material is contained in a solvent containing a straight-chain carbon hydride and an aromatic carbon hydride;

forming a pattern layer on the blanket by pressing a reverse printing plate having a concave section with a given pattern against the transfer layer; and transferring the pattern layer to a substrate to be printed.

(11) A method of manufacturing a display unit, the method comprising:

forming a display device on a substrate, wherein the forming of the display device includes forming a transfer layer by coating a blanket with a reverse printing ink composition in which a low-molecular material is contained in a solvent containing a straight-chain carbon hydride and an aromatic carbon hydride, forming a pattern layer on the blanket by pressing a reverse printing plate having a concave section with a given pattern against the transfer layer, and transferring the pattern layer to a substrate to be printed.

The present disclosure contains subject matter related to that disclosed in Japanese Priority Patent Application JP 2011-076515 filed in the Japanese Patent Office on Mar. 30, 2011, the entire contents of which is hereby incorporated by reference.

It should be understood by those skilled in the art that various modifications, combinations, sub-combinations, and alternations may occur depending on design requirements and other factors insofar as they are within the scope of the appended claims or the equivalents thereof.

What is claimed is:

1. A reverse printing ink composition comprising:
a solvent containing an aromatic carbon hydride and a straight-chain carbon hydride and
a low-molecular weight material having a weight-average molecular weight of less than or equal to 50000, wherein the aromatic carbon hydride is xylene and cyclohexylbenzene.

2. The reverse printing ink composition according to claim 1, wherein the weight-average molecular weight of the low-molecular weight material is equal to or less than 15000.

3. The reverse printing ink composition according to claim 1, wherein the low-molecular weight material is a compound expressed by Formula 1,

[Formula 1]

where A1 to A3 each are an aromatic carbon hydride group, a heterocyclic group, or a derivative thereof.

4. The reverse printing ink composition according to claim 1, wherein the low-molecular weight material is a compound expressed by Formula 2, where the compound of Formula 1 is excluded,

[Formula 1]

where A1 to A3 each are an aromatic carbon hydride group, a heterocyclic group, or a derivative thereof, and

[Formula 2]

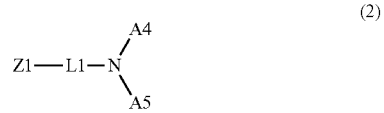

where Z1 is a nitrogen-containing carbon hydride group or a derivative thereof,

L1 is a group obtained by binding 1 to 4 bivalent aromatic ring groups to each other, and a bivalent group obtained by linking 2 to 4 aromatic rings to each other or a derivative thereof, A4 and A5 are an aromatic carbon hydride group or a derivative thereof, and A4 and A5 are allowed to form a ring structure by being bound to each other.

5. The reverse printing ink composition according to claim 1, wherein the low-molecular material is a compound expressed by Formula 3, where the compounds of Formula 1 and Formula 2 are excluded,

[Formula 1]

where A1 to A3 each are an aromatic carbon hydride group, a heterocyclic group, or a derivative thereof,

[Formula 2]

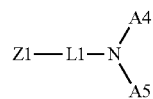
(2)

where Z1 is a nitrogen-containing carbon hydride group or a derivative thereof,

L1 is a group obtained by binding 1 to 4 bivalent aromatic ring groups to each other, and a bivalent group obtained by linking 2 to 4 aromatic rings to each other or a derivative thereof, A4 and A5 are an aromatic carbon hydride group or a derivative thereof, and A4 and A5 are allowed to form a ring structure by being bound to each other, and

[Formula 3]

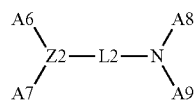
(3)

where Z2 is a nitrogen-containing carbon hydride group or a derivative thereof,

L2 is a group obtained by binding 2 to 6 bivalent aromatic ring groups to each other, and a bivalent group obtained by linking 2 to 6 aromatic rings to each other or a derivative thereof and A6 to A9 each are obtained by linking 1 to 10 aromatic carbon hydride groups, heterocyclic groups, and derivatives thereof.

6. The reverse printing ink composition according to claim 1, wherein a boiling point of the aromatic carbon hydride is greater than or equal to 138 deg C.

7. The reverse printing ink composition according to claim 1, wherein a wettability of the straight-chain carbon hydride is greater than a wettability of the aromatic carbon hydride.

8. The reverse printing ink composition according to claim 1, wherein the straight-chain carbon hydride is octane.

* * * * *